United States Patent
Kang et al.

(10) Patent No.: US 7,863,173 B2
(45) Date of Patent: Jan. 4, 2011

(54) VARIABLE RESISTANCE NON-VOLATILE MEMORY CELLS AND METHODS OF FABRICATING SAME

(75) Inventors: Shin-Jae Kang, Kyounggi Province (KR); Gyuhwan Oh, Kyounggi Province (KR); Insun Park, Seoul (KR); Hyunseok Lim, Kyounggi Province (KR); Nak-Hyun Lim, Kyounggi Province (KR)

(73) Assignee: Samsung Electronics Co., Ltd. (KR)

( * ) Notice: Subject to any disclaimer, the term of this patent is extended or adjusted under 35 U.S.C. 154(b) by 684 days.

(21) Appl. No.: 11/775,657

(22) Filed: Jul. 10, 2007

(65) Prior Publication Data

US 2008/0315174 A1  Dec. 25, 2008

(30) Foreign Application Priority Data

Jun. 20, 2007  (KR) .................... 10-2007-0060442

(51) Int. Cl.
*H01L 21/20* (2006.01)

(52) U.S. Cl. .................. 438/584; 438/95; 438/200; 438/201; 438/202; 438/203; 438/204; 438/597; 438/625; 438/626; 438/627; 438/628; 438/629; 257/2; 257/5; 257/41; 257/50; 257/3; 257/4; 257/529; 257/530; 257/E21.008; 257/E21.019

(58) Field of Classification Search .................. 438/584
See application file for complete search history.

(56) References Cited

U.S. PATENT DOCUMENTS

| | | | | |
|---|---|---|---|---|
| 3,801,886 A | * | 4/1974 | Imaizumi et al. | 257/541 |
| 4,571,513 A | * | 2/1986 | Lade et al. | 327/389 |
| 4,905,078 A | * | 2/1990 | Sagara et al. | 257/73 |
| 5,668,022 A | * | 9/1997 | Cho et al. | 438/320 |
| 5,720,641 A | * | 2/1998 | Hattori | 445/50 |
| 5,751,012 A | * | 5/1998 | Wolstenholme et al. | 257/5 |
| 5,939,788 A | * | 8/1999 | McTeer | 257/751 |
| 6,235,571 B1 | * | 5/2001 | Doan | 438/240 |

(Continued)

FOREIGN PATENT DOCUMENTS

EP    1 331 675 A9    7/2003

(Continued)

OTHER PUBLICATIONS

Notice of Reasons for Refusal, Korean Application No. 10-2007-0060442, Mar. 26, 2008.

*Primary Examiner*—Fernando L Toledo
*Assistant Examiner*—Ankush k Singal
(74) *Attorney, Agent, or Firm*—Myers Bigel Sibley & Sajovec, P.A.

(57) ABSTRACT

Methods of fabricating integrated circuit memory cells and integrated circuit memory cells are disclosed. An integrated circuit memory cell can be fabricated by forming a cup-shaped electrode on sidewalls of an opening in an insulation layer and through the opening on an ohmic layer that is stacked on a conductive structure. An insulation filling member is formed that at least partially fills an interior of the electrode. The insulation filling member is formed within a range of temperatures that is sufficiently low to not substantially change resistance of the ohmic layer. A variable resistivity material is formed on the insulation filling member and is electrically connected to the electrode.

10 Claims, 45 Drawing Sheets

U.S. PATENT DOCUMENTS

| | | | |
|---|---|---|---|
| 6,376,353 B1* | 4/2002 | Zhou et al. | 438/612 |
| 6,440,837 B1* | 8/2002 | Harshfield | 438/618 |
| 6,455,424 B1* | 9/2002 | McTeer et al. | 438/675 |
| 6,531,373 B2* | 3/2003 | Gill et al. | 438/400 |
| 6,534,781 B2* | 3/2003 | Dennison | 257/5 |
| 6,569,705 B2* | 5/2003 | Chiang et al. | 438/95 |
| 6,593,176 B2* | 7/2003 | Dennison | 438/200 |
| 6,621,095 B2* | 9/2003 | Chiang et al. | 257/5 |
| 6,624,485 B2* | 9/2003 | Johnson | 257/390 |
| 6,642,102 B2* | 11/2003 | Xu | 438/257 |
| 6,646,297 B2* | 11/2003 | Dennison | 257/296 |
| 6,649,928 B2 | 11/2003 | Dennison | |
| 6,653,195 B1* | 11/2003 | Gonzalez et al. | 438/380 |
| 6,764,894 B2* | 7/2004 | Lowrey | 438/238 |
| 6,815,704 B1* | 11/2004 | Chen | 257/2 |
| 6,838,691 B2* | 1/2005 | Liu et al. | 257/3 |
| 6,855,975 B2* | 2/2005 | Gilton | 257/296 |
| 6,869,883 B2 | 3/2005 | Chiang et al. | |
| 6,893,959 B2* | 5/2005 | Barth | 438/637 |
| 6,916,669 B2* | 7/2005 | Jones et al. | 438/3 |
| 6,919,578 B2 | 7/2005 | Lowrey et al. | |
| 6,921,962 B1* | 7/2005 | Bailey et al. | 257/537 |
| 6,927,143 B2* | 8/2005 | Lee | 438/397 |
| 6,953,720 B2* | 10/2005 | Moore et al. | 438/238 |
| 6,995,388 B2* | 2/2006 | Hwang et al. | 257/4 |
| 6,998,289 B2* | 2/2006 | Hudgens et al. | 438/95 |
| 7,057,923 B2* | 6/2006 | Furkay et al. | 365/163 |
| 7,060,619 B2* | 6/2006 | Cowley et al. | 438/687 |
| 7,087,919 B2* | 8/2006 | Campbell et al. | 257/2 |
| 7,112,484 B2* | 9/2006 | Gilton | 438/237 |
| 7,126,179 B2* | 10/2006 | Li et al. | 257/303 |
| 7,132,675 B2* | 11/2006 | Gilton | 257/3 |
| 7,164,147 B2* | 1/2007 | Lee et al. | 257/4 |
| 7,189,626 B2* | 3/2007 | Elkins et al. | 438/397 |
| 7,214,958 B2* | 5/2007 | Happ | 257/4 |
| 7,220,983 B2* | 5/2007 | Lung | 257/4 |
| 7,235,419 B2* | 6/2007 | Harshfield et al. | 438/95 |
| 7,279,411 B2* | 10/2007 | Agarwala et al. | 438/618 |
| 7,314,776 B2* | 1/2008 | Johnson et al. | 438/95 |
| 7,319,235 B2* | 1/2008 | Happ | 257/2 |
| 7,338,908 B1* | 3/2008 | Koos et al. | 438/745 |
| 7,339,185 B2* | 3/2008 | Song et al. | 257/3 |
| 7,348,590 B2* | 3/2008 | Happ | 257/4 |
| 7,364,937 B2* | 4/2008 | Lowrey | 438/95 |
| 7,384,825 B2* | 6/2008 | Park et al. | 438/133 |
| 7,394,088 B2* | 7/2008 | Lung | 257/2 |
| 7,396,759 B1* | 7/2008 | van Schravendijk et al. | 438/625 |
| 7,410,863 B2* | 8/2008 | Li et al. | 438/243 |
| 7,419,881 B2* | 9/2008 | Cho et al. | 438/385 |
| 7,433,227 B2* | 10/2008 | Campbell et al. | 365/163 |
| 7,442,602 B2* | 10/2008 | Park et al. | 438/237 |
| 7,449,710 B2* | 11/2008 | Lung | 257/2 |
| 7,459,715 B2* | 12/2008 | Toda et al. | 257/2 |
| 7,473,986 B2* | 1/2009 | Ang et al. | 257/656 |
| 7,485,559 B2* | 2/2009 | Cho et al. | 438/597 |
| 7,499,355 B2* | 3/2009 | Scheuerlein et al. | 365/201 |
| 2001/0002046 A1* | 5/2001 | Reinberg et al. | 257/3 |
| 2002/0000598 A1* | 1/2002 | Kang et al. | 257/301 |
| 2002/0070404 A1* | 6/2002 | Bruchhaus et al. | 257/310 |
| 2002/0074658 A1* | 6/2002 | Chiang | 257/750 |
| 2002/0074664 A1* | 6/2002 | Nogami et al. | 257/764 |
| 2002/0079524 A1* | 6/2002 | Dennison | 257/296 |
| 2002/0081804 A1* | 6/2002 | Gill et al. | 438/257 |
| 2002/0102839 A1* | 8/2002 | Gonzalez et al. | 438/629 |
| 2002/0127886 A1* | 9/2002 | Moore et al. | 438/800 |
| 2002/0190289 A1* | 12/2002 | Harshfield et al. | 257/295 |
| 2003/0001230 A1* | 1/2003 | Lowrey | 257/529 |
| 2003/0045054 A1* | 3/2003 | Campbell et al. | 438/257 |
| 2003/0067013 A1* | 4/2003 | Ichihara et al. | 257/200 |
| 2003/0073262 A1* | 4/2003 | Xu et al. | 438/102 |
| 2003/0096497 A1* | 5/2003 | Moore et al. | 438/652 |
| 2003/0116794 A1* | 6/2003 | Lowrey | 257/296 |
| 2003/0119317 A1* | 6/2003 | Nogami et al. | 438/689 |
| 2003/0203512 A1* | 10/2003 | Kweon | 438/3 |
| 2003/0209971 A1* | 11/2003 | Kozicki | 313/498 |
| 2003/0227091 A1* | 12/2003 | Sinha et al. | 257/762 |
| 2004/0069982 A1* | 4/2004 | Lowrey et al. | 257/4 |
| 2004/0087074 A1* | 5/2004 | Hwang et al. | 438/198 |
| 2004/0248339 A1* | 12/2004 | Lung | 438/102 |
| 2004/0251551 A1* | 12/2004 | Hideki | 257/758 |
| 2005/0003602 A1 | 1/2005 | Lowrey et al. | |
| 2005/0030800 A1* | 2/2005 | Johnson et al. | 365/200 |
| 2005/0040470 A1* | 2/2005 | Chuang et al. | 257/378 |
| 2005/0122771 A1* | 6/2005 | Chen | 365/163 |
| 2005/0124155 A1* | 6/2005 | Brooks et al. | 438/654 |
| 2005/0226062 A1* | 10/2005 | Aratani et al. | 365/199 |
| 2005/0280117 A1* | 12/2005 | Gonzalez et al. | 257/528 |
| 2006/0030108 A1 | 2/2006 | Cho et al. | |
| 2006/0072370 A1 | 4/2006 | Kuh et al. | |
| 2006/0091374 A1* | 5/2006 | Yoon et al. | 257/2 |
| 2006/0092693 A1* | 5/2006 | Chen | 365/163 |
| 2006/0131618 A1* | 6/2006 | Hsueh | 257/246 |
| 2006/0133174 A1* | 6/2006 | Kim et al. | 365/222 |
| 2006/0139056 A1* | 6/2006 | Madurawe | 326/41 |
| 2006/0237756 A1* | 10/2006 | Park et al. | 257/296 |
| 2006/0246656 A1* | 11/2006 | Kudelka et al. | 438/243 |
| 2007/0026566 A1* | 2/2007 | Karpov et al. | 438/102 |
| 2007/0076486 A1* | 4/2007 | Jeong et al. | 365/185.22 |
| 2007/0080421 A1* | 4/2007 | Lee et al. | 257/486 |
| 2007/0108433 A1 | 5/2007 | Lee et al. | |
| 2007/0139987 A1* | 6/2007 | Kouchiyama et al. | 365/1 |
| 2007/0238226 A1* | 10/2007 | Lowrey | 438/131 |
| 2008/0042117 A1* | 2/2008 | Hsu | 257/3 |
| 2008/0042118 A1* | 2/2008 | Hayakawa | 257/4 |
| 2009/0026439 A1* | 1/2009 | Park et al. | 257/4 |
| 2009/0218656 A1* | 9/2009 | Gonzalez et al. | 257/529 |

FOREIGN PATENT DOCUMENTS

| | | | |
|---|---|---|---|
| EP | 1 331 675 B1 | | 5/2007 |
| JP | 408321613 A | * | 5/1995 |
| KR | 10-2004-0100499 A | | 12/2004 |
| KR | 10-2005-0084240 A | | 8/2005 |
| KR | 10-0629265 B1 | | 9/2006 |
| KR | 10-0655796 B1 | | 12/2006 |

* cited by examiner

US 7,863,173 B2

VARIABLE RESISTANCE NON-VOLATILE MEMORY CELLS AND METHODS OF FABRICATING SAME

CROSS-REFERENCE TO RELATED APPLICATION

This application priority under 35 USC §119 to Korean Patent Application No. 2007-60442, filed on Jun. 20, 2007, the disclosure of which is hereby incorporated herein by reference in its entirety as if set forth fully herein.

FIELD OF THE INVENTION

The present invention relates to non-volatile memory devices and related manufacturing methods, and more specifically to variable resistance non-volatile memory devices and related manufacturing methods.

BACKGROUND OF THE INVENTION

Non-volatile memory devices are widely used in many consumer, commercial and other applications. While some non-volatile memory devices, such as dynamic RAM and flash memory, use accumulated charge to store data, some other non-volatile memory devices, such as resistive random access memory (RRAM), phase change RAM (PRAM), and magnetic RAM (MRAM), use change in resistivity of a material therein to store data.

A resistive memory cell generally includes a first electrode, a second electrode, and a variable resistivity material connected therebetween. The resistive memory cell can be configured so that the resistivity of the material is controlled in response to a voltage that is applied between the first and second electrodes.

A PRAM device may include a phase changeable material layer which functions as a variable resistivity material. In response to sufficient heat, the phase changeable material layer may change phase so that its resistance changes and remains changed after its temperature returns to a pre-heating level. The phase changeable material layer may be formed from a chalcogenide material that includes germanium (Ge), antimony (Sb), and/or tellurium (Te). The phase of the material can be controlled in response to a level of current and/or duration of current that is applied to an electrode to heat the material a sufficient amount to change its phase. The resistance of the phase changeable material layer varies in response with its phase. For example, when the phase changeable material has a crystalline state, its resistance can be substantially less than when the phase changeable material layer has an amorphous state. Accordingly, the resistance of the phase changeable material in a PRAM device is controlled to store a logic value and is sensed to read the logic value.

FIGS. 1A-H are cross-sectional views illustrating a conventional method of manufacturing a phase changeable memory device. Referring to FIG. 1A, an electrical insulation layer 112 is formed on a substrate 100. The insulation layer 112 may be formed from, for example, silicon oxide and/or silicon nitride. A photo resist pattern is then formed on the insulation layer 112. The insulation layer 112 is patterned using the photo resist pattern as a mask to form an opening 117, with sidewalls 115, that exposes a portion of the substrate 100. The opening 117 may expose, for example, an impurity region in the substrate 100 that serves as a conductive line for the memory device.

A semiconductor member having first conductivity type impurities is formed to partially fill the opening 117. The semiconductor member is formed by a selective epitaxial growth (SEG) process using the exposed portion of the substrate 100 as a seed layer.

A vertical cell diode 145 is formed in the semiconductor member within the opening 117 by doping an upper region 146 thereof with second conductivity type impurity ions while a lower region 148 of the semiconductor memory has predominately first conductivity type impurity ions.

Referring to FIG. 1B, an ohmic layer 149 is formed within the opening 117 on the diode 145, such as by depositing a metal silicide through the opening 117 on an upper surface of the diode 145.

Referring to FIG. 1C, an insulating spacer layer 150 is formed on upper surfaces of the insulation layer 112, sidewalls 115 of the opening 117 above the ohmic layer 149, and on an upper surface of the ohmic layer 149. The spacer layer 150 is formed from silicon nitride at a temperature greater than 680° C. Referring to FIG. 1D, the spacer layer 150 is planarized to expose the upper surfaces of the insulation layer 112 and form insulating spacers 155 along sidewalls of the opening 117.

Referring to FIG. 1E, a metal layer 162 is formed on the spacers 155 along sidewalls of the opening 117 and on the ohmic layer 149. A metal nitride layer 164 is formed on the metal layer 162 in the opening 117. The metal layer 162 and the metal nitride layer 164 serve as a lower electrode layer 160.

Referring to FIG. 1F, an insulating filling member 170 is formed on the metal nitride layer 164 to fill a remaining portion of the opening 117. The filling member 170 may be formed at a temperature greater than 680° C. using, for example, an undoped silicate glass (USG) process, a spin-on-glass (SOG) process, a field oxide (FOX) process, a borophosphosilicate glass (BPSG) process, a phosphosilicate glass (PSG) process, a tetraethoxysilane (TEOS) process, a plasma-enhanced tetra ethyl ortho silicate (PE-TEOS) process, a high-density plasma chemical vapor deposition (HDP-CVD) process, and/or a nitridation process to form silicon nitride.

Referring to FIG. 1G, the filling member 170 and the lower electrode layer 160 are planarized to expose upper surfaces of the insulation layer 112 and form a cup-shaped lower electrode 165 within the opening 117. The lower electrode 165 has the patterned metal layer 166 and the patterned metal nitride layer 168.

Referring to FIG. 1H, a phase changeable material layer is formed from a chalcogenide material on upper surfaces of the insulation layer 112, the filling member 170, and the lower electrode 165. A conductive upper electrode layer is formed on the phase changeable material layer. The phase changeable material layer and the upper electrode layer are patterned to form a phase change material pattern 180 and an upper electrode pattern 190, respectively.

SUMMARY OF THE INVENTION

Various embodiments of the present invention are directed to methods of fabricating an integrated circuit memory cell. In some embodiments thereof, a cup-shaped electrode is formed on sidewalls of an opening in an insulation layer and is formed through the opening onto an ohmic layer that is stacked on a conductive structure. An insulation filling member is formed that at least partially fills an interior of the electrode. The insulation filling member is formed within a range of temperatures that is sufficiently low to not substantially change resistance of the ohmic layer. A variable resistivity material is formed on the insulation filling member and is electrically connected to the electrode.

In some further embodiments, the variable resistivity material includes a chalcogenide material. The insulation filling member may be formed within a range of temperatures that is less than a temperature at which the ohmic layer is oxidized. The insulation filling member may be formed within a range of temperatures that is less than 630° C., and may be formed within a range of temperatures between about 460° C. and 560° C. The insulation filling member may be formed within a range of temperatures that is sufficiently low to not change resistance of the ohmic layer by more than 40%.

In some further embodiments, formation of the insulation filling member may include forming a silicon layer that at least partially fills an interior of the electrode, and introducing nitrogen into an upper portion of the silicon layer, in the interior of the electrode, to form a silicon nitride layer that serves as the insulation filling member. Alternatively, or additionally, an upper portion of the silicon layer formed in the interior of the electrode may be oxidized to form a silicon oxide layer that serves as the insulation filling member.

In some further embodiments, before the insulation filling member is formed, a conductive filling member is formed that partially fills an interior of the electrode. The insulation filling member is then formed on the conductive filling member to further fill the interior of the electrode.

Some other methods of fabricating an integrated circuit memory cell include forming a cup-shaped electrode on sidewalls of an opening in an insulation layer and forming the electrode through the opening on an ohmic layer that is stacked on a conductive structure. An upper portion of the electrode is formed from a different material having a greater resistivity than a lower portion of the electrode. An insulation filling member is formed that at least partially fills an interior of the lower electrode. A variable resistivity material is formed on the insulation filling member and electrically connected to the electrode.

Some other methods of fabricating an integrated circuit memory cell include: forming an ohmic layer on a conductive structure; forming an insulation layer with an opening that exposes the ohmic layer; forming a cup-shaped electrode on sidewalls of the opening and on the exposed ohmic layer; forming a silicon filling member that at least partially fills an interior of the electrode; and forming a variable resistivity material on the insulation filling member and electrically connected to the electrode.

Some other embodiments of the present invention are directed to integrated circuit memory cells. In some embodiments thereof, an integrated circuit memory cell includes: a substrate; a conductive structure on the substrate; an ohmic layer on the conductive structure; an insulation layer with an opening that exposes the ohmic layer; a cup-shaped electrode on sidewalls of the opening and on the ohmic layer; a polysilicon layer that partially fills an interior of the electrode; an insulation filling member on the polysilicon layer that further fills an interior of the electrode; and a variable resistivity material on the insulation layer and the insulation filling member and electrically connected to the electrode.

Some other integrated circuit memory cells, include: a substrate; a conductive structure on the substrate; an ohmic layer on the conductive structure; an insulation layer with an opening that exposes the ohmic layer; a cup-shaped electrode on sidewalls of the opening and on the ohmic layer, where an upper portion of the electrode includes a different material having a greater resistivity than a lower portion of the electrode; an insulation filling member that at least partially fills an interior of the electrode; and a variable resistivity material on the insulation filling member and electrically connected to the electrode.

BRIEF DESCRIPTION OF THE DRAWINGS

The above and other features and advantages of the present invention will become readily apparent by reference to the following detailed description when considered in conjunction with the accompanying drawings wherein.

DETAILED DESCRIPTION

Figure 1A:
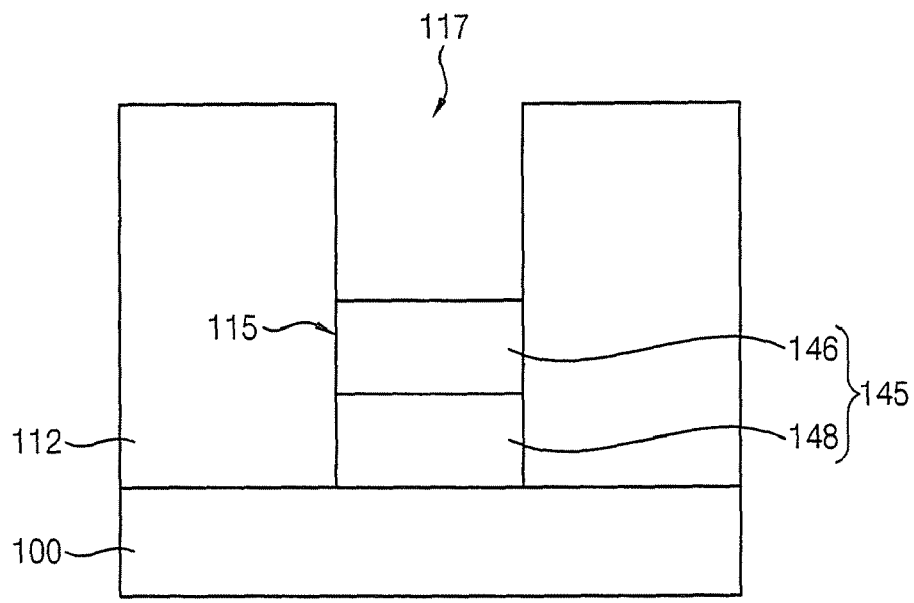
FIGS. 1A-H are cross-sectional views illustrating a conventional method of manufacturing a phase changeable memory device.
Figure 1B:
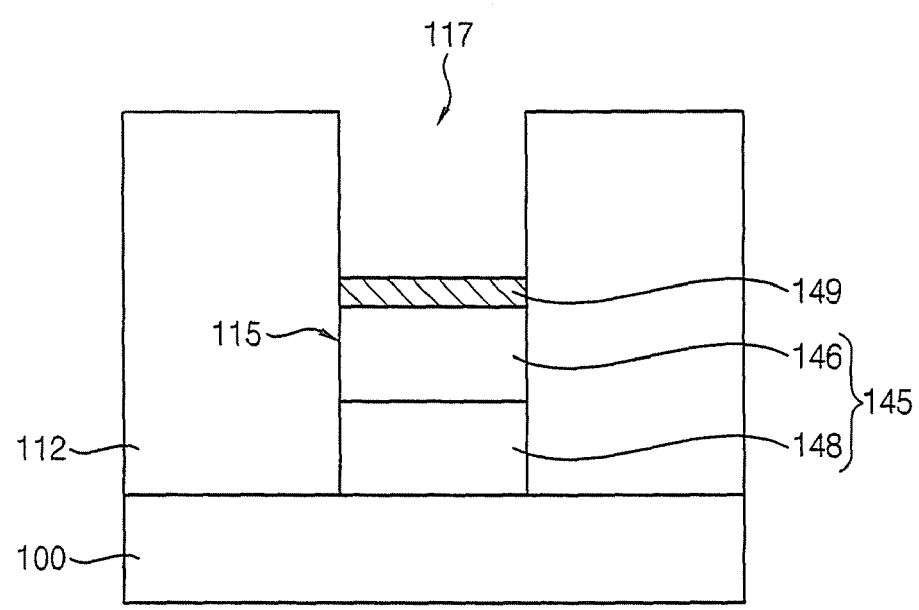
Figure 1C:
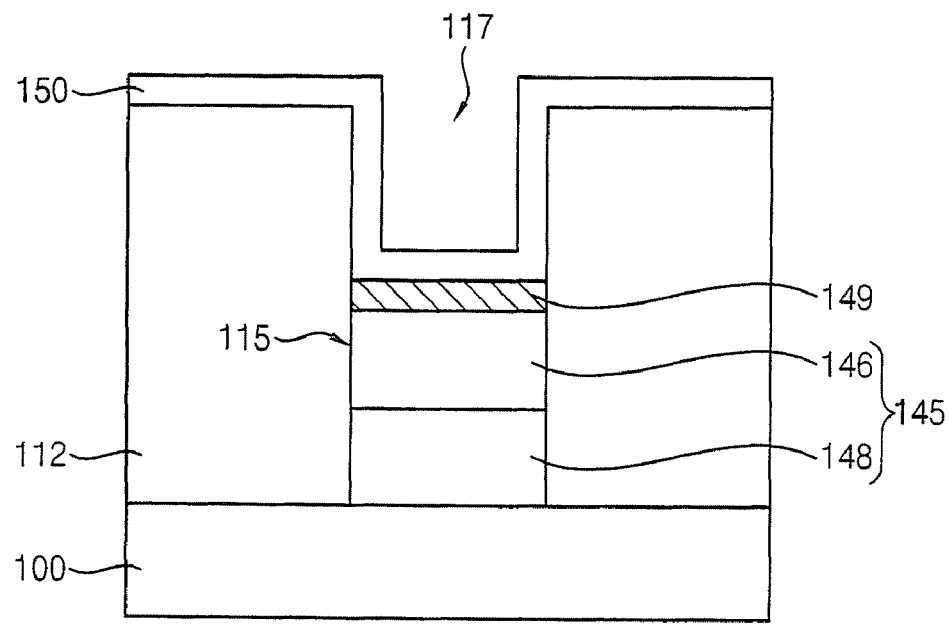
Figure 1D:
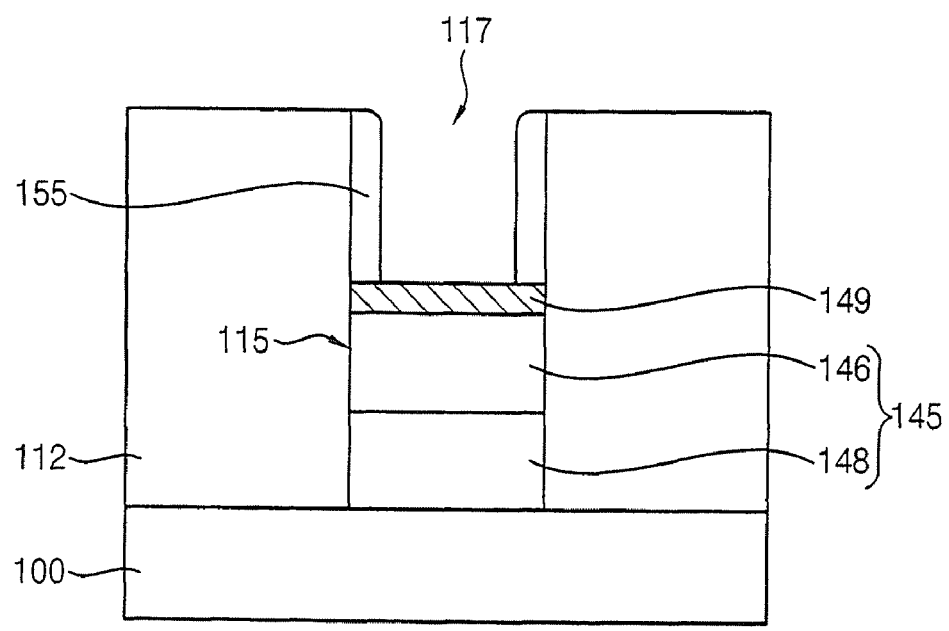
Figure 1E:
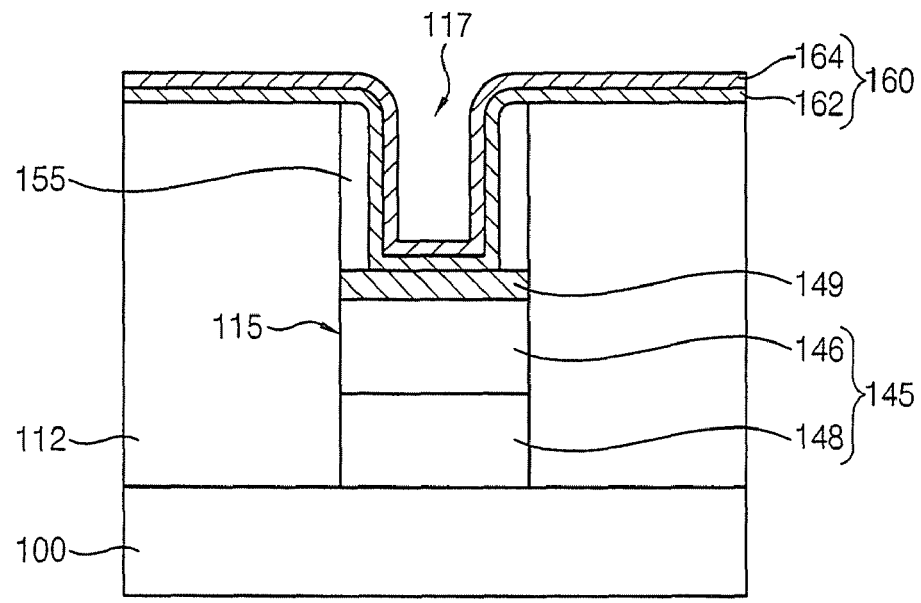
Figure 1F:
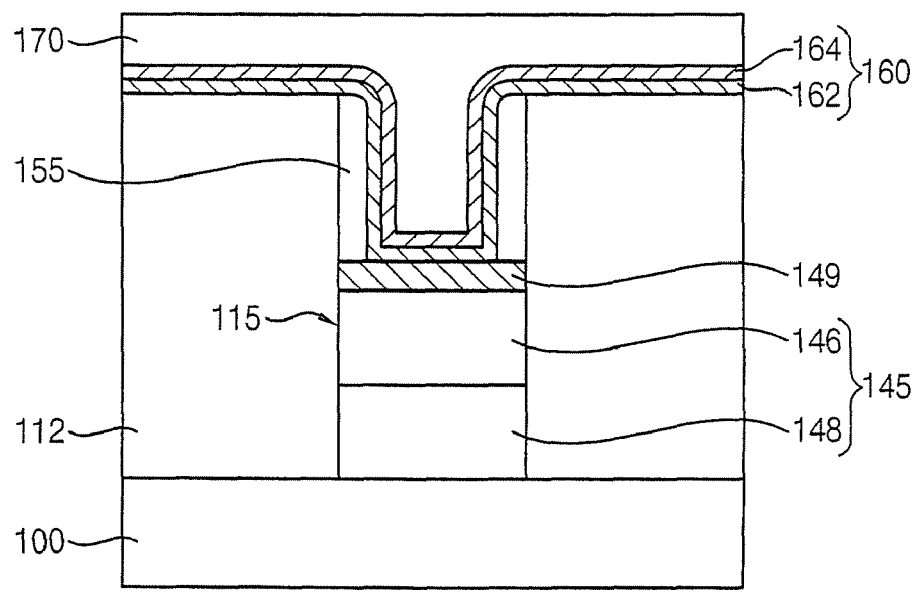
Figure 1G:
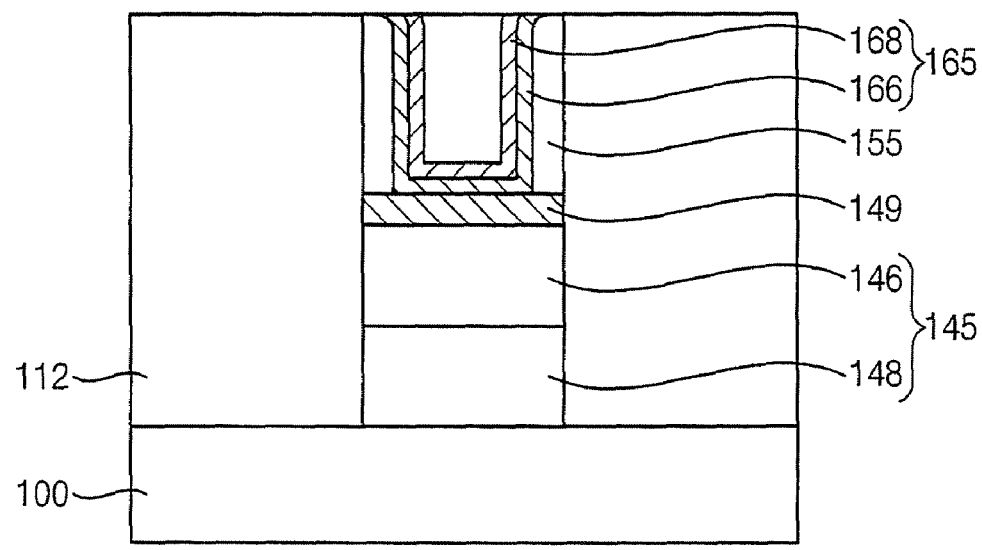
Figure 1H:
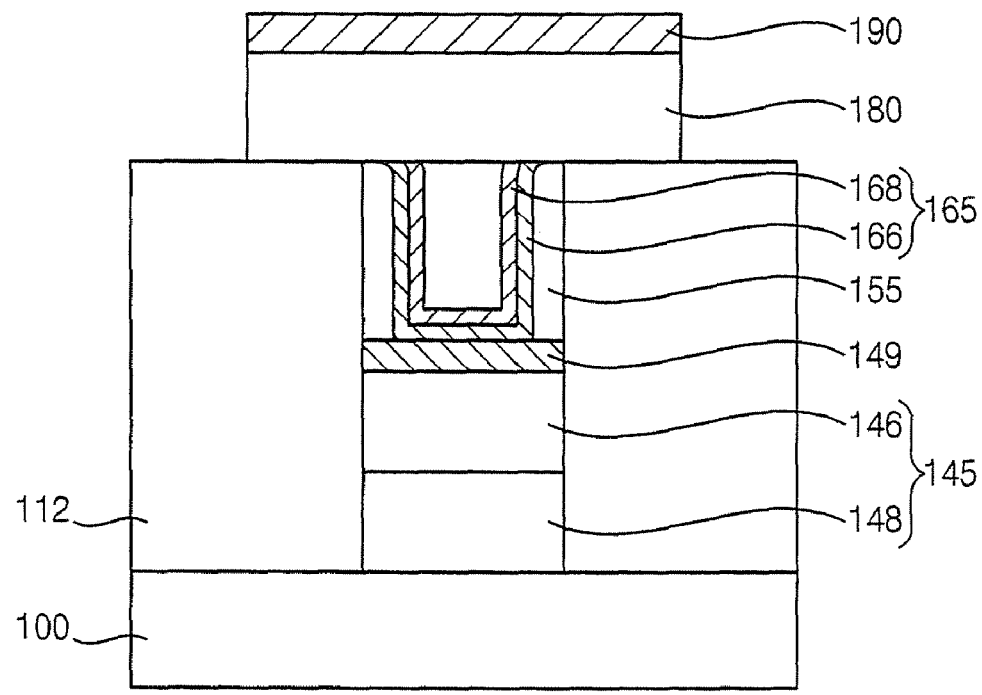

The present invention will now be described more fully hereinafter with reference to the accompanying drawings, in which exemplary embodiments of the invention are illustrated. The invention may, however, be embodied in different forms and should not be construed as limited to the embodiments set fourth herein. Rather, these embodiments are provided so that this disclosure will be thorough and complete, and will fully convey the scope of the invention to those skilled in the art.

It will be understood that when an element or layer is referred to as being "on," "connected to" and/or "coupled to" another element or layer, the element or layer may be directly on, connected and/or coupled to the other element or layer, or intervening elements or layers may be present. In contrast, when an element is referred to as being "directly on," "directly connected to" and/or "directly coupled to" another element or layer, no intervening elements or layers are present. As used herein, the term "and/or" includes any and all combinations of one or more of the associated listed items.

It will also be understood that, although the terms "first," "second," etc., may be used herein to describe various elements, components, regions, layers and/or sections, these elements, components, regions, layers and/or sections should not be limited by these terms. Rather, these terms are used merely as a convenience to distinguish one element, component, region, layer and/or section from another element, component, region, layer and/or section. For example, a first element, component, region, layer and/or section could be termed a second element, component, region, layer and/or section without departing from the teachings of the present invention.

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly. As used herein, "height" refers to a direction that is generally orthogonal to the faces of a substrate.

The terminology used herein is for the purpose of describing particular embodiments only and is not intended to limit of the invention. As used herein, the singular terms "a," "an" and "the" are intended to include the plural forms as well, unless the context clearly indicates otherwise. It will be further understood that the terms "comprise," "comprising," "includes," "including," "have", "having" and variants thereof specify the presence of stated features, integers, steps, operations, elements, and/or components, but do not preclude the presence and/or addition of one or more other features, integers, steps, operations, elements, components, and/or groups thereof.

Embodiments of the present invention may be described with reference to cross-sectional illustrations, which are schematic illustrations of idealized embodiments of the present invention. As such, variations from the shapes of the illustrations, as a result, for example, of manufacturing techniques and/or tolerances, are to be expected. Thus, embodiments of the present invention should not be construed as limited to the particular shapes of regions illustrated herein, but are to include deviations in shapes that result from, e.g., manufacturing. For example, a region illustrated as a rectangle may have rounded or curved features. Thus, the regions illustrated in the figures are schematic in nature and are not intended to limit the scope of the present invention. Like reference numerals refer to like elements throughout.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Some embodiments of the invention may arise from a discovery that, in the conventional processes for fabricating the phase changeable memory device described above for FIGS. 1A-H, the high temperatures that are used when forming the filling member 170 and that are used when forming the sidewall spacer 155 in the opening 117 can damage the ohmic layer 149, such as by substantially degrading its thickness. The damage to the ohmic layer 149 can result in a 40% change in its resistance, which can result in degraded operational characteristics of the memory cells.

Figure 2A:
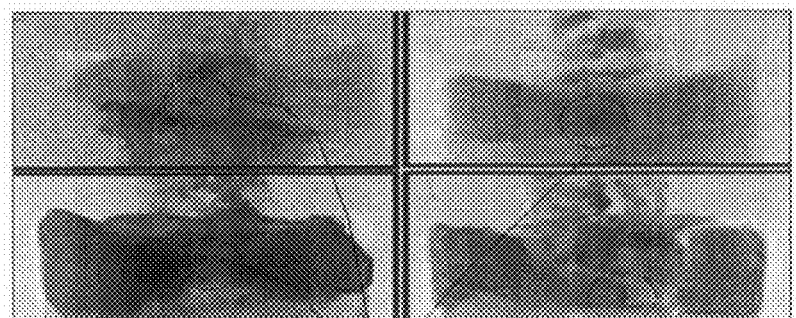
FIG. 2A is an electron microscope picture of an ohmic layer that has been damaged during fabrication of a phase changeable memory device using the conventional process of FIGS. 1A-H.
Figure 2B:
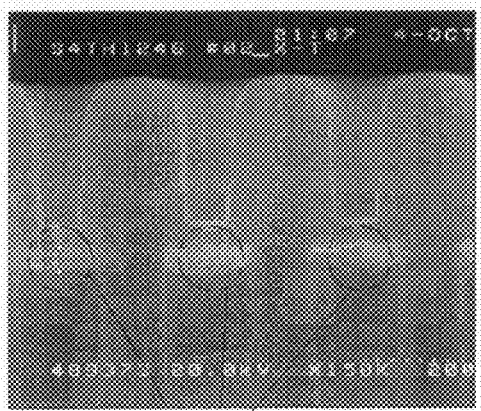
FIG. 2B is an electron microscope picture of an ohmic layer that has been damaged during fabrication of a sidewall spacer using the conventional processes of FIGS. 1C-D.
Figure 2C:
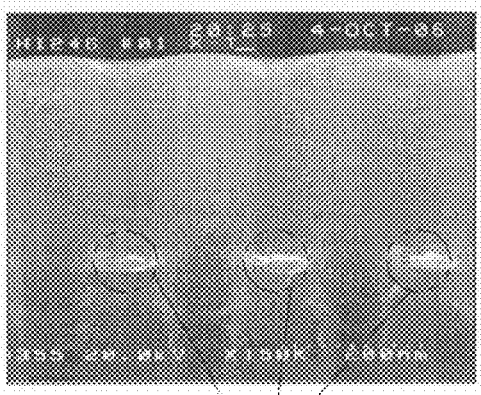
FIG. 2C is an electron microscope picture of the ohmic layer of FIG. 2B that has been further damage during fabrication of a filling member using the conventional processes of FIGS. 1F-G.

FIG. 2A is an electron microscope picture of an ohmic layer that has been damaged during fabrication of a phase changeable memory device using the conventional processes described above for FIGS. 1A-H. Referring to FIG. 2A, it is observed that the ohmic layer exhibits degraded thickness, and associated degraded electrical characteristics, in the regions labeled "A" due to the conventional processes that were used to fabricate a filling member (e.g., filling member 170) and a sidewall spacer (e.g., spacer 155). FIG. 2B is another electron microscope picture of an ohmic layer that exhibits a degraded thickness in regions "B" caused by conventional processes for forming a sidewall spacer, such as the conventional processes described above for forming the spacers 155 in FIGS. 1C-D. FIG. 2C is another electron microscope picture of the ohmic layer of FIG. 2B that exhibits further damage in regions "C" caused during conventional processes for forming a filling member, such as the conventional processes described above for forming the filling member 170 in FIGS. 1F-G. It is observed that the thickness of the ohmic layer is degraded much more during formation of the filling member than during formation of the sidewall spacers.

In sharp contrast, various embodiments of the present invention form a filling member while reducing/avoiding degradation of the thickness of an ohmic layer. More particularly, in accordance with some embodiments, an insulation filling member is formed in an interior of a cup-shaped electrode within a range of temperatures that is sufficiently low to not substantially change resistance of the ohmic layer. As used herein a cup-shaped electrode can have any cross-sectional shape with a recessed central portion. Such cross-section shapes of the electrode can include, but are not limited to, circular, oval, square, rectangular, combinations of arcuate and straight extending cross-section outlines, and/or irregular cross-sectional outlines.

Figure 3:
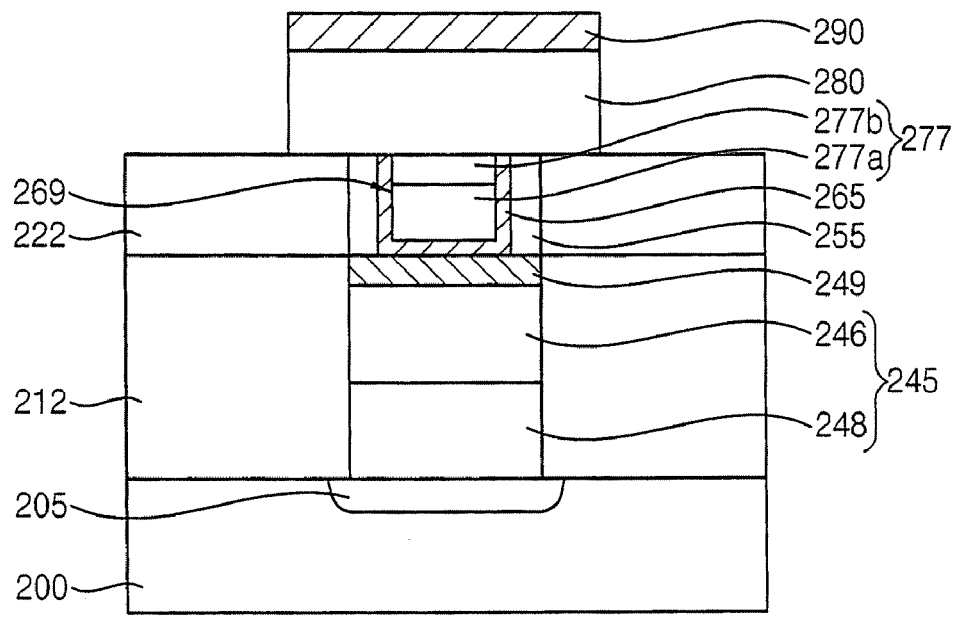
FIG. 3 is a cross sectional view illustrating an integrated circuit memory cell that is configured in accordance with some embodiments of the present invention.

FIG. 3 is a cross sectional view illustrating an integrated circuit memory cell that is configured in accordance with some embodiments of the present invention. Referring to FIG. 3, the memory cell includes a substrate 200 with an impurity region 205. A first insulation layer 212 is on the substrate 200. A vertical diode 245 extends through at least a portion of the first insulation layer 212 and is electrically connected to the impurity region 205. The vertical diode 245 includes a lower region 248 having a first impurity type and an upper region 246 having an opposite second impurity type. An ohmic layer 249 is electrically connected to, and may be directly on, an upper surface of the vertical diode 245.

A second insulation layer 222 is on the first insulation layer 212 and has an opening that is substantially aligned with the ohmic layer 249. Spacers 255 extend along sidewalls of the opening in the second insulation layer 222. A cup-shaped lower electrode 265 is on the spacers 255 along sidewalls of the opening and on the ohmic layer 249. Although first and second insulation layers 212 and 222 have been shown, it is to be understood that a single insulation layer or more than two insulation layers may alternatively be used.

A filling member 277 fills an interior 269 of the lower electrode 265. The filling member 277 is formed within a range of temperatures that is sufficiently low to not substantially change resistance of the ohmic layer 249. The filling member 277 may be formed within a range of temperatures that is sufficiently low so that resistance of the ohmic layer 249 does not change more than 40% relative to before and after the filling member 277 is formed. In some embodiments, the filling member 277 is formed at temperatures that are less than a temperature at which the ohmic layer 249 becomes oxidized. In some further embodiments, the filling member 277 is formed at temperatures that are less than 630° C., and may be formed within a range of temperatures that is between about 460° C. and 560° C.

The filling member 277 can include a first filling member 277a that partially fills the interior 269 of the lower electrode 265, and a second filling member 277b that at least partially further fills, and may completely fill the remaining portion of, the interior 269 of the lower electrode 265. The first filling member 277a may be silicon, such as a doped silicon or undoped silicon, which can be formed within a range of temperatures between about 460° C. and 560° C. The second filling member 277b may include silicon nitride and/or silicon oxide. As will be explained below with regard to FIGS. 5L-N, the second filling member 277b may be formed by oxidizing an upper portion of the first filling member 277a, introducing nitrogen into an upper portion of the first filling member 277a, and/or by depositing the second filling member 277b on the first filling member 277a.

A variable resistivity material layer 280 is on an upper surface of the second insulation layer 222, the spacers 255, the second filling member 277b, and is electrically connected to the lower electrode 265. The variable resistivity material layer 280 may include a phase changeable material such as a chalcogenide material that includes, for example, germanium (Ge), antimony (Sb), and/or tellurium (Te). An upper electrode 290 is formed on the variable resistivity material layer 280.

With continuing reference to FIG. 3, it is observed that the bottom surface of the cup-shaped lower electrode 265 contacts the ohmic layer 249 and the upper surfaces of sidewalls of the cup-shaped lower electrode 265 contact the variable resistivity material layer 280. Consequently, the lower electrode 265 has a larger electrical contact area to the ohmic layer 249, and the lower electrode 265 has a relatively much smaller electrical contact area to the variable resistivity material layer 280, which may provide improved operational characteristics for the integrated circuit memory cell.

Figure 14:
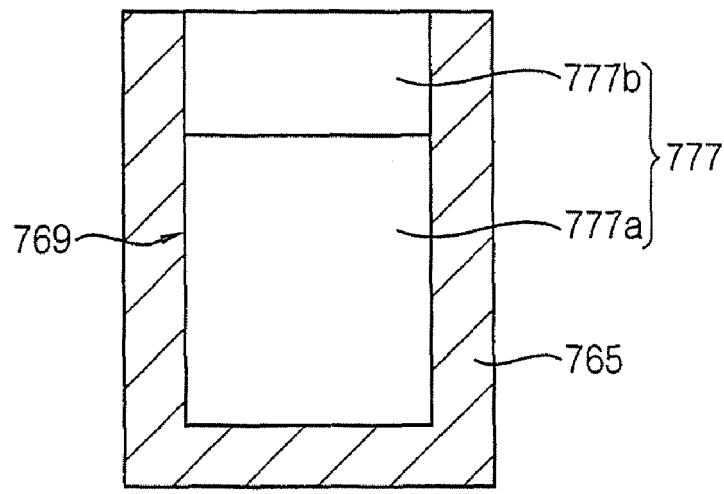
FIG. 14 is a cross-sectional view of a cup-shaped electrode having first and second filling members that fill an interior of the electrode in accordance with some embodiments of the present invention.

FIG. 14 illustrates an enlarged cross-sectional view of a similarly configured cup-shaped electrode 765 having a stacked first filling member 777a and second filling member 777b that fill an interior surface 769 of the electrode 765 in accordance with some embodiments of the present invention.

Figure 4:
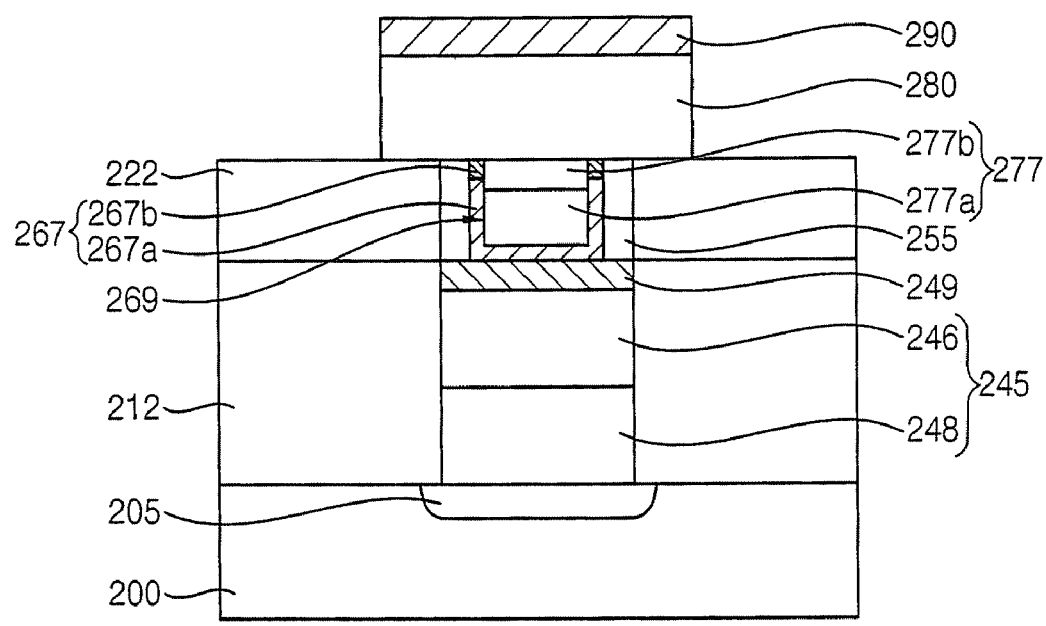
FIG. 4 is a cross-sectional view illustrating an integrated circuit memory cell that is configured in accordance with some other embodiments of the present invention.

FIG. 4 is a cross-sectional view illustrating an integrated circuit memory cell that is configured in accordance with some other embodiments of the present invention. The memory cell of FIG. 4 contains the same elements as the memory cell of FIG. 3, except that the cup-shaped lower electrode is configured differently, as will be described below.

Referring to FIG. 4, a cup-shaped lower electrode 267 is electrically connected between the ohmic layer 249 and the variable resistivity material layer 280, and extends along sidewalls of the spacers 255. The lower electrode 267 is at least partially filled with the first and second filling members 277a and 277b.

An upper portion 267b of the lower electrode 267 has a greater resistivity than a material of a lower portion 267a of the lower electrode 267. Nitrogen may be introduced into the upper portion 267b of the lower electrode 267 to increase its resistivity relative to the lower portion 267a. For example, the lower portion 267a may include a metal, and the upper portion 267b may include a metal nitride. The nitrogen may be introduced into the upper portion 267a through a plasma nitridation process. Alternatively or additionally, the upper portion 267b may be deposited on the lower portion 267a from a material that has a greater resistivity than a material of the lower portion 267a.

Because the upper portion 267b has a greater resistivity than the lower portion 267a of the lower electrode 267, the resistance at the interface between the lower electrode 267 and the ohmic layer 249 can be much less than the resistance at the interface between the lower electrode 267 and the variable resistivity material layer 280, which may provide improved operational characteristics for the integrated circuit memory cell.

Figure 15:
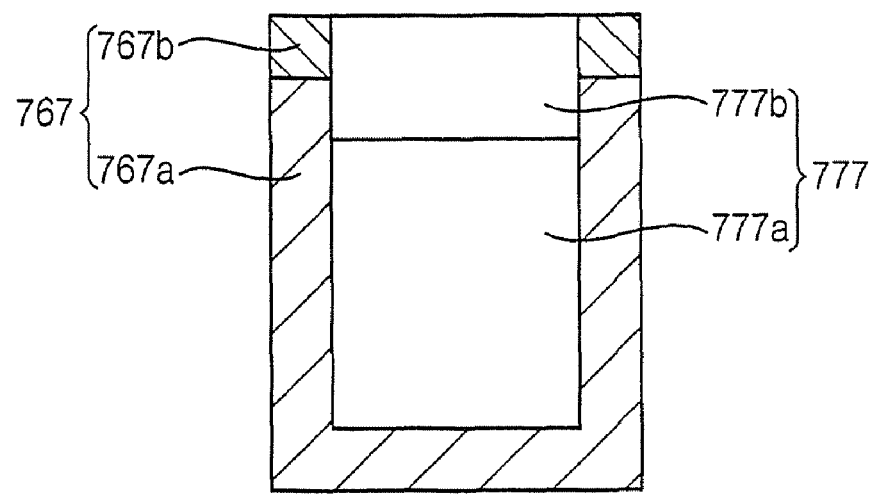
FIG. 15 is a cross-sectional view of a cup-shaped electrode with different resistivity materials in upper and lower portions thereof, and an interior of the electrode that is filled with first and second filling members in accordance with some embodiments of the present invention.

FIG. 15 illustrates an enlarged cross-sectional view of a similarly configured cup-shaped electrode 767 with a lower portion 767a thereof having a lower resistivity than an upper portion 767b thereof. A stacked first filling member 777a and second filling member 777b fill an interior of the electrode 767.

Figure 5A:
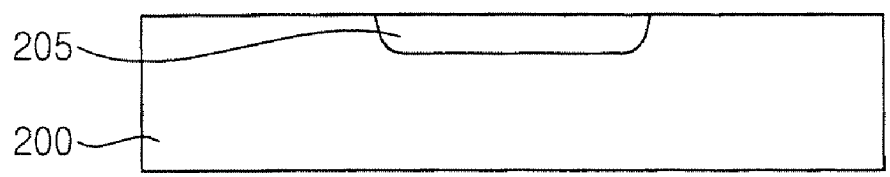
FIGS. 5A-O are cross-sectional views illustrating methods of fabricating integrated circuit memory cells in accordance with some embodiments of the present invention.
Figure 5B:
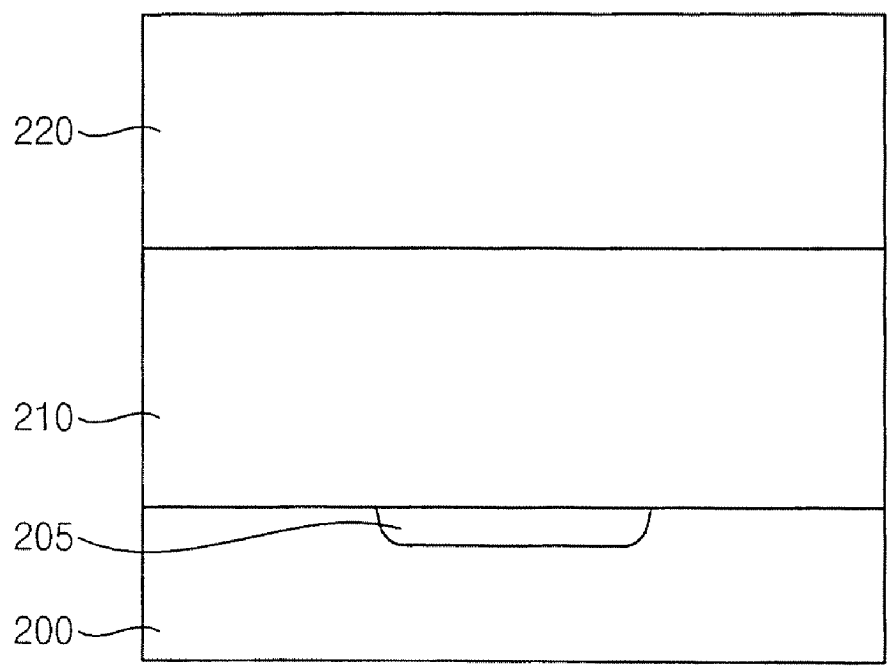
Figure 5C:
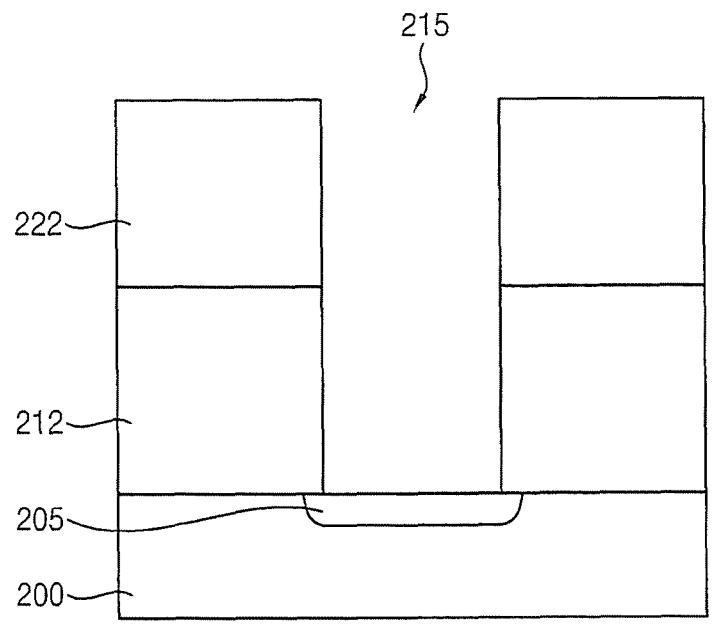
Figure 5D:
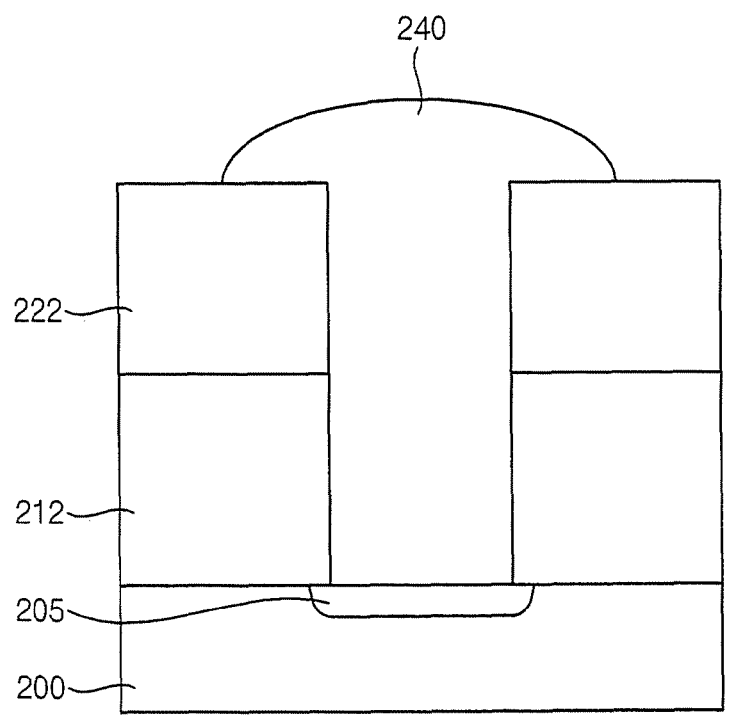
Figure 5E:
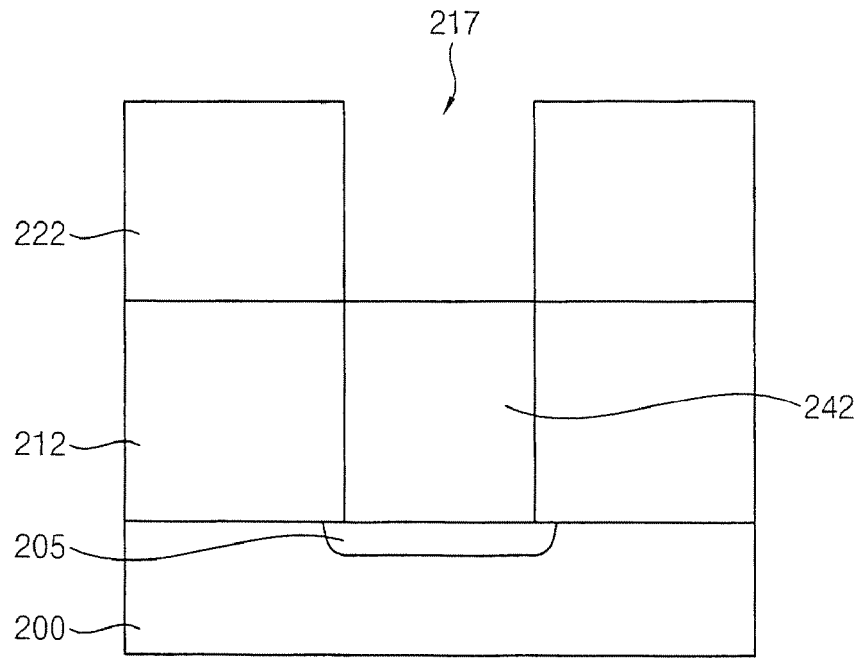
Figure 5F:
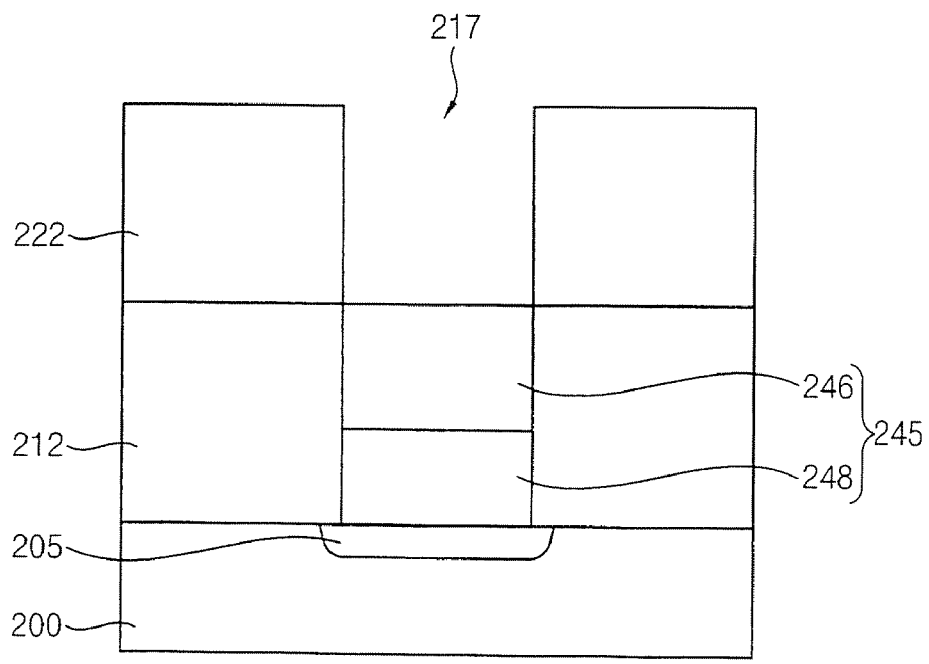
Figure 5G:
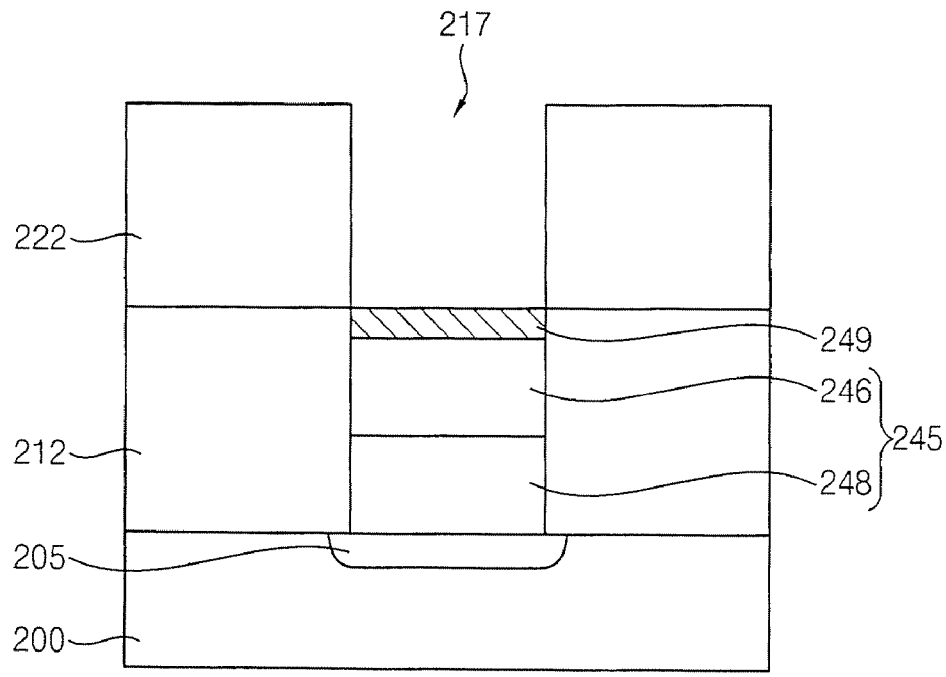
Figure 5H:
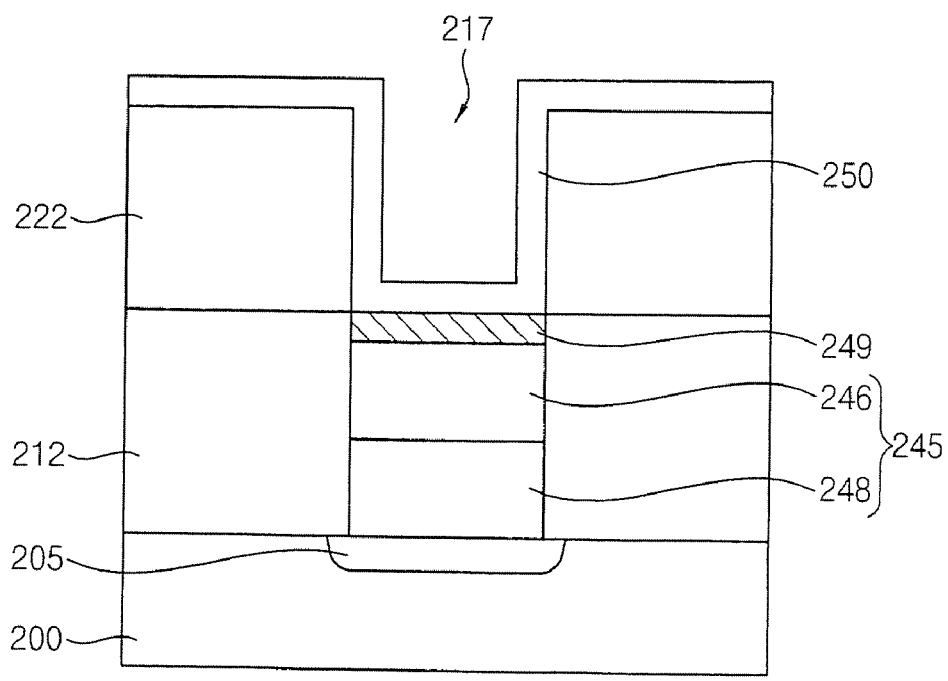
Figure 5I:
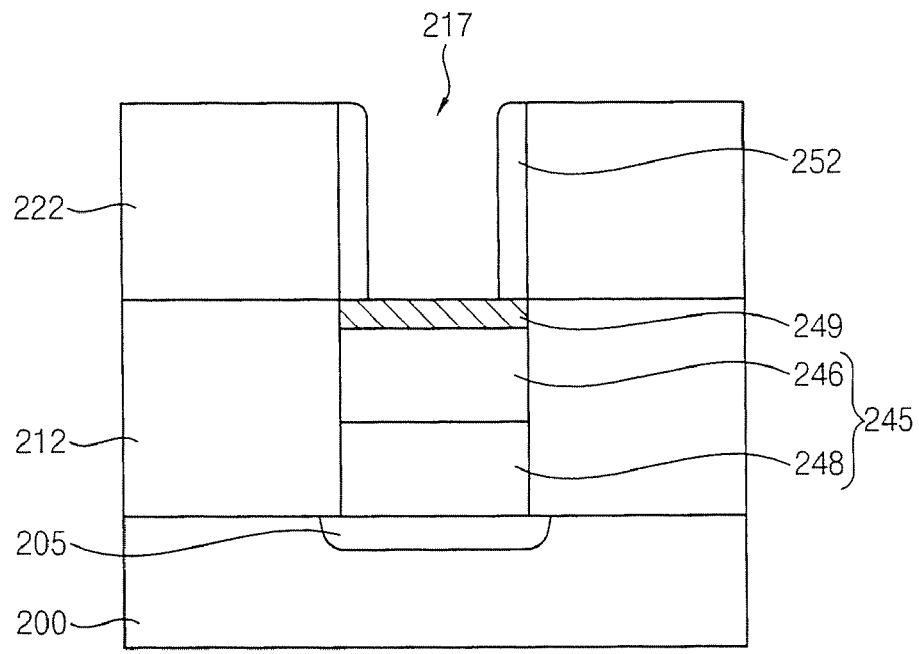
Figure 5J:
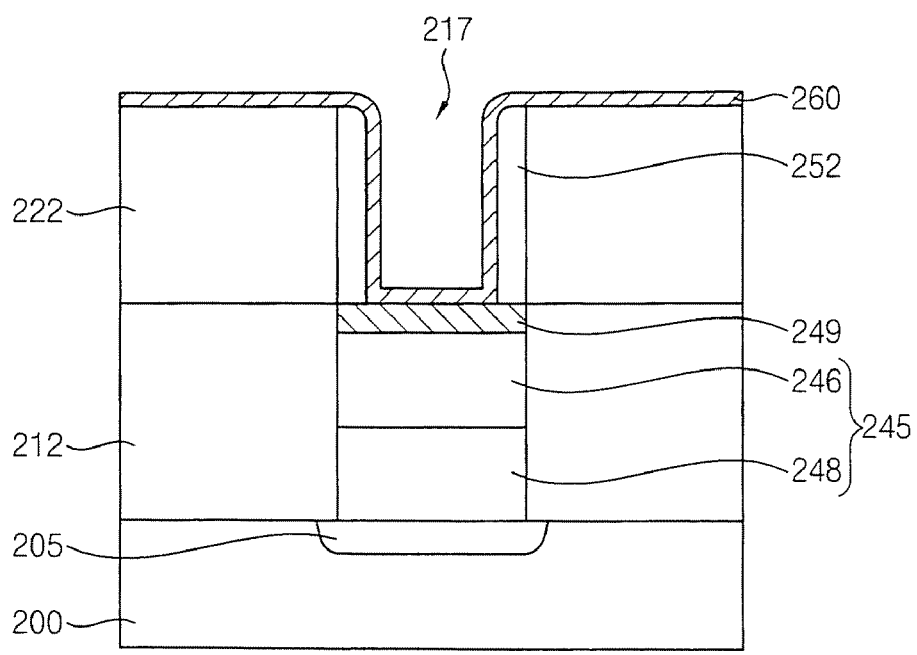
Figure 5K:
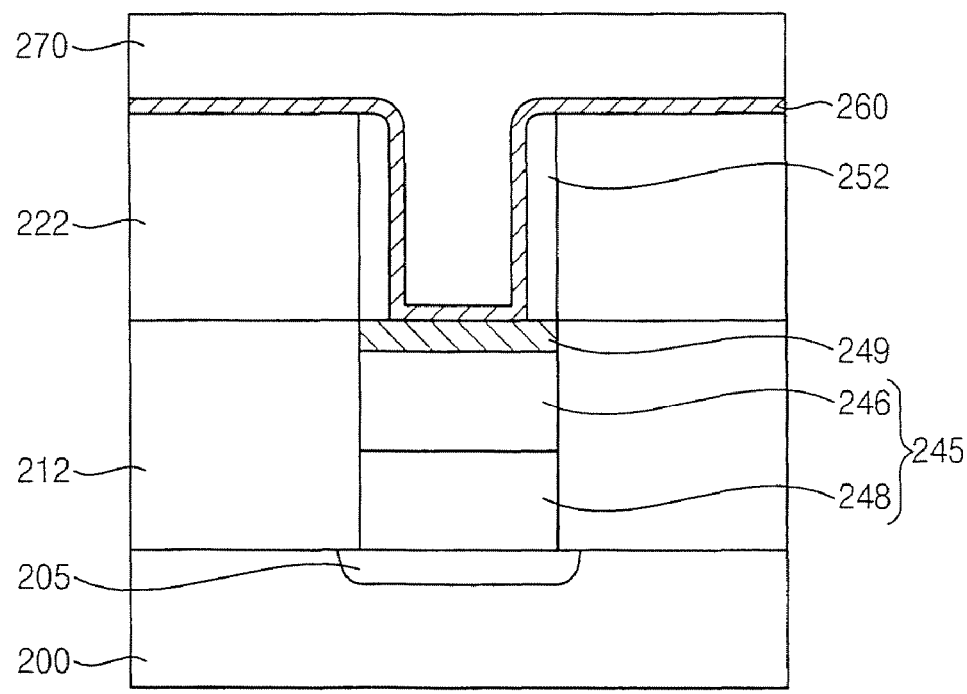
Figure 5L:
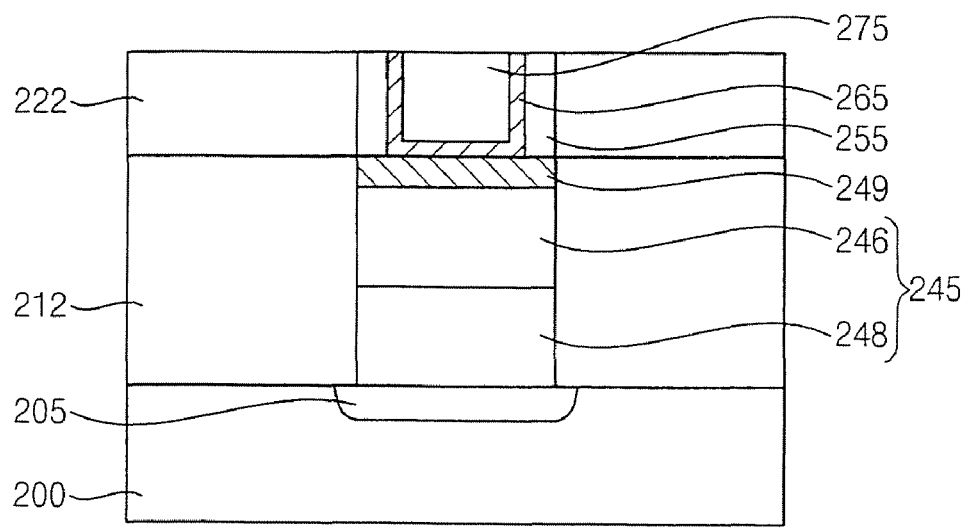
Figure 5M:
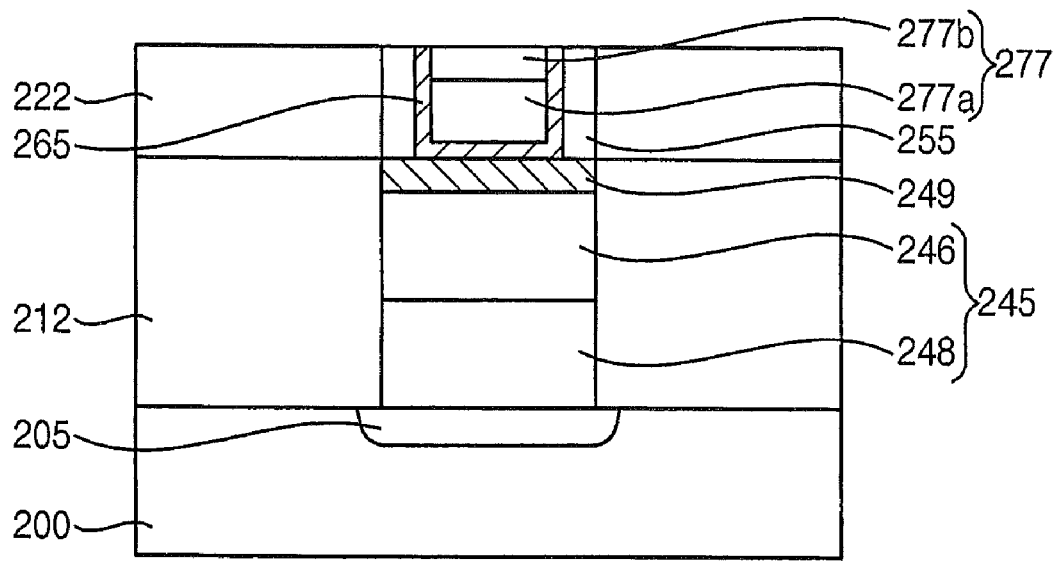
Figure 5N:
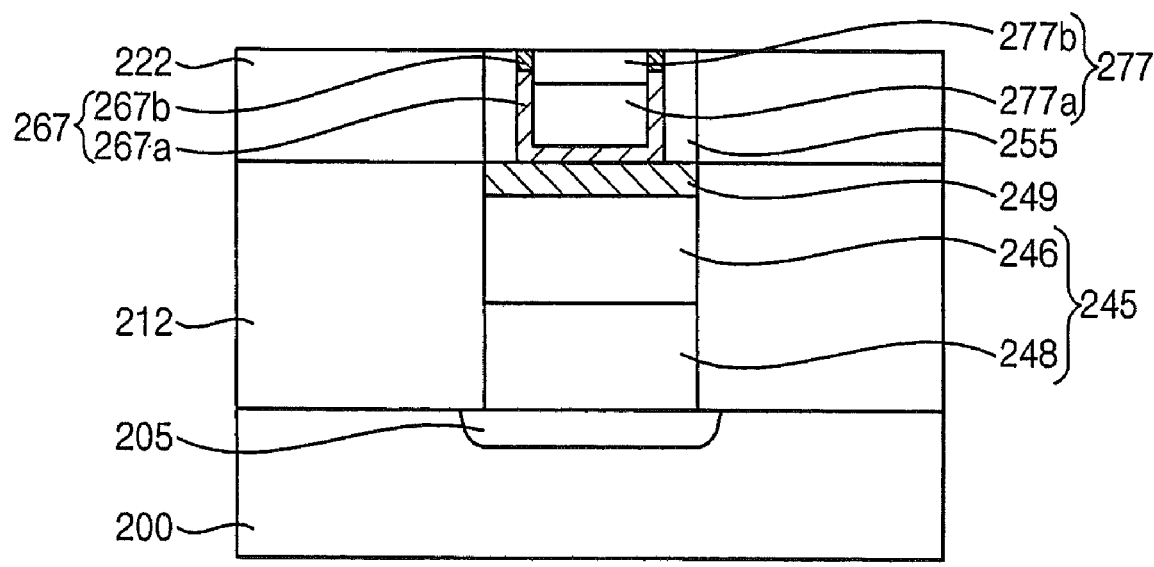
Figure 5O:
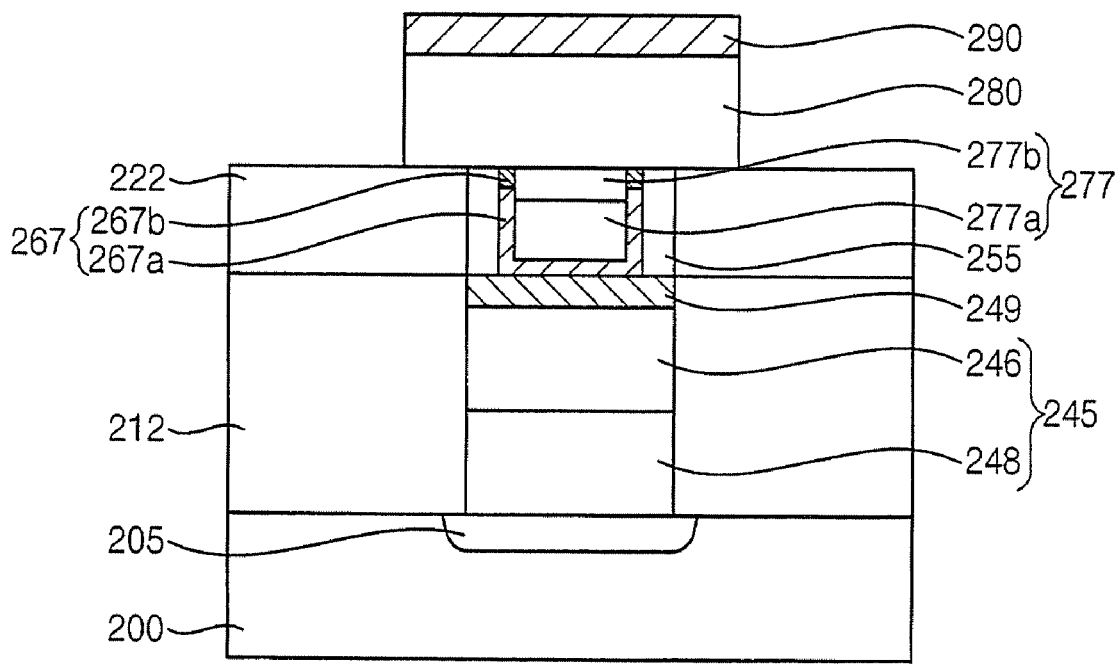

FIGS. 5A-O are cross-sectional views illustrating methods of fabricating integrated circuit memory cells, such as the integrated circuit memory cell of FIG. 4, in accordance with some embodiments of the present invention.

Referring to FIGS. 5A-B, an impurity region 205 is formed by implanting impurity ions into the semiconductor substrate 200. A first insulation layer 210 is formed on the substrate 200 and the impurity region 205. A second insulation layer 220 is formed on the first insulation layer 210. The first and second insulation layers 210 and 220 may be formed from silicon oxide and/or silicon nitride. Although first and second insulation layers 210 and 220 have been shown, it is to be understood that a single insulation layer or more than two insulation layers may alternatively be used.

Referring to FIGS. 5C-D, the first and second insulation layers 210 and 220 are patterned to form an opening 215 that exposes at least a portion of the impurity region 205, and results in patterned first and second insulation layers 212 and 222. For example, a mask may be formed on the second insulation layer 220 to define a location for the opening 215, and the opening 215 may be etched through the first and second insulation layers 210 and 220 using the mask. A silicon layer 240 is formed to at least partially fill the opening 215, such as by a selective epitaxial growth (SEG) process that uses the exposed impurity region 205 as a seed layer and/or by depositing the silicon layer 240 in the opening 215.

Referring to FIGS. 5E-F, the silicon layer 240 is recessed in the opening 215, such as by etching-back the silicon layer 240, to form a recessed silicon layer 242 and an opening 217 that exposes an upper surface of the recessed silicon layer 242. A vertical cell diode 245 is formed in the recessed silicon layer 242 by implanting or otherwise providing first conductivity type impurity ions (e.g., n-type ions) in a lower region 248 of the recessed silicon layer 242, and implanting or otherwise providing second conductivity type impurity ions (e.g., p-type ions), which are opposite to the first conductivity type impurity ions, in an upper region 246 of the recessed silicon layer 242.

Referring to FIG. 5G, an ohmic layer 249 is formed through the opening 217 on the exposed upper surface of the diode 245. The ohmic layer 249 may be formed as a metal silicide, such as by depositing or otherwise forming titanium (Ti), titanium nitride (TiN), cobalt (Co) on the exposed upper surface of the diode 245 at a temperature of, for example, 460° C.

Referring to FIGS. 5H-I, an insulation spacer layer 250 is formed on sidewalls of the opening 217 and on the ohmic layer 249. The spacer layer 250 may be formed by depositing silicon nitride at a temperature of, for example, at least 630° C. Spacers 252 are formed along sidewalls of the opening 217 by planarizing the spacer layer 250 to expose upper surfaces of the second insulation layer 222, and by removing a portion of the spacer layer 250, such as by anisotropically etching it, to expose a central portion of the ohmic layer 249. Accordingly, the spacers 252 extend from a peripheral portion of the ohmic layer 249 along at least a portion of the sidewalls of the opening 217.

Referring to FIGS. 5J-L, a lower electrode layer 260 is formed on the upper surfaces of the second insulation layer 222 and through the opening 217 onto sidewalls of the spacers 252 and the exposed central portion of the ohmic layer 249. Accordingly, the lower electrode layer 260 extends across the exposed portion of the ohmic layer 249 and extends upward along a least a portion of the sidewalls of the spacers 252 to form a cup shape. An interior of the lower electrode layer 260 in the opening 217 is filled, or at least partially filled, by a filling layer 270. The filling layer 270 may be formed from doped or undoped polysilicon.

The filling layer 270 may be formed within a range of temperatures that is sufficiently low to not substantially change resistance of the ohmic layer 249. For example, the filling layer 270 may be formed within a range of temperatures that is sufficiently low so that resistance of the ohmic layer 249 does not change more than 40% relative to before and after the filling layer 270 is formed. In some embodiments, the filling layer 207 is formed at temperatures that are less than a temperature at which the ohmic layer 249 becomes oxidized. In some further embodiments, the filling layer 275 is formed at temperatures that are less than 630° C., and may be formed within a range of temperatures that is between about 460° C. and 560° C.

The filling layer 270 and the lower electrode layer 260 are planarized to expose upper surfaces of the second insulation layer 222 and to form therefrom a filling member 275 and a cup-shaped lower electrode 265. The upper surfaces of the second insulation layer 222 may be recessed during formation of the filling member 275 and the cup-shaped lower electrode 265.

Referring to FIG. 5M, further processes are carried out to modify the filling member 275 to form a modified filling member 277 having an electrically insulating upper portion 277b and a conductive lower portion 277a.

In some embodiments, nitrogen is introduced into the upper portion 277b of the filling member 277 through, for example, a plasma nitridation process, to form a silicon nitride insulator therein. During the plasma nitridation process, nitrogen may also be introduced into an upper portion of the lower electrode 265. Accordingly, when the lower electrode 265 includes a metal, such as titanium (Ti), the plasma nitridation process may form a metal nitride, such as titanium nitride (TiN), in an upper portion of the lower electrode 265. At least some of the nitrogen introduced into the lower electrode 265 by the plasma nitridation process may be removed through, for example, an argon (Ar) sputtering process.

In some other embodiments, the upper portion 277b of the filling member 275 is oxidized to form a silicon oxide insulator therein. During the oxidation process, an upper portion of the lower electrode 265 may also be oxidized. Accordingly, when the lower electrode 265 includes a metal, such as titanium (Ti), the oxidation process may form a metal oxide, such as titanium oxide (TiOx), in an upper portion of the lower electrode 265. At least some of the oxide may be removed from the lower electrode 265 through, for example, an argon (Ar) sputtering process.

In yet some other embodiments, the filling member 275 may be recessed while leaving the conductive lower portion 277a shown in FIG. 5M. The insulating upper portion 277b may then be deposited on the conductive lower portion 277a to further fill, or completely fill, an interior of the lower electrode 265. For example, an insulation layer may be formed on upper surfaces of the second insulation layer 222 and filling an interior of the lower electrode 265 on the conductive lower portion 277a. The insulation layer may include, for example, silicon oxide and/or silicon nitride. The insulation layer may then be planarized to expose upper surfaces of the second insulation layer 222 and upper surfaces of the lower electrode 265.

Referring to FIG. 5N, the lower electrode 277 is formed so that an upper portion 267b thereof has a greater resistivity than a lower portion 267a thereof. In some embodiments, nitrogen is introduced into the upper portion 267b of the lower electrode 267 to increase resistivity of the upper portion 267b relative to the lower portion 267a. Accordingly, when the lower electrode 265 includes a metal, the upper portion 267b may be formed as a metal nitride. The nitrification process may be the same as that carried out to introduce nitrogen into the upper portion 277b of the filling member 277, or may be an additional nitrification process.

In some other embodiments, an upper portion of the lower electrode 265 of FIG. 5M may be removed, such as by etching, while leaving the lower portion 267a shown in FIG. 5N. The upper portion 267b of the lower electrode 267 may then be formed by depositing a material on the lower portion 267a that has a greater resistivity than the material of the lower portion 267a.

Referring to FIG. 5O, a variable resistivity material layer 280 is formed on an upper surface of the second insulation layer 222, the spacers 255, an upper surface of the second filling member 277b, and is electrically connected to the upper portion 267b of the lower electrode 267. The variable resistivity material layer 280 may include a phase changeable material such as a chalcogenide material that includes, for example, germanium (Ge), antimony (Sb), and/or tellurium (Te). An upper electrode 290 is formed on the variable resistivity material layer 280.

Because the upper portion 267b of the lower electrode 267 has a greater resistivity than the lower portion 267a of the lower electrode 267, the resistance at the interface between the lower electrode 267 and the ohmic layer 249 can be much less than the resistance at the interface between the lower electrode 267 and the variable resistivity material layer 280, which may provide improved operational characteristics for the integrated circuit memory cell.

FIGS. 6A-I are cross-sectional views illustrating methods of fabricating integrated circuit memory cells in accordance with some other embodiments of the present invention. FIGS. 6A-I contain similar structural elements to those shown in FIGS. 5A-G, which are referenced by the same numbers. As will be explained below, in contrast to FIGS. 5B-C where the diode 245 and the ohmic layer 249 are formed in the opening 215 through the first and second insulation layers 210 and 220, in FIGS. 6B-I, the diode 245 and the ohmic layer 249 are formed in the opening in a patterned first insulation layer 212 before the second insulation layer 220 is formed thereon with an opening 217 that exposes the ohmic layer 249.

Figure 6A:
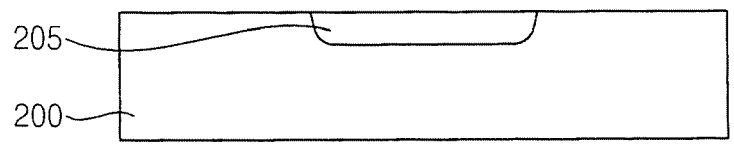
FIGS. 6A-I are cross-sectional views illustrating methods of fabricating integrated circuit memory cells in accordance with some other embodiments of the present invention.
Figure 6B:
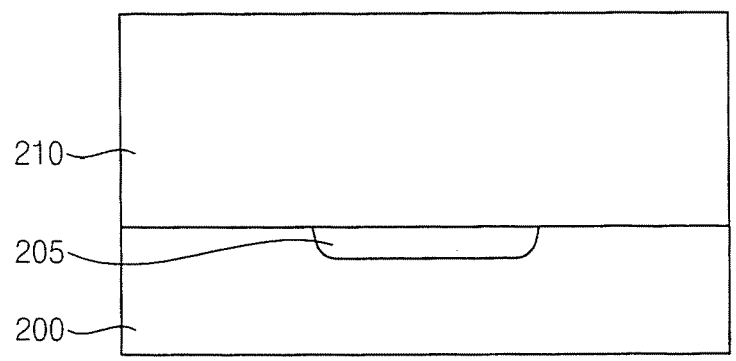
Figure 6C:
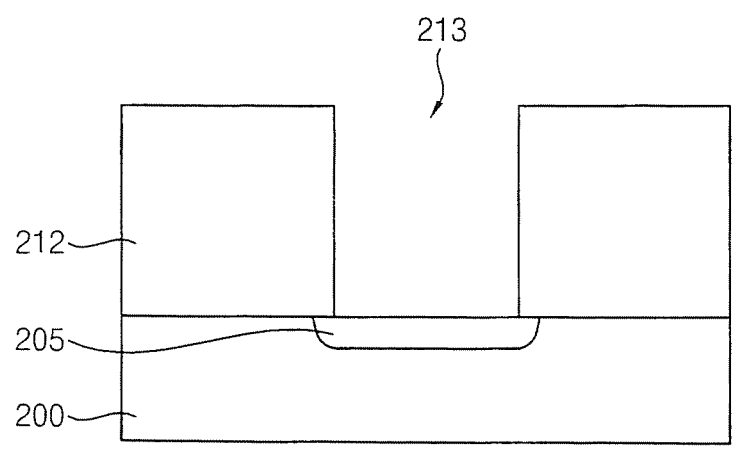

Referring to FIGS. 6A-C, an impurity region 205 is formed by implanting impurity ions into a semiconductor substrate 200. A first insulation layer 210 is formed on the substrate 200 and the impurity region 205, such as by depositing or otherwise forming a silicon oxide layer and/or a silicon nitride layer. The first insulation layer 210 is patterned to form a patterned first insulation layer 212 having an opening 213 that exposes at least a portion of the impurity region 205. For example, a mask may be formed on the first insulation layer 210 to define a location for the opening 213, and the opening 213 may be etched through the first insulation layer 210 using the mask.

Figure 6D:
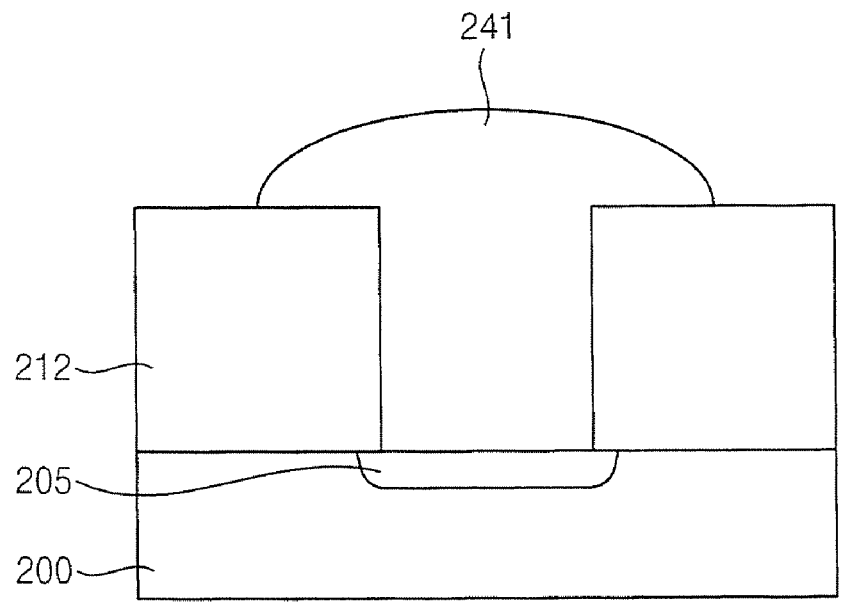

Referring to FIG. 6D, a silicon layer 241 is formed to at least partially fill the opening 213. The silicon layer 241 may be formed by a selective epitaxial growth (SEG) process that uses the exposed impurity region 205 as a seed layer and/or by depositing the silicon layer 241 in the opening 215.

Figure 6E:
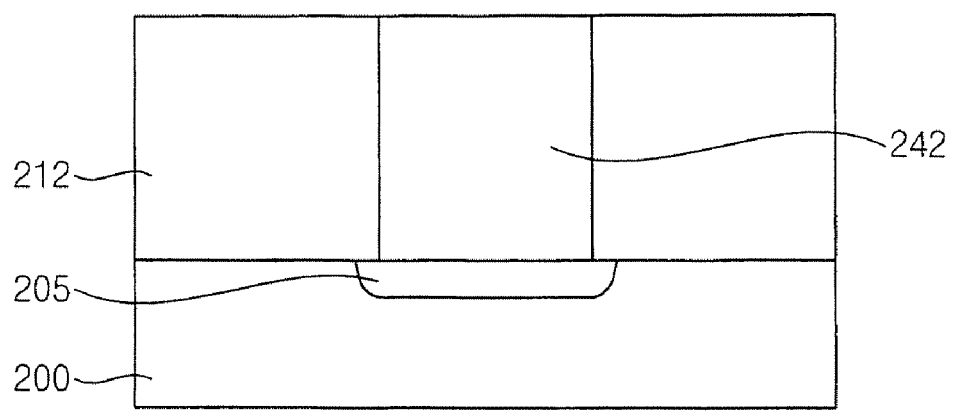

Referring to FIG. 6E, the silicon layer 241 is planarized to expose upper surfaces of the patterned first insulation layer 212 and to form a silicon layer 242.

Figure 6F:
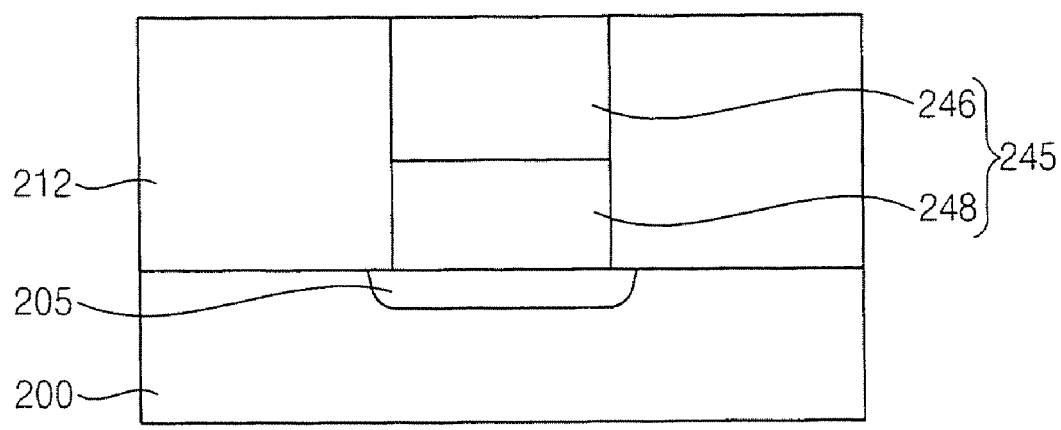
Figure 6G:
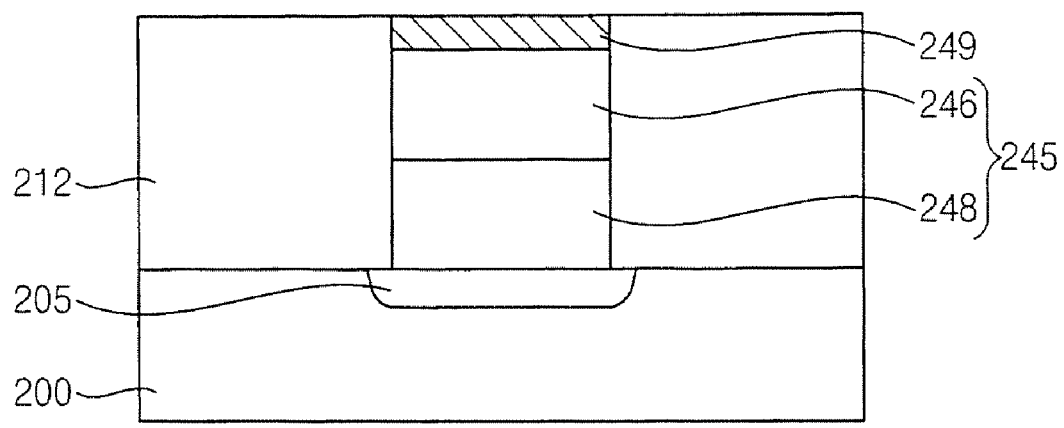

Referring to FIGS. 6F-G, a vertical cell diode 245 is formed in the silicon layer 242 by implanting or otherwise providing first conductivity type impurity ions (e.g., n-type ions) in a lower region 248 of the diode 245, and implanting or otherwise providing second conductivity type impurity ions (e.g., p-type ions), which are opposite to the first conductivity type impurity ions, in an upper region 246 of the diode 245. An ohmic layer 249 is formed on the upper region 246 of the diode 245. An upper surface of the upper region 246 may be recessed below the upper surfaces of the patterned first insulation layer 212 before the ohmic layer 249 is formed thereon. The ohmic layer 249 may be formed from a metal silicide, such as by depositing titanium (Ti), titanium nitride (TiN), and/or cobalt (Co) on the exposed upper surface of the diode 245 at a temperature of, for example, 460° C.

Figure 6H:
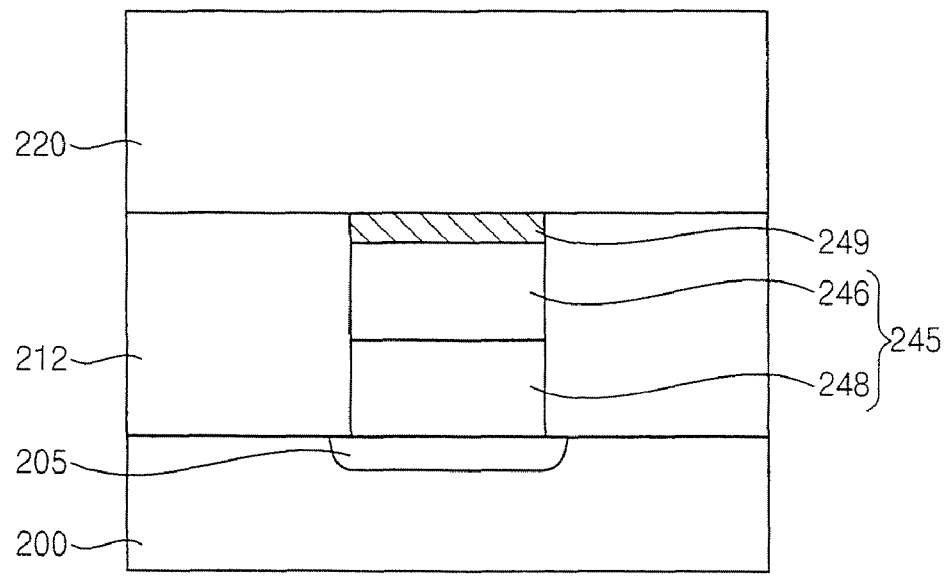
Figure 6I:
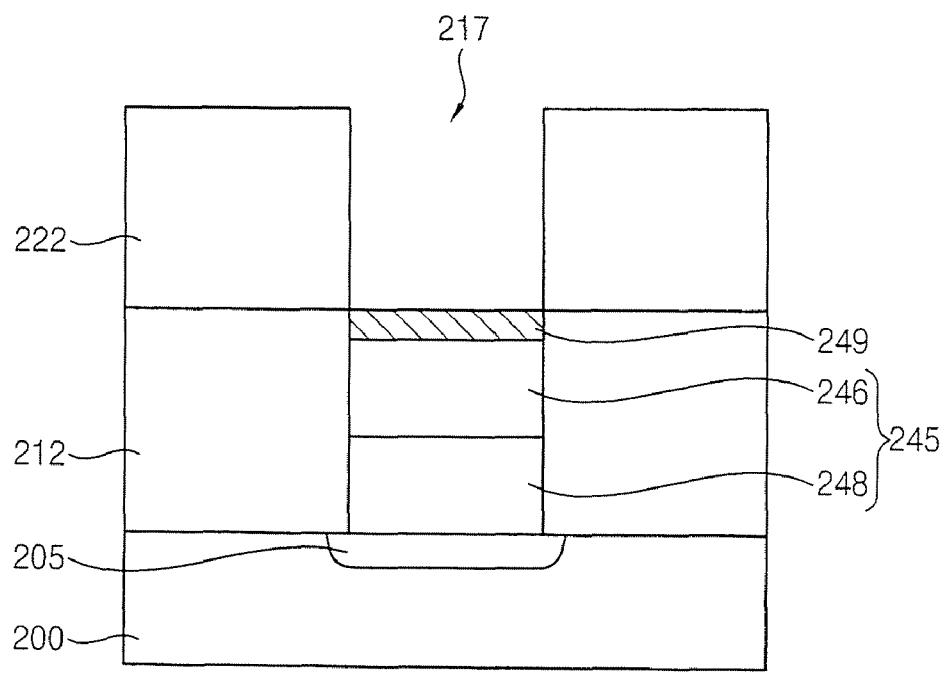

Referring to FIGS. 6H-I, a second insulation layer 220 is formed on the patterned first insulation layer 212 and on the ohmic layer 249, such as by depositing or otherwise forming a silicon oxide layer and/or a silicon nitride layer. The second insulation layer 220 is patterned to form a patterned second insulation layer 222 having an opening 217 that exposes at least a portion of the ohmic layer 249.

The methods described above with regard to FIGS. 5H-U may then be carried out on the structure of FIG. 6I to fabricate an integrated circuit memory cell in accordance with some embodiments of the present invention.

Figure 7:
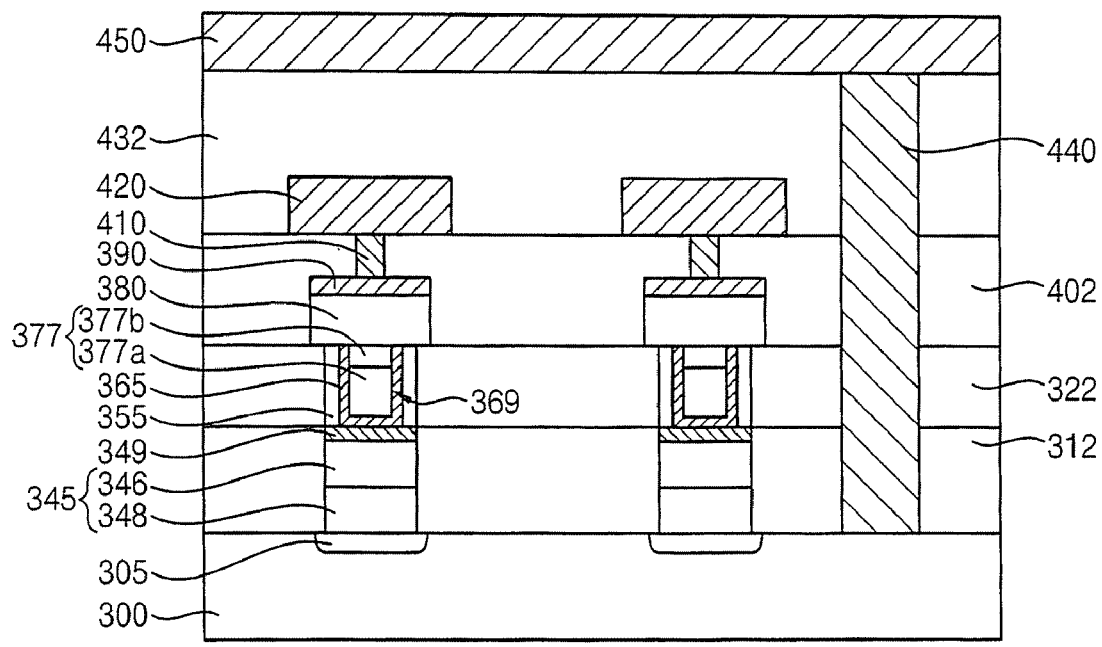
FIG. 7 is a cross-sectional view illustrating a diode type PRAM device in accordance with some embodiments of the present invention.

FIG. 7 is a cross-sectional view illustrating a diode type PRAM device, which may include the memory cell of FIG. 4, in accordance with some embodiments of the present invention. Referring to FIG. 7, the diode type PRAM device includes impurity regions region 305 formed by implanting impurity ions into a semiconductor substrate 300. A first insulation layer 312 is on the substrate 300. Vertical diodes 345 extend through at least a portion of the first insulation layer 312 and are electrically connected to the impurity regions 305. The vertical diodes 345 each include a lower region 348 having a first impurity type and an upper region 346 having an opposite second impurity type. Ohmic layers 349 are electrically connected to, and may be directly on, an upper surface of the vertical diodes 345.

A second insulation layer 322 is on the first insulation layer 312 and has an opening that is substantially aligned with the ohmic layer 349. Spacers 355 extend along sidewalls of the opening in the second insulation layer 322. A cup-shaped lower electrode 365 extends across a portion of the ohmic layer 349 and upward along the spacers 355.

A filling member 377 fills an interior 369 of the lower electrode 365. The filling member 377 is formed within a range of temperatures that is sufficiently low to not substantially change resistance of the ohmic layer 349. The filling member 377 may be formed within a range of temperatures that is sufficiently low so that resistance of the ohmic layer 349 does not change more than 40% relative to before and after the filling member 377 is formed. In some embodiments, the filling member 377 is formed at temperatures less than a temperature at which the ohmic layer 349 becomes oxidized. In some further embodiments, the filling member 377 is formed at temperatures that are less than 630° C., and may be formed within a range of temperatures between about 460° C. and 560° C.

The filling member 377 can include a first filling member 377a that partially fills the interior 369 of the lower electrode 365, and a second filling member 377b that at least partially further fills, and may completely fill the remaining portion of, the interior 369 of the lower electrode 365. The first and second filling members 377a and 377b may be formed as described above for the filling members 277a and 277b, the description of which is incorporated herein.

Variable resistivity material layers 380 are on an upper surface of the second insulation layer 322, the spacers 355, an upper surface of the second filling member 377b, and is electrically connected to the lower electrode 365. The variable resistivity material layers 380 may include a phase changeable material such as a chalcogenide material that includes, for example, germanium (Ge), antimony (Sb), and/or tellurium (Te). Upper electrodes 390 are formed on the variable resistivity material layers 380. A third insulation layer 402 is formed on the resultant structure.

Conductive contacts 410 extend through the third insulation layer 402 to contact the upper electrodes 390. Conductive lines 420, such as bit lines, are formed on the conductive contacts 410. A fourth insulation layer 432 extends across the third insulation layer 402 and the conductive bit lines 420.

A conductive contact 440 extends through the first insulation layer 312, the second insulation layer 322, the third insulation layer 402, and the fourth insulation layer 432 to contact the substrate 300. A conductive line 450, such as a word line, is on the conductive contact 440.

The first insulation layer 312, the second insulation layer 322, the third insulation layer 402, and the fourth insulation layer 432 may include silicon oxide and/or silicon nitride. Although four insulation layers 312, 322, 402, and 432 have been shown, it is to be understood that any number of insulation layers may alternatively be used.

Figure 8:
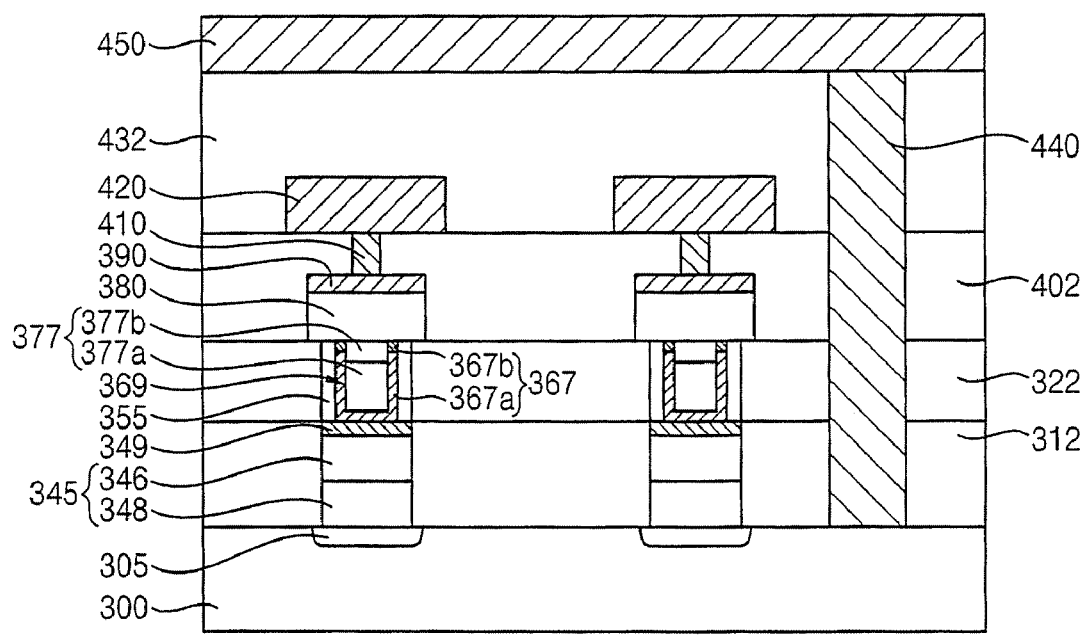
FIG. 8 is a cross-sectional view illustrating a diode type PRAM device in accordance with some other embodiments of the present invention.

FIG. 8 is a cross-sectional view illustrating a diode type PRAM device in accordance with some other embodiments of the present invention. The diode type PRAM device of FIG. 8 differs from the diode type PRAM device of FIG. 7 in that the lower electrode 367 may have a structure corresponding to that described with regard to the lower electrode 267 of FIG. 4 and may be formed using one or more of the processes described with regard to FIG. 5N. Accordingly, the lower electrode 367 includes a lower portion 367a and an upper portion 367b, with the upper portion 367b having a material with a greater resistivity than a material of the lower portion 367a.

Figure 9:
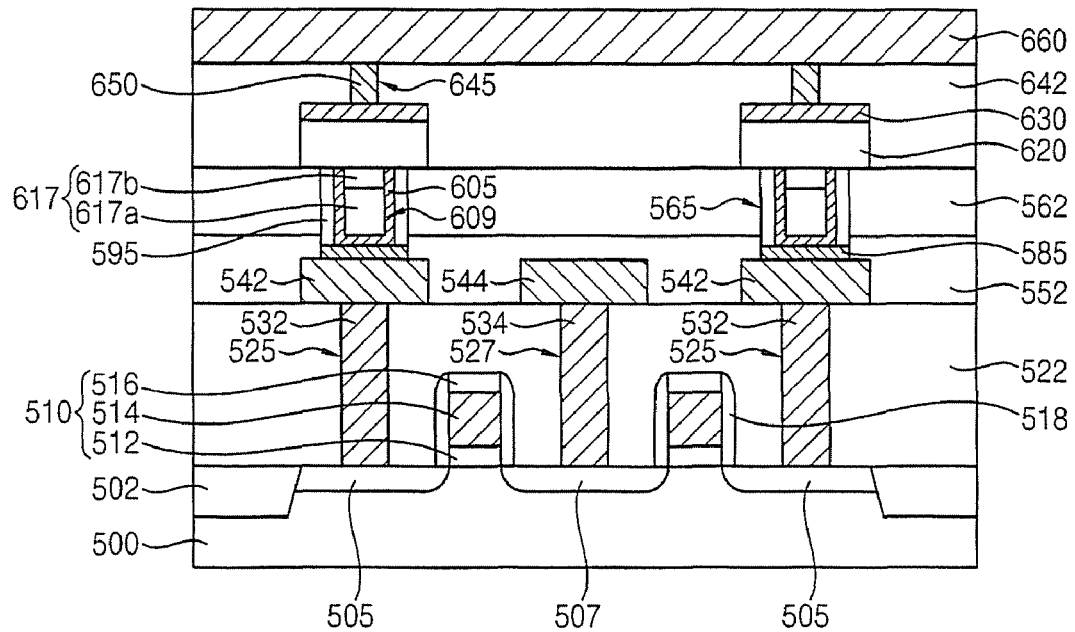
FIG. 9 is a cross-sectional view illustrating a transistor type PRAM device in accordance with some embodiments of the present invention.

FIG. 9 is a cross-sectional view illustrating a transistor type PRAM device in accordance with some embodiments of the present invention. The transistor type PRAM device of FIG. 9 includes a variable resistivity material layer that is electrically connected to, a terminal of a transistor. With reference to FIG. 9, the transistor type PRAM device includes source and drain regions, 505 and 507, between isolation regions 502 in a substrate 500. Floating gates 510 are on channel regions in the substrate 500 between the source and drain regions, 505 and 507. The floating gates 510 may each include a capping layer 516, a gate 514, and a tunneling insulation layer 512. Sidewall spacers 518 are between sidewalls of the floating gates 510 and a first insulation layer 522. The first insulation layer 522 is on and extends across the isolation regions 502, the source and drain regions, 505 and 507, and the floating gates 510.

Conductive contacts 532 extend through openings 525 in the first insulation layer 522 to contact one type of the source and drain regions, 505 and 507. Contact pads 542 are on the contacts 532 and an upper surface of the first insulation layer 522. Another conductive contact 534 extends through an opening 527 in the first insulation layer 522 to contact another type of the source and drain regions, 505 and 507. A conductive line 544 is formed on the conductive contact 534.

A second insulation layer 552 is on and extends across the first insulation layer 522, the conductive pads 542, and the conductive line 544. A third insulation layer 562 is on the second insulation layer 552. Openings 565 extend through the third insulation layer 562 and a portion of the second insulation layer 550 to an upper surface of the contact pads 542. Ohmic layers 585 are electrically connected to, and may be directly on, an upper surface of the contact pads 542 in the openings 565.

Spacers 595 extend from a peripheral region of the ohmic layers 585 along sidewalls of the opening 565. Cup-shaped lower electrodes 605 extend across an upper surface of the ohmic layers 585 and upward along the spacers 595.

Filling members 617 at least partially fill an interior 609 of the lower electrodes 605. The filling members 617 are formed within a range of temperatures that is sufficiently low to not substantially change resistance of the ohmic layers 585. The filling members 617 may be formed within a range of temperatures that is sufficiently low so that resistance of the ohmic layers 585 does not change more than 40% relative to before and after the filling members 617 are formed. In some embodiments, the filling member 617 are formed at temperatures that are less than a temperature at which the ohmic layer 585 becomes oxidized. In some further embodiments, the filling members 617 are formed at temperatures that are less than 630° C., and may be formed within a range of temperatures between about 460° C. and 560° C.

The filling members 617 can include a first filling member 617a that partially fills the interior 609 of the lower electrodes 605, and a second filling member 617b that at least partially further fills, and may completely further fill, the interior 609 of the lower electrodes 605. The first and second filling members 617a and 617b may be formed as described above for the filling members 277a and 277b, the description of which is not repeated for brevity.

Variable resistivity material layers 620 are on an upper surface of the third insulation layer 562, the spacers 595, an upper surface of the second filling member 617b, and are electrically connected to the lower electrode 605. The variable resistivity material layers 620 may include a phase changeable material such as a chalcogenide material that includes, for example, germanium (Ge), antimony (Sb), and/or tellurium (Te). Upper electrodes 630 are formed on the variable resistivity material layers 620. A fourth insulation layer server 42 is on and extends across the third insulation layer 562 and the upper electrodes 630. Although four insulation layers 522, 552, 562, and 642 have been shown, it is to be understood that any number of insulation layers may alternatively be used.

Conductive contacts 650 extend through openings 645 in the fourth insulation layer of 642 to contact the upper electrodes 630. A conductive line 660 is formed on the conductive contacts 650.

Figure 10:
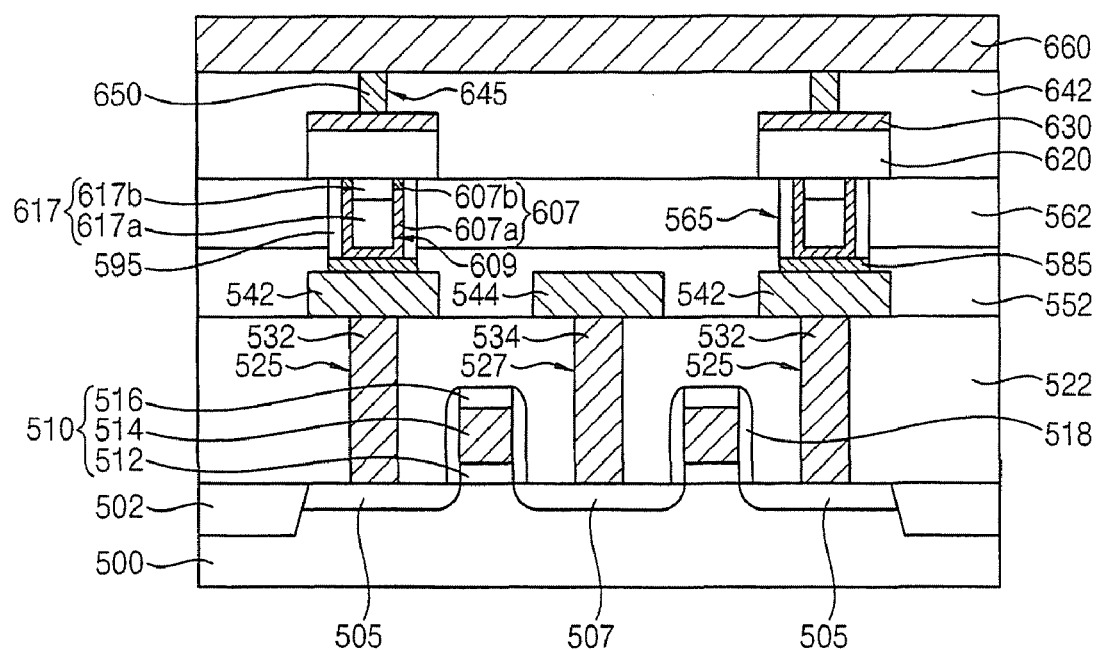
FIG. 10 is a cross-sectional view illustrating a transistor type PRAM device in accordance with some other embodiments of the present invention.

FIG. 10 is a cross-sectional view illustrating a transistor type PRAM device in accordance with some other embodiments of the present invention. The transistor type PRAM device of FIG. 10 differs from the transistor type PRAM device of FIG. 9 in that the lower electrode 607 may have a structure corresponding to that described above with regard to the lower electrode 267 of FIG. 4, and may be formed using one or more the processes described above with regard to FIG. 5N. Accordingly, the lower electrode 607 includes a lower portion 607a and an upper portion 607b, with the upper portion 607b having a greater resistivity than the lower portion 607a.

Figure 11A:
FIGS. 11A-U are cross-sectional views illustrating methods of fabricating diode type PRAM devices in accordance with some embodiments of the present invention.
Figure 11B:
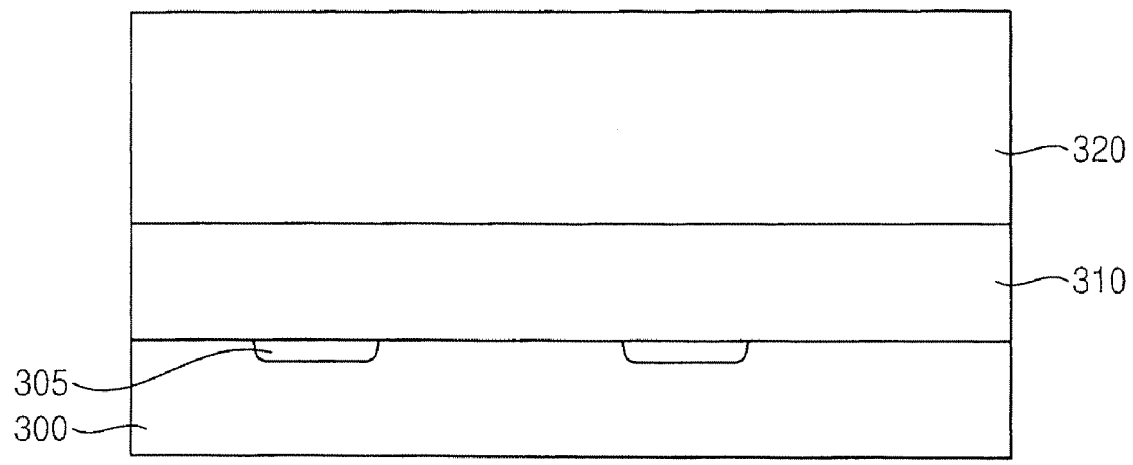
Figure 11C:
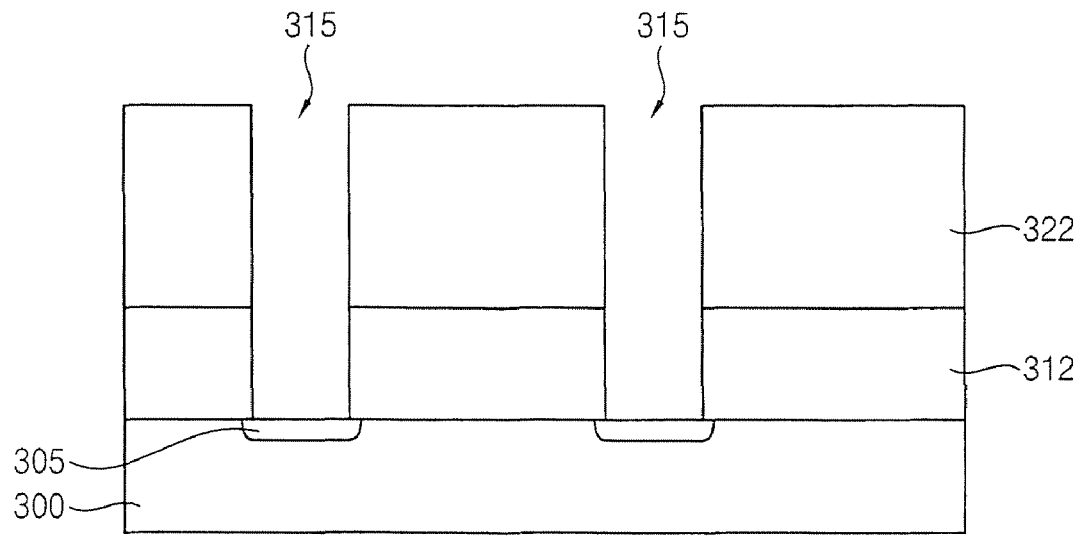
Figure 11D:
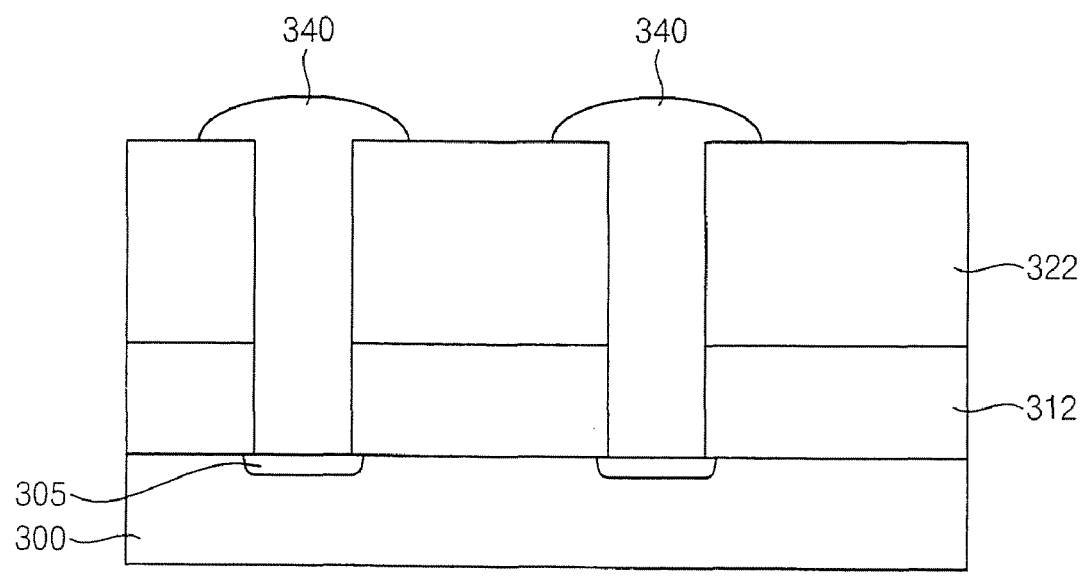
Figure 11E:
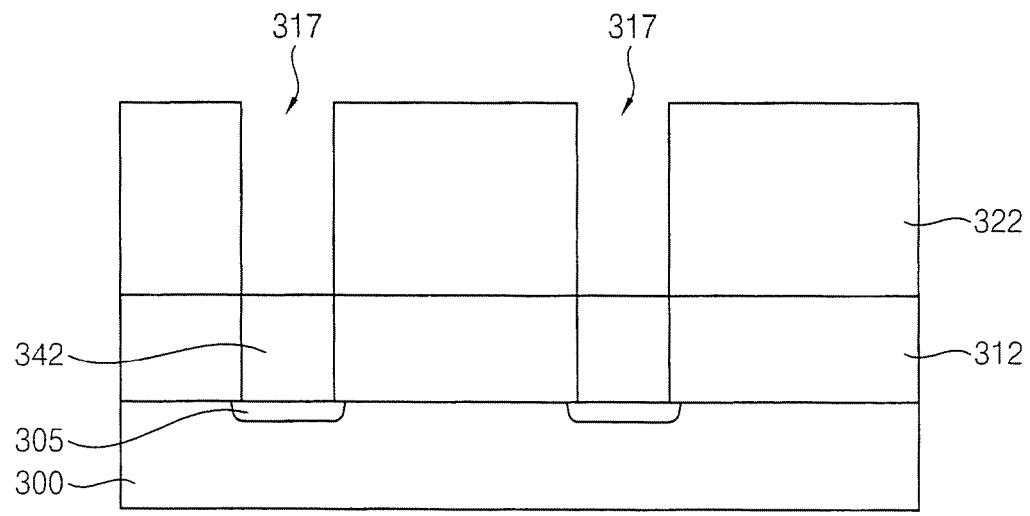
Figure 11F:
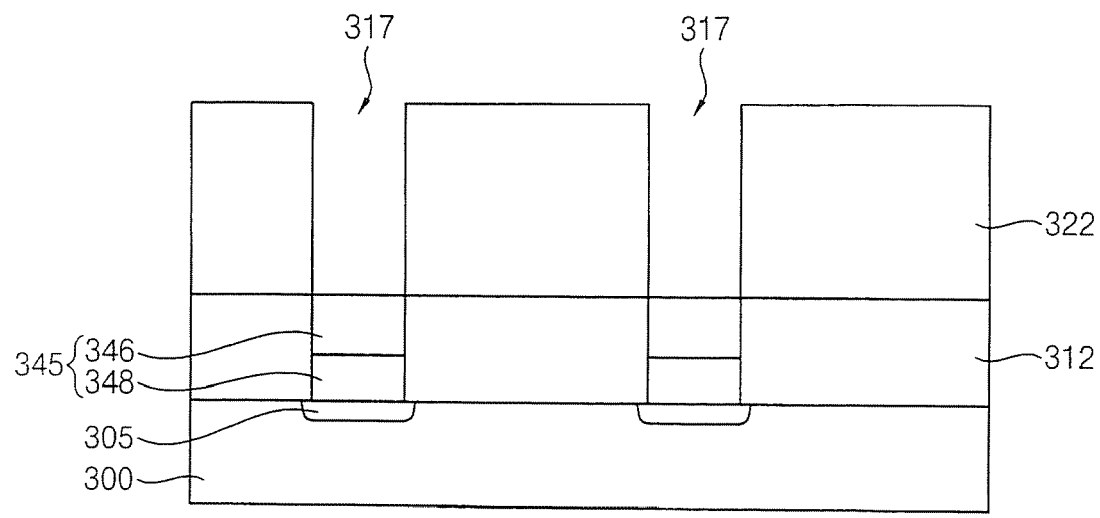
Figure 11G:
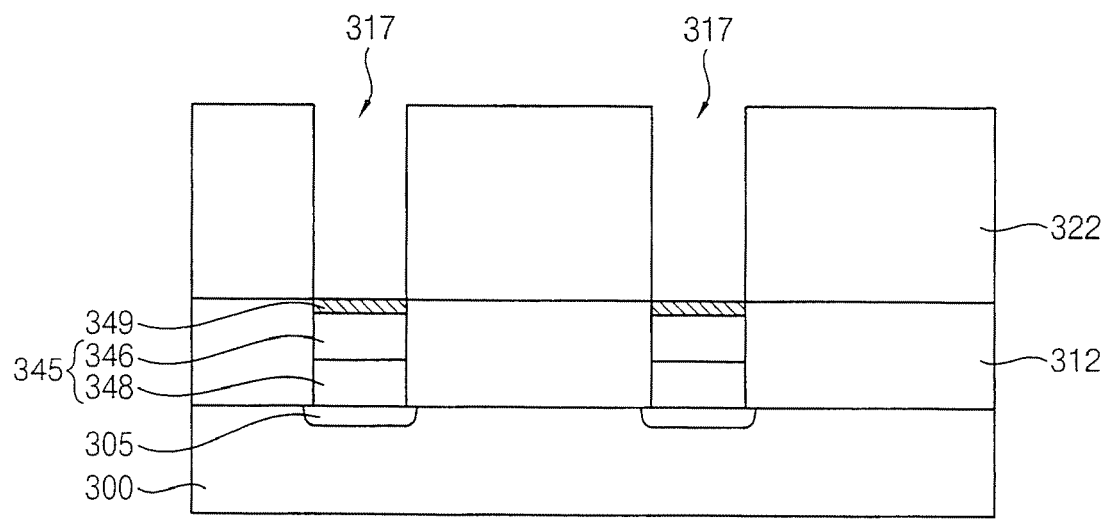
Figure 11H:
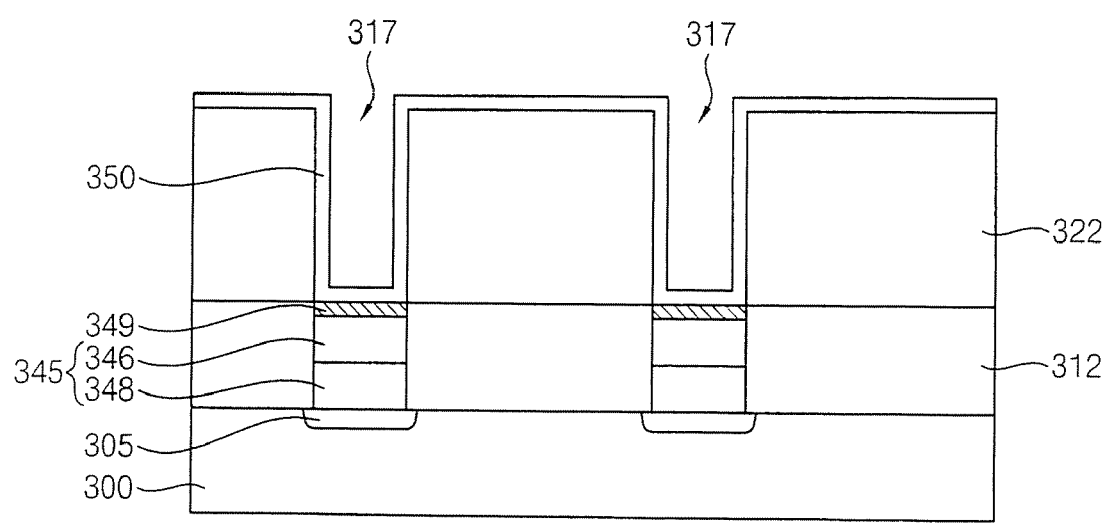
Figure 11I:
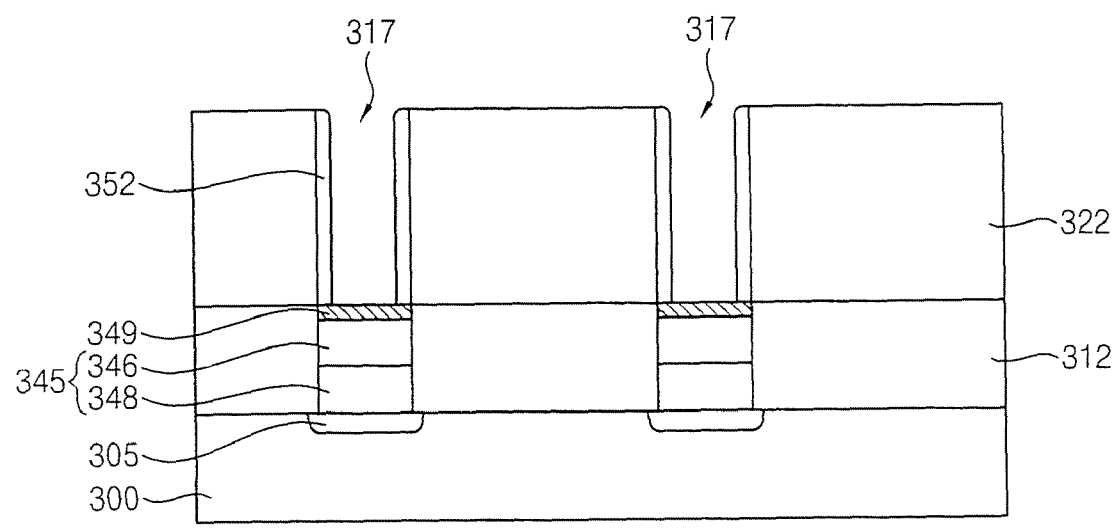
Figure 11J:
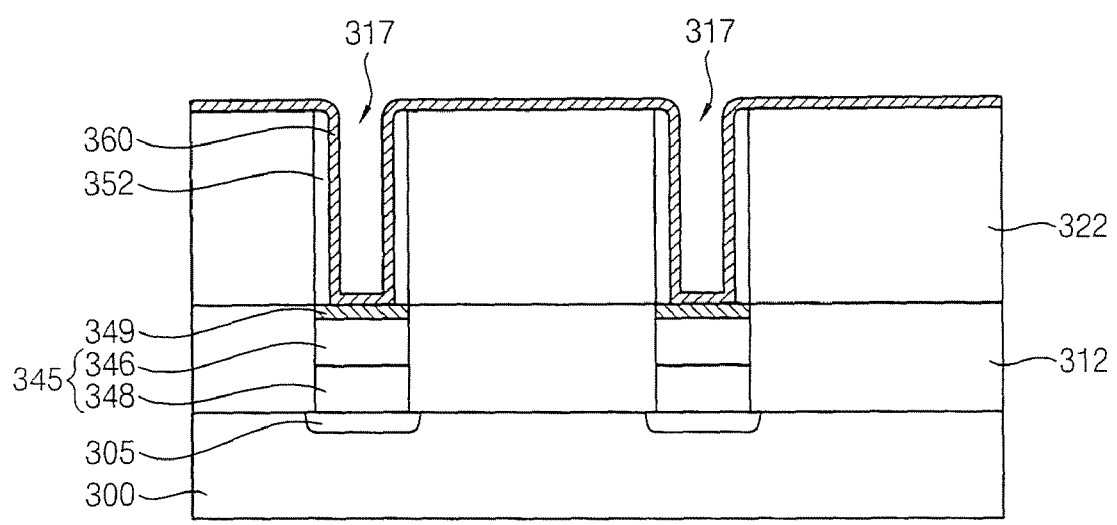
Figure 11K:
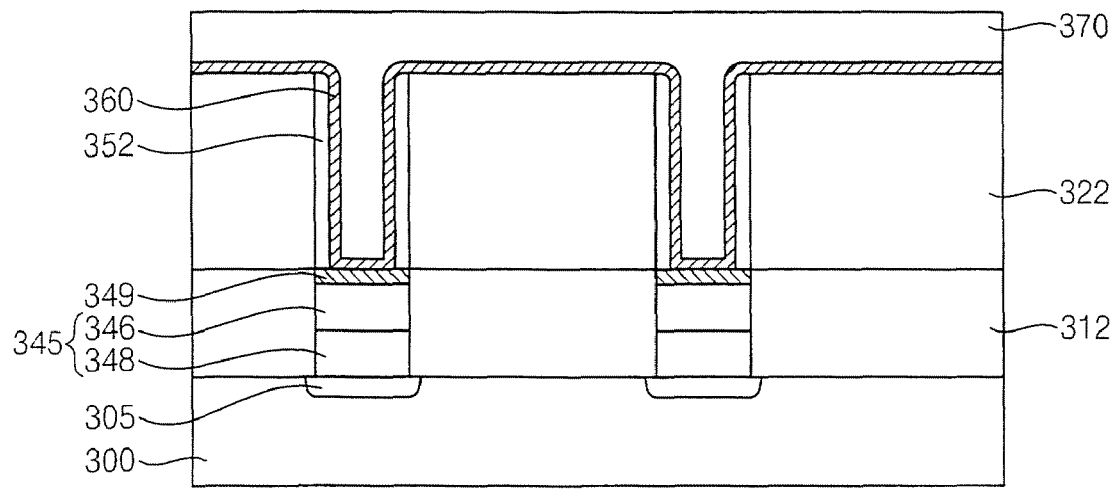
Figure 11L:
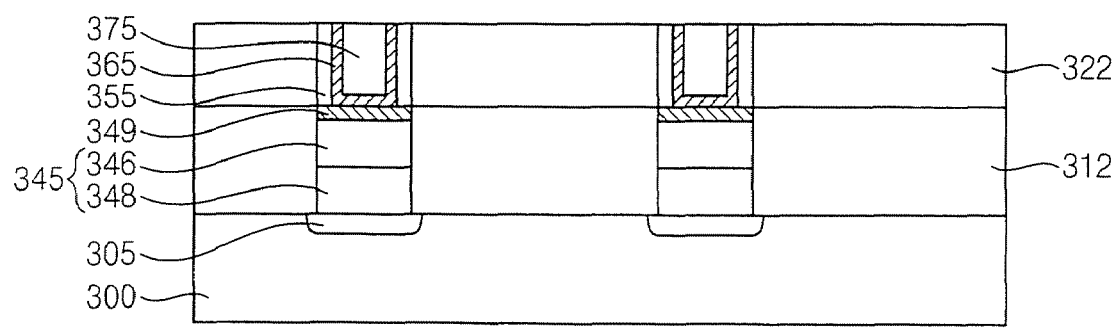
Figure 11M:
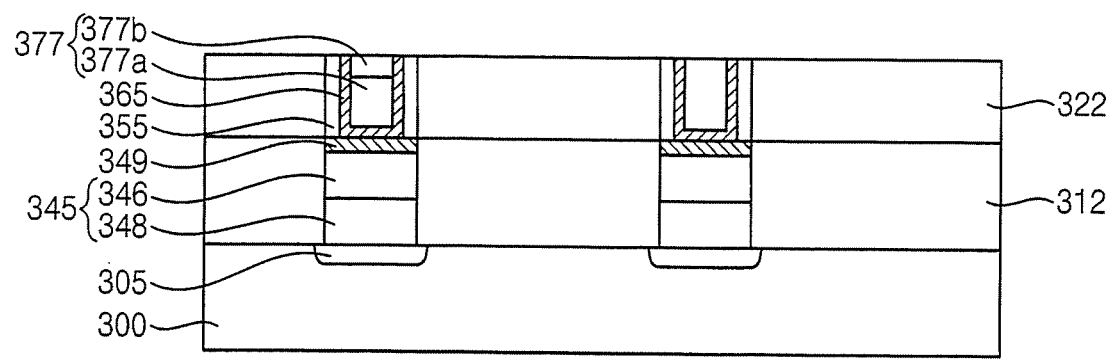
Figure 11N:
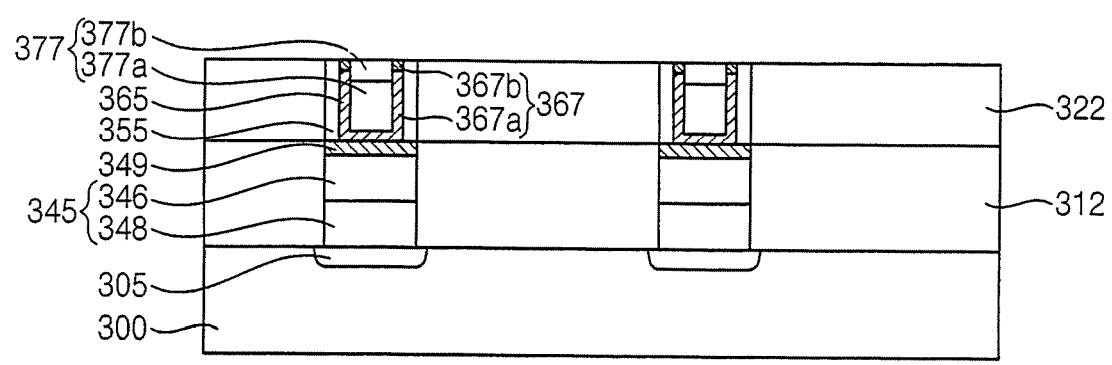
Figure 11O:
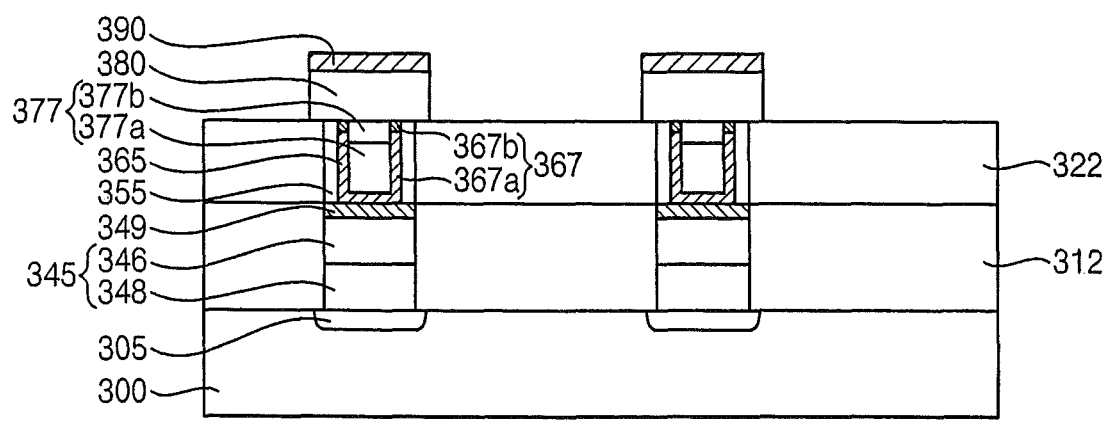
Figure 11P:
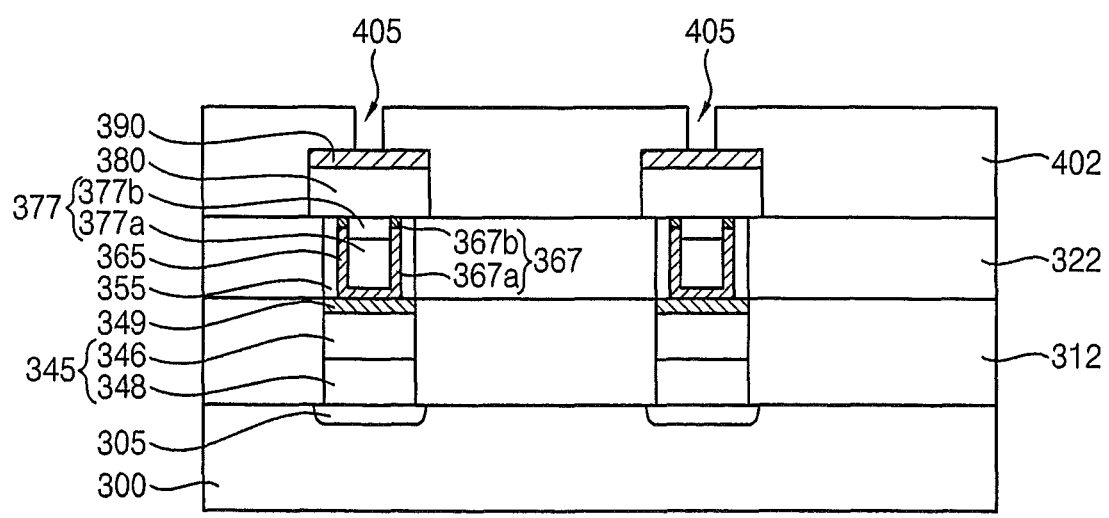
Figure 11Q:
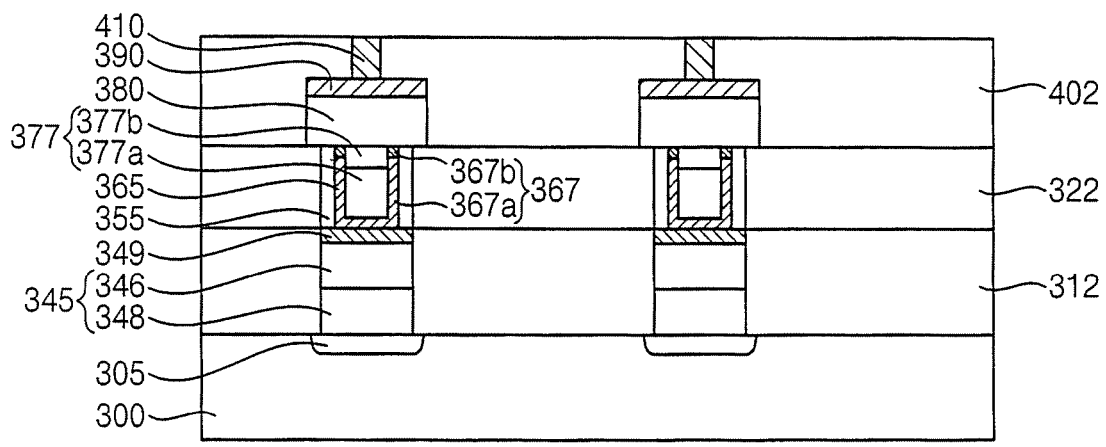
Figure 11R:
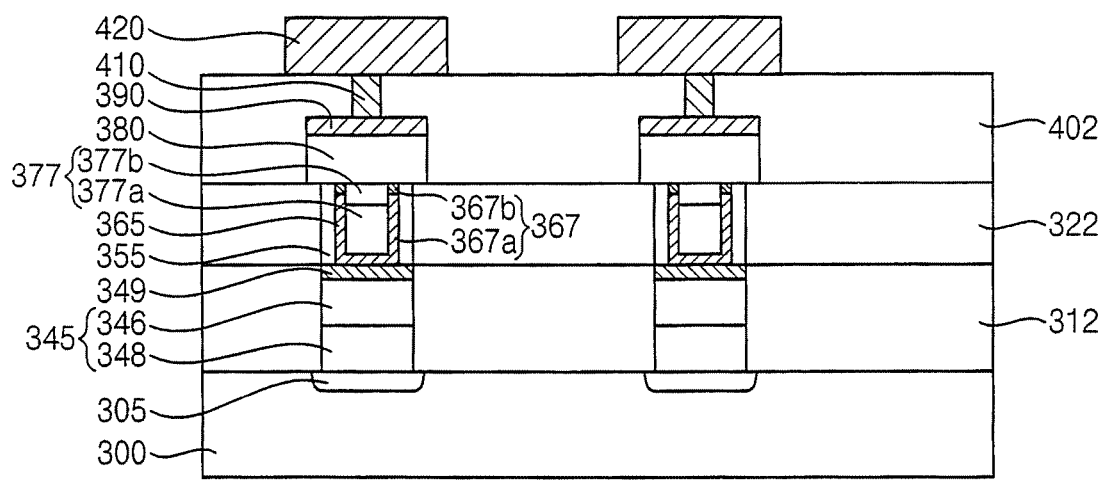
Figure 11S:
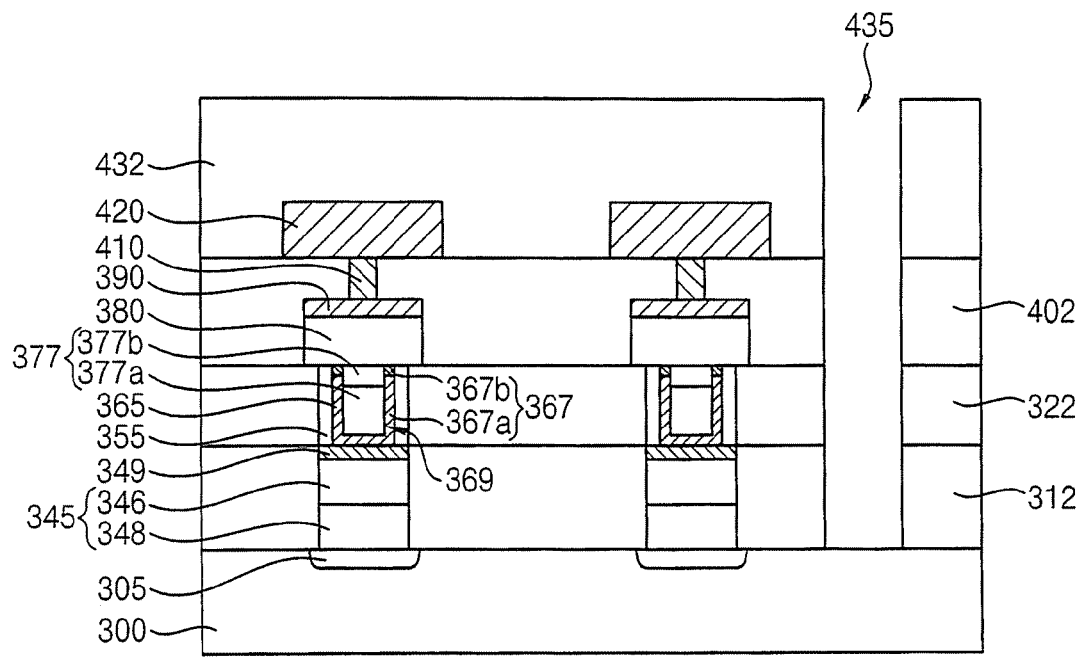
Figure 11T:
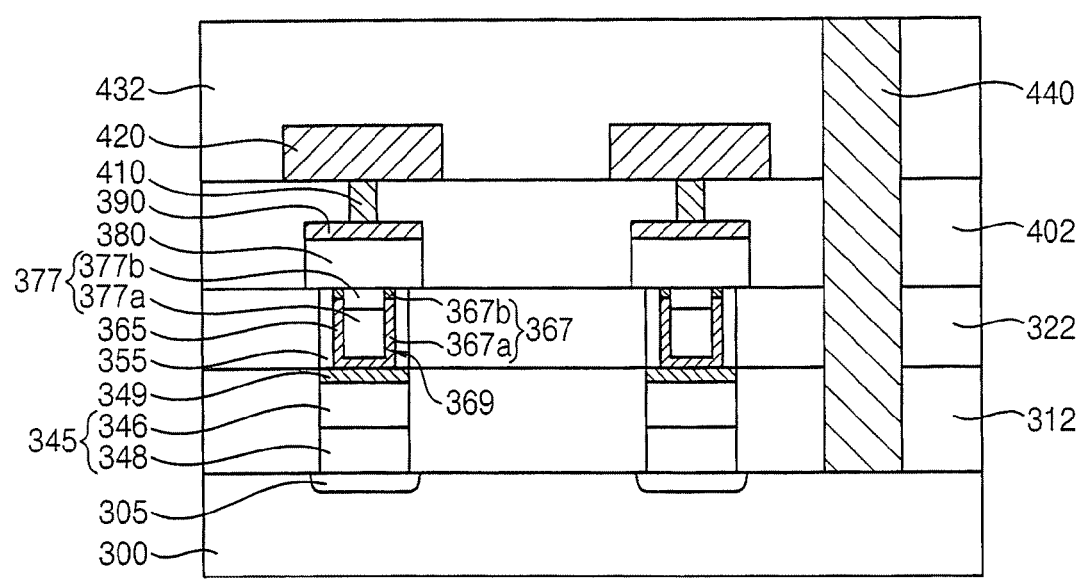
Figure 11U:
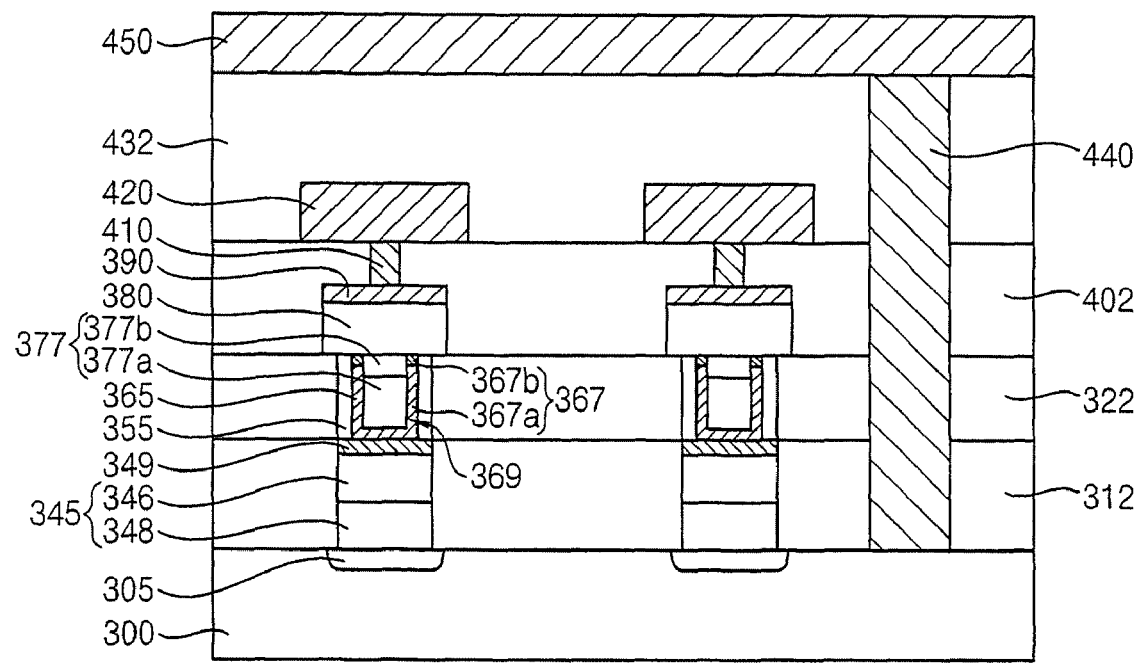

FIGS. 11A-U are cross-sectional views illustrating methods of fabricating diode type PRAM devices in accordance with some embodiments of the present invention.

The methods and resulting structures shown in FIGS. 11A-O are the same as those shown in FIGS. 5A-O, with the exception that in FIGS. 11A-O two devices shown in FIGS. 5A-O are fabricated. Accordingly, the structural elements of FIGS. 11A-O are referenced using a "3" hundredths value and the same tenths and ones values as those shown in FIGS. 5A-O. For example, the semiconductor substrate 300 in FIGS. 11A-O is configured the same as the semiconductor substrate 200 in FIGS. 5A-O. Accordingly, the description provided above for FIGS. 5A-O is incorporated herein as a description of the structure and methods of FIGS. 11A-O, and is not repeated for brevity.

Referring to FIG. 11P, a third insulation layer 402 is formed on and extends across the second insulation layer 322, the upper electrode 390, and the variable resistivity material layer 380. Openings 405 are defined in the third insulation layer 402 which expose at least a portion of the upper electrode 390.

Referring to FIG. 11Q-R, conductive contacts 410 extend through the third insulation layer 402 to contact the upper electrodes 390. Conductive lines 420, such as bit lines, are formed on the conductive contacts 410 and the third insulation layer 402.

Referring to FIGS. 11S-T, a fourth insulation layer 432 is formed on the resultant structure of FIG. 11R. An opening 435 is formed through the fourth insulation layer 432, the third insulation layer 402, the second insulation layer 322, and the first insulation layer 312 to expose an active region of the substrate 300. A conductive contact 440 is formed that extends through the opening 435 to contact the active region of the substrate 300.

Referring to FIG. 11U, a conductive line 450, such as a word line, is formed on the fourth insulation layer 432 and the conductive contact 440.

FIGS. 12A-I are cross-sectional views illustrating methods of fabricating diode type PRAM devices in accordance with some embodiments of the present invention.

FIGS. 12A-I contain similar structural elements to those shown in FIGS. 11A-G. As will be explained below, in contrast to FIGS. 11D-G where the diode 345 and the ohmic layer 349 are formed in the opening 317 through the first and second insulation layers 312 and 322, in FIGS. 12D-H, the diode 345 and the ohmic layer 349 are formed in an opening 313 in a first insulation layer 312 before the second insulation layer 320 is formed thereon.

Figure 12A:
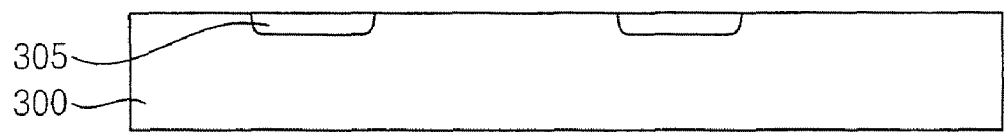
FIGS. 12A-I are cross-sectional views illustrating methods of fabricating diode type PRAM devices in accordance with some embodiments of the present invention.
Figure 12B:
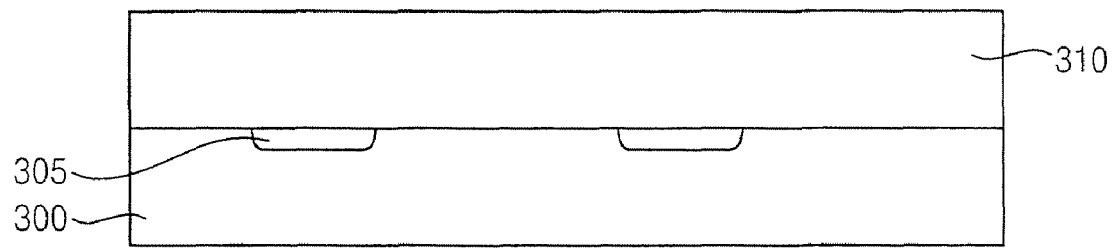
Figure 12C:
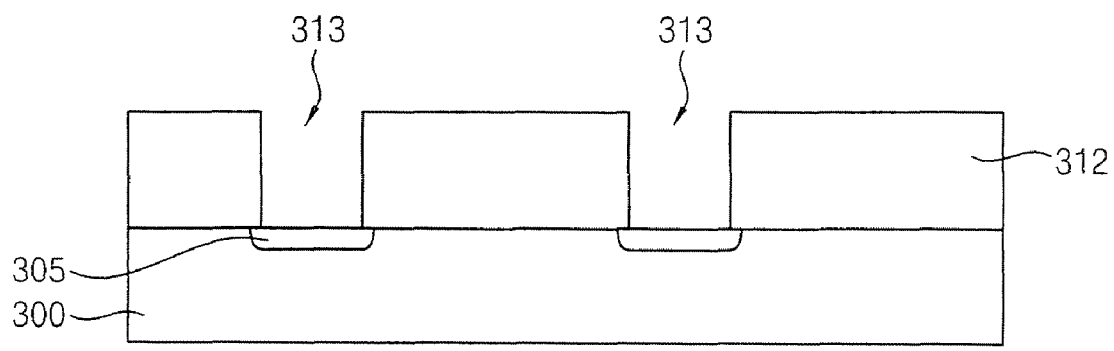

Referring to FIGS. 12A-C, impurity regions 205 are formed by implanting impurity ions into a semiconductor substrate 300. A first insulation layer 310 is formed on the substrate 300 and the impurity regions 305. The first insulation layer 310 is patterned to form a first insulation layer 312 having openings 313 that expose at least a portion of the impurity regions 305. For example, a mask may be formed on the first insulation layer 310 to define a location for the opening 313, and the first insulation layer 310 may be etched using the mask.

Figure 12D:
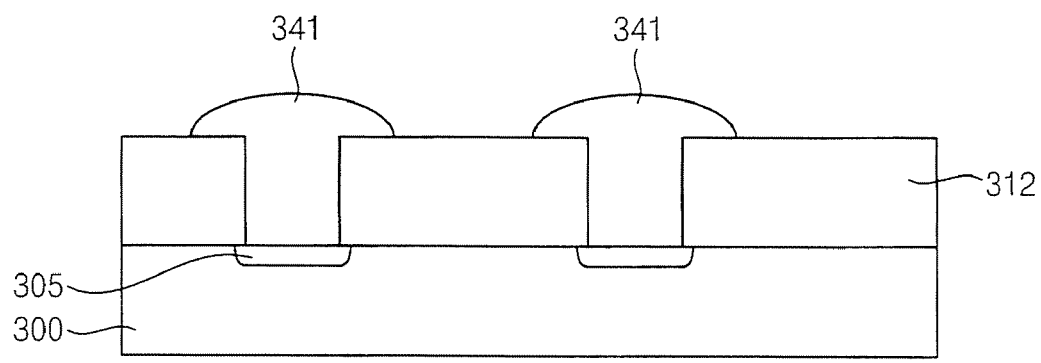

Referring to FIG. 12D, a silicon layer 341 is formed that at least partially fills the openings 313, such as by a selective epitaxial growth (SEG) process that uses the exposed impurity regions 305 as a seed layer and/or by depositing the silicon layer 341 in the opening 313.

Figure 12E:
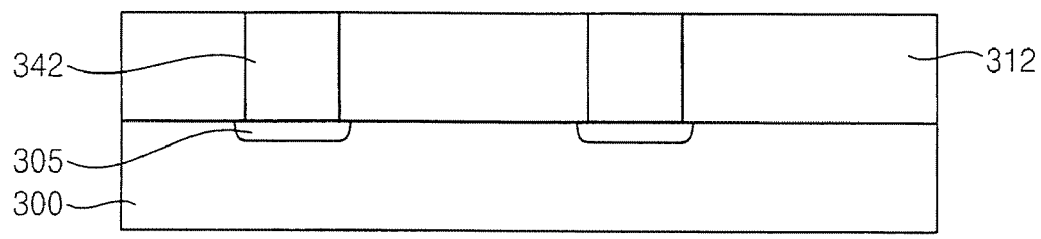

Referring to FIG. 12E, the silicon layer 341 is planarized to expose upper surfaces of the patterned first insulation layer 312 and form a silicon layer 342.

Figure 12F:
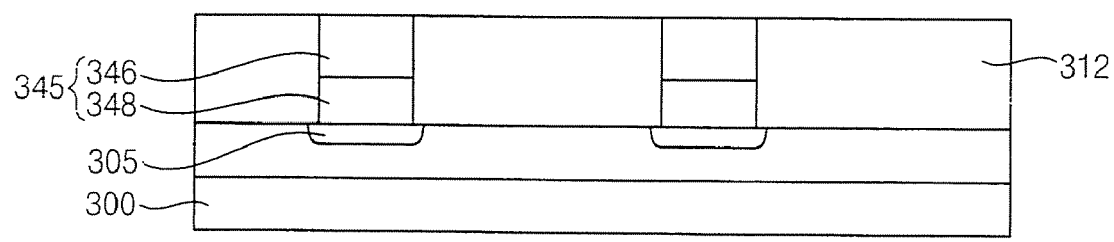
Figure 12G:
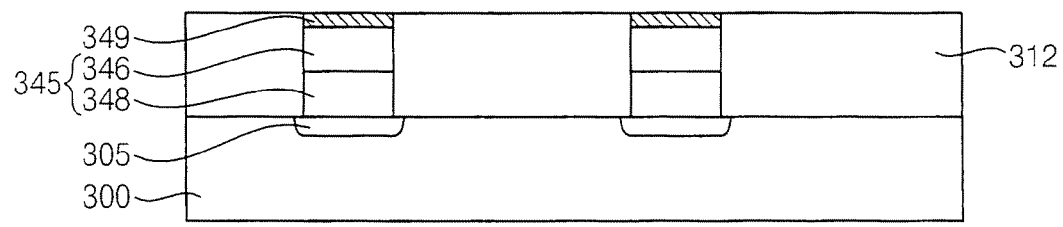

Referring to FIGS. 12F-G, a vertical cell diode 345 is formed in the silicon layer 342 by implanting or otherwise providing first conductivity type impurity ions (e.g., n-type ions) in a lower region 348 of the silicon layer 342, and implanting or otherwise providing second conductivity type impurity ions (e.g., p-type ions), which are opposite to the first conductivity type impurity ions, in an upper region 346 of the silicon layer 342.

An ohmic layer 349 is formed on the upper region 346. The upper region 346 may be recessed below the upper surfaces of the patterned first insulation layer 312 before the ohmic layer 349 is formed thereon. The ohmic layer 349 may be formed as a metal silicide, such as by depositing titanium (Ti), titanium nitride (TiN), cobalt (Co) on the exposed upper surface of the diode 245 at a temperature of, for example, 460° C.

Figure 12H:
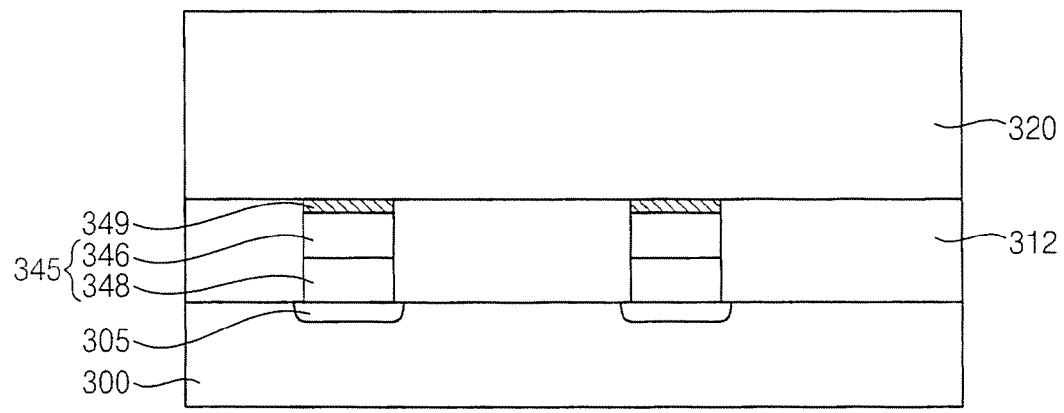
Figure 12I:
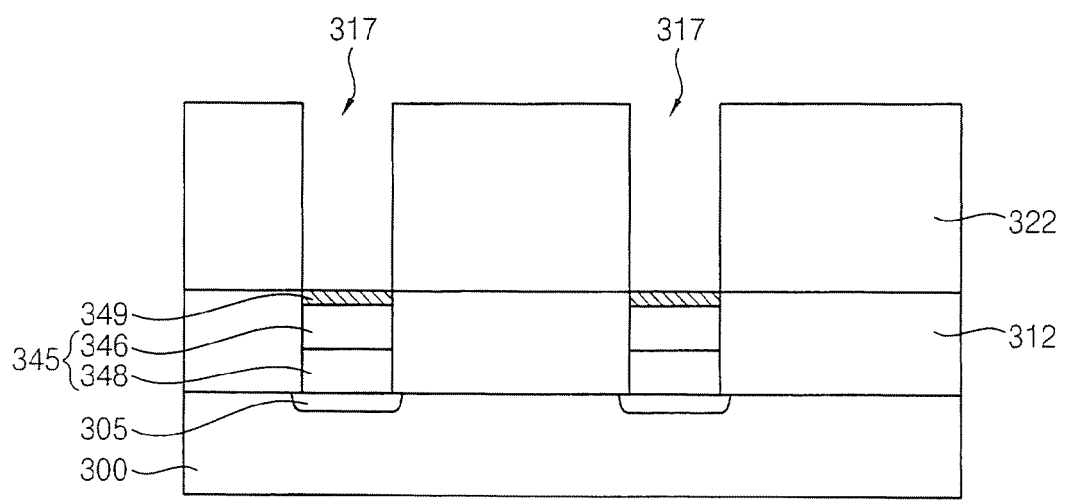

Referring to FIGS. 12H-I, a second insulation layer 320 is formed on the first insulation layer 312 and on the ohmic layer 349. The second insulation layer 320 is patterned to form a second insulation layer 322 having an opening 317 that exposes at least a portion of the ohmic layer 349.

The methods described above with regard to FIGS. 11H-U may then be carried out on the structure of FIG. 12I to fabricate diode type PRAM devices in accordance with some embodiments of the present invention.

Figure 13A:
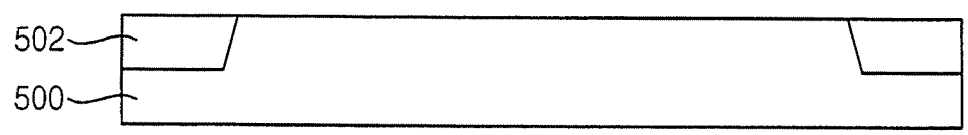
FIGS. 13A-T are cross-sectional views illustrating methods of fabricating transistor type PRAM devices in accordance with some embodiments of the present invention.
Figure 13B:
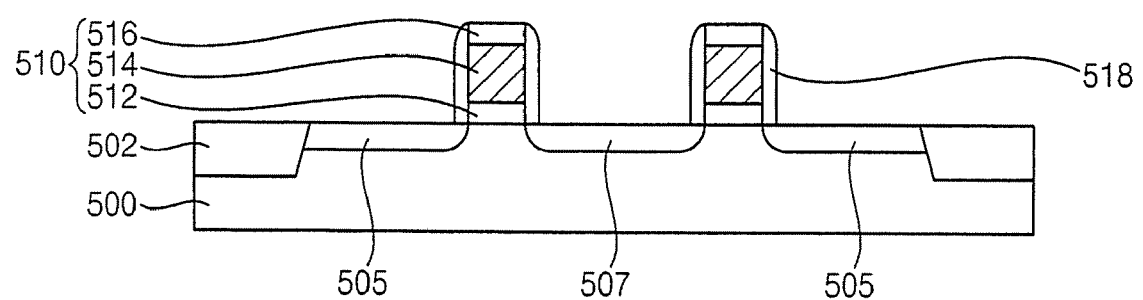
Figure 13C:
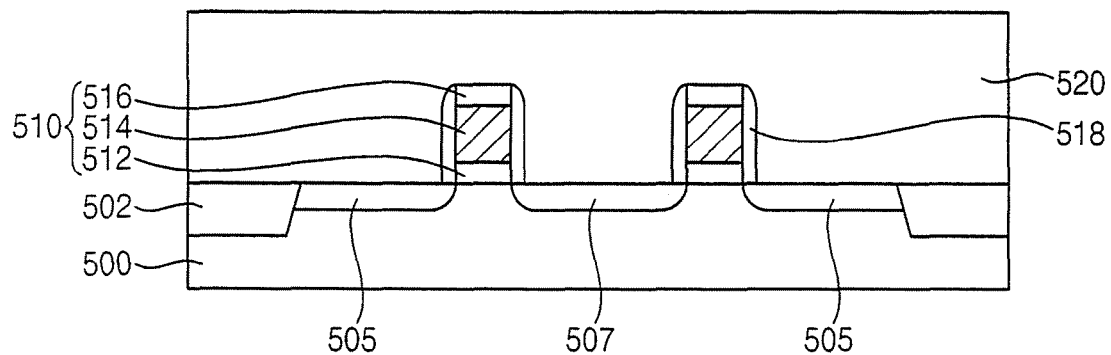
Figure 13D:
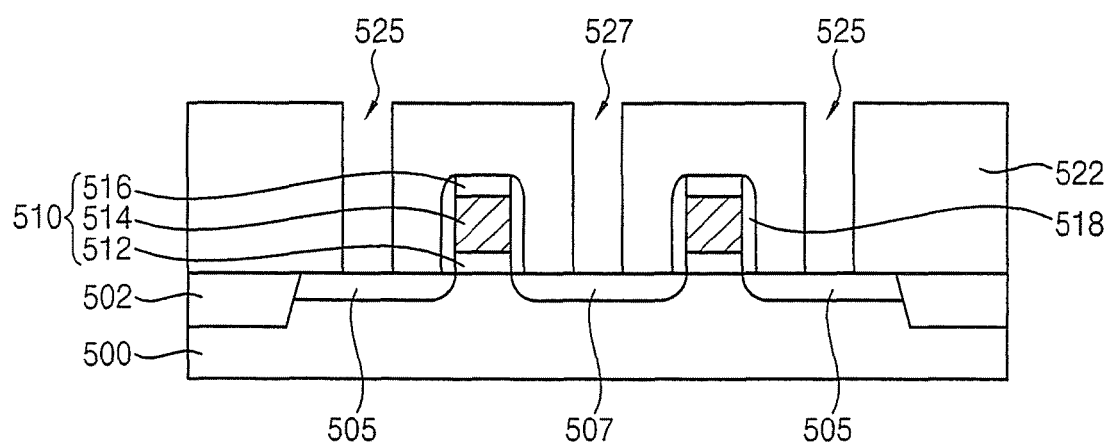
Figure 13E:
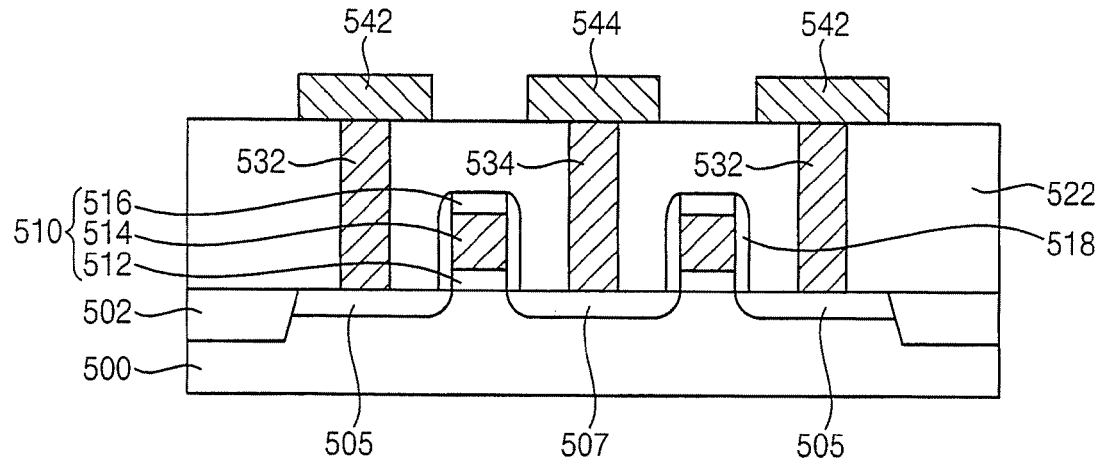
Figure 13F:
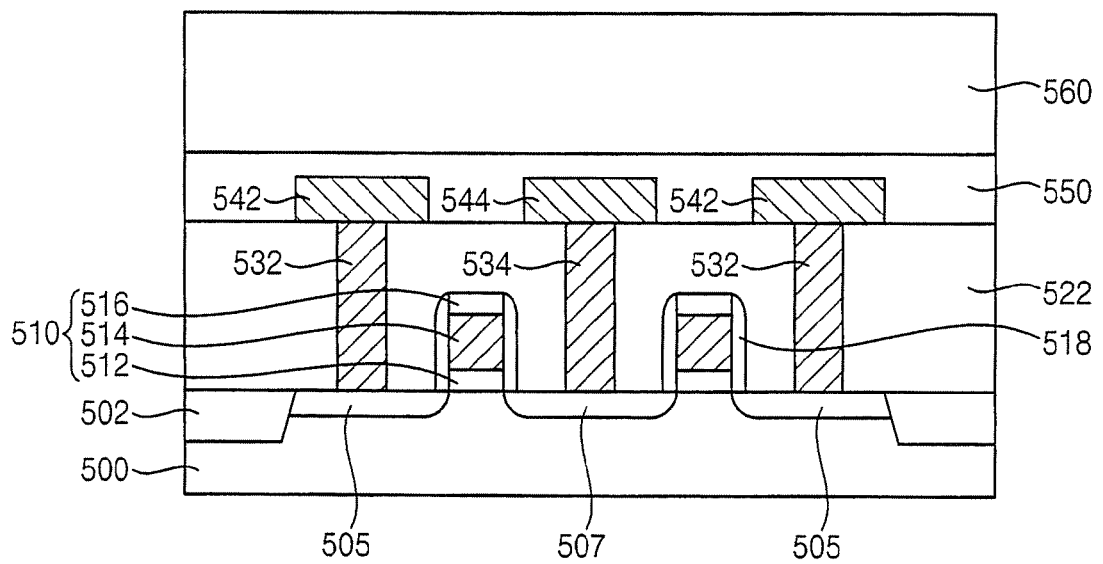
Figure 13G:
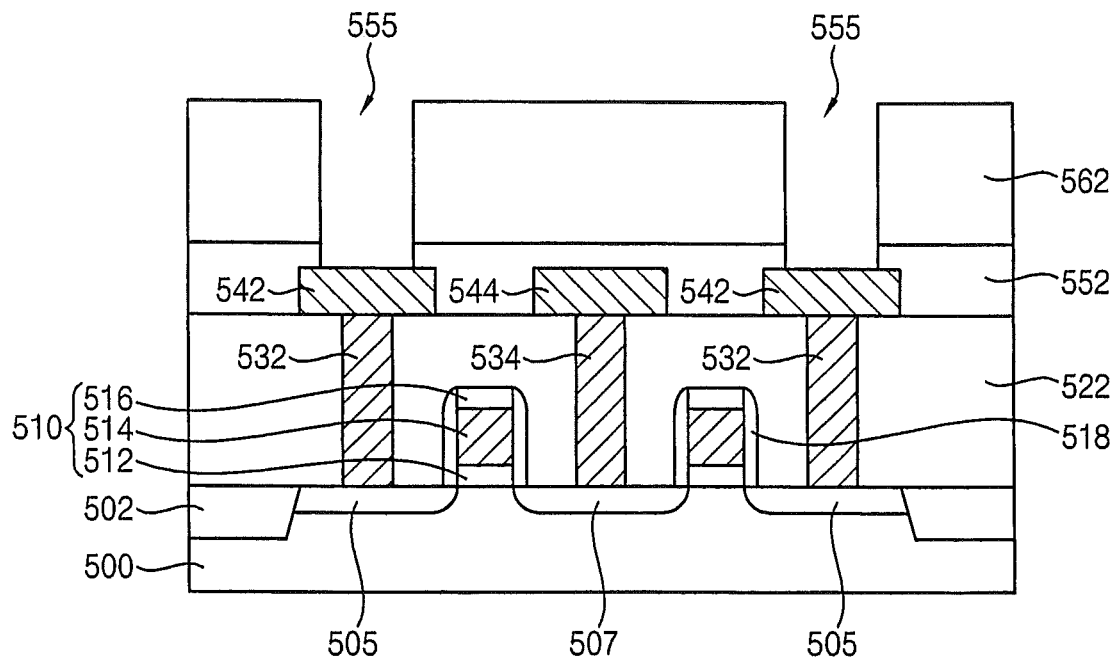
Figure 13H:
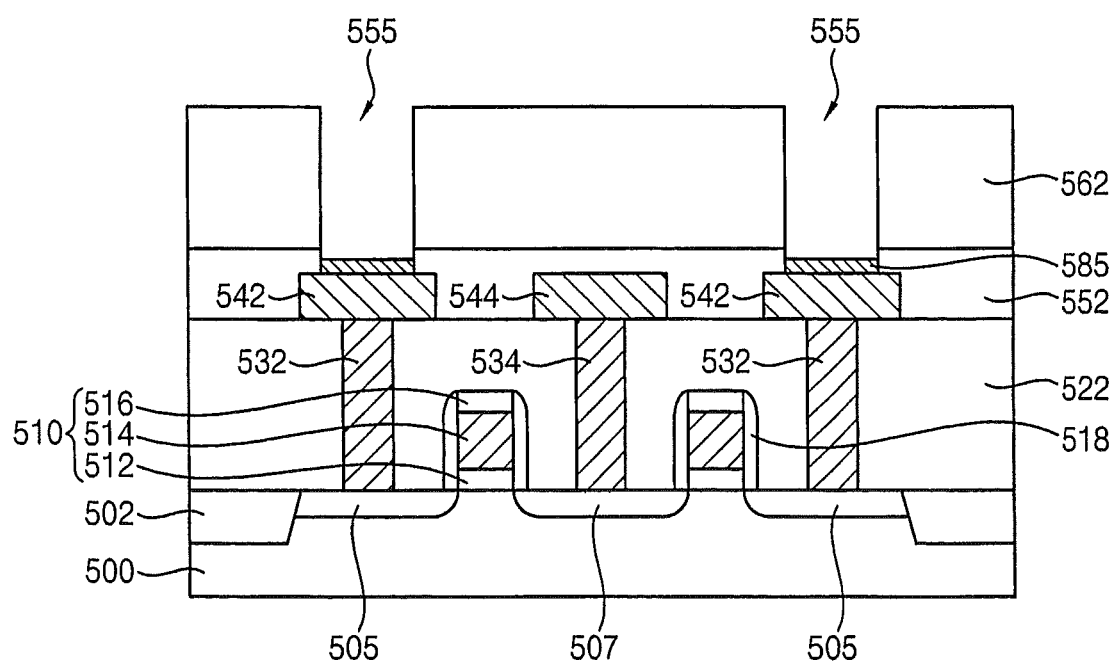
Figure 13I:
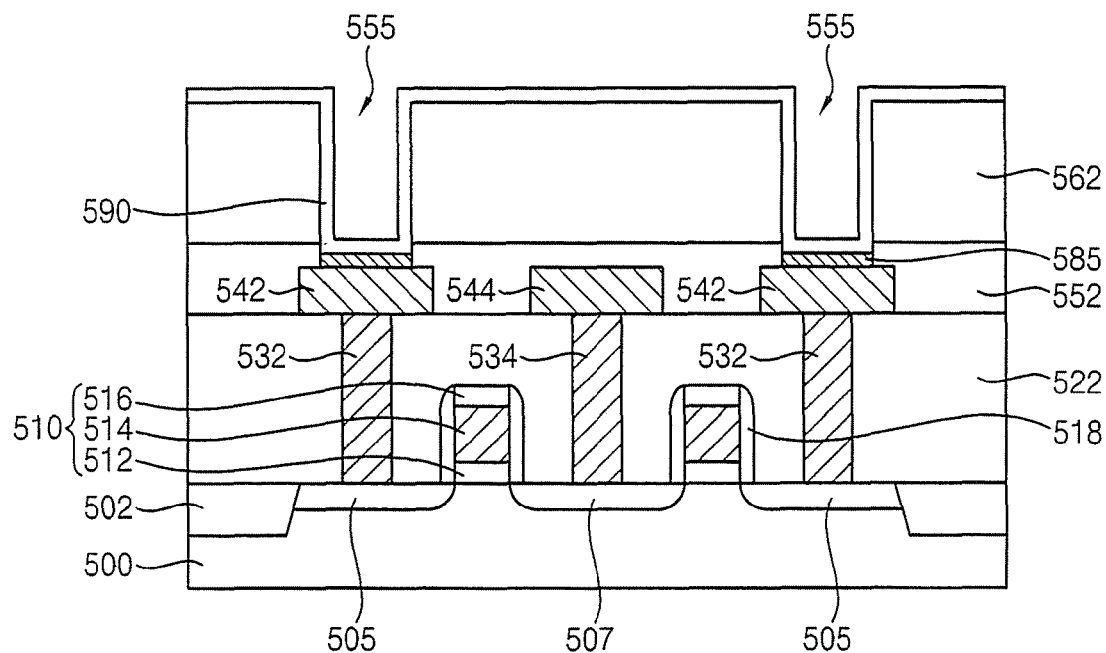
Figure 13J:
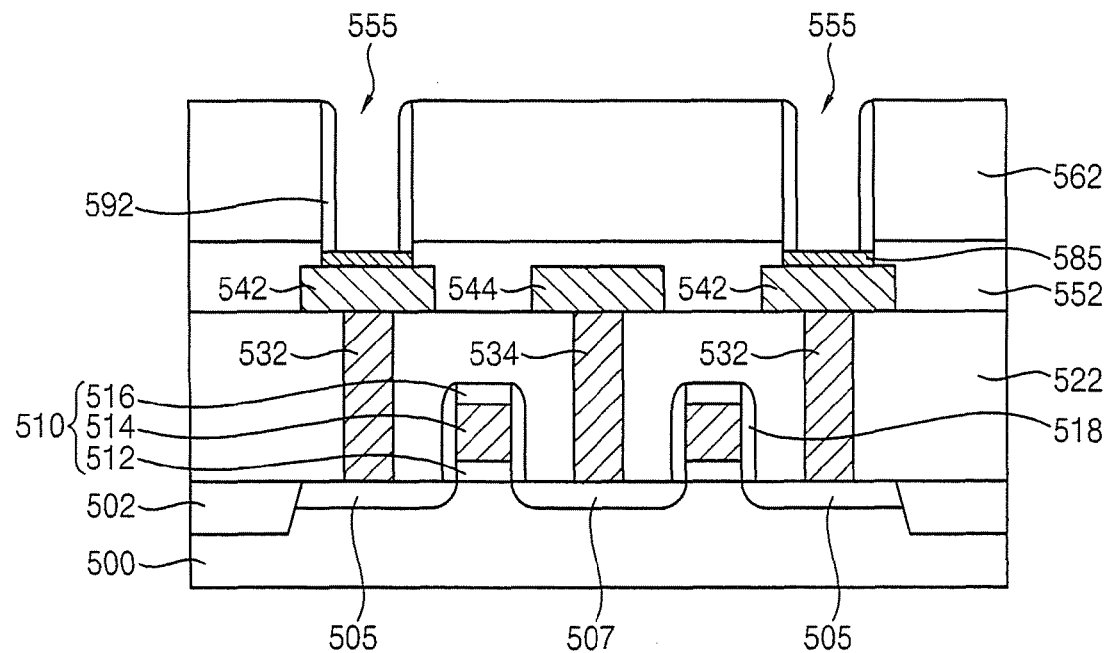
Figure 13K:
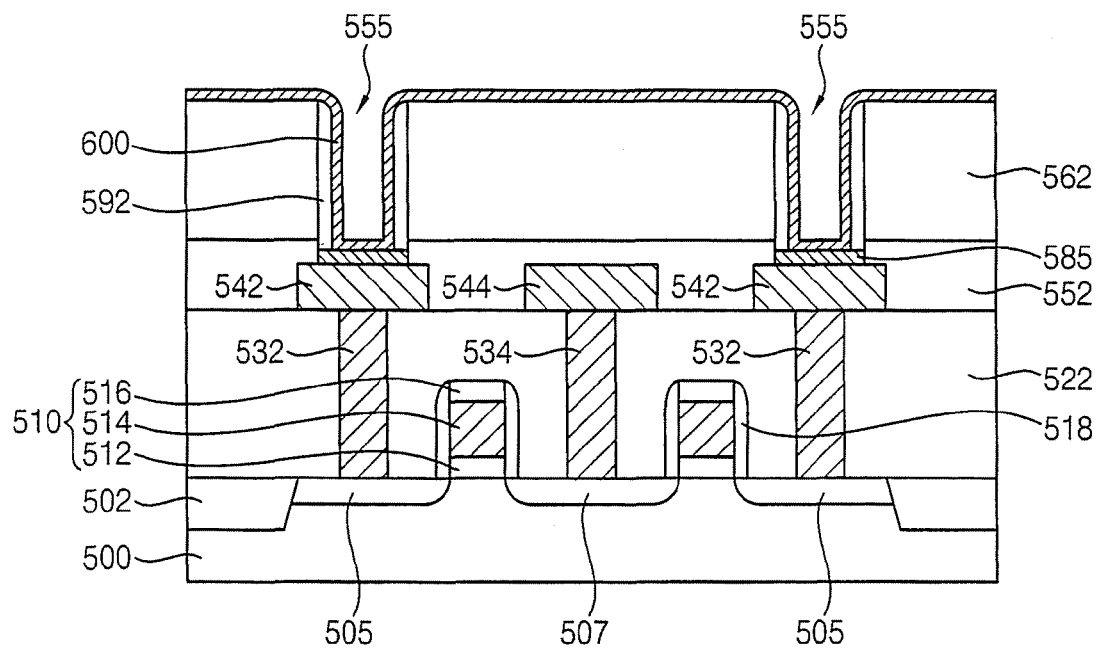
Figure 13L:
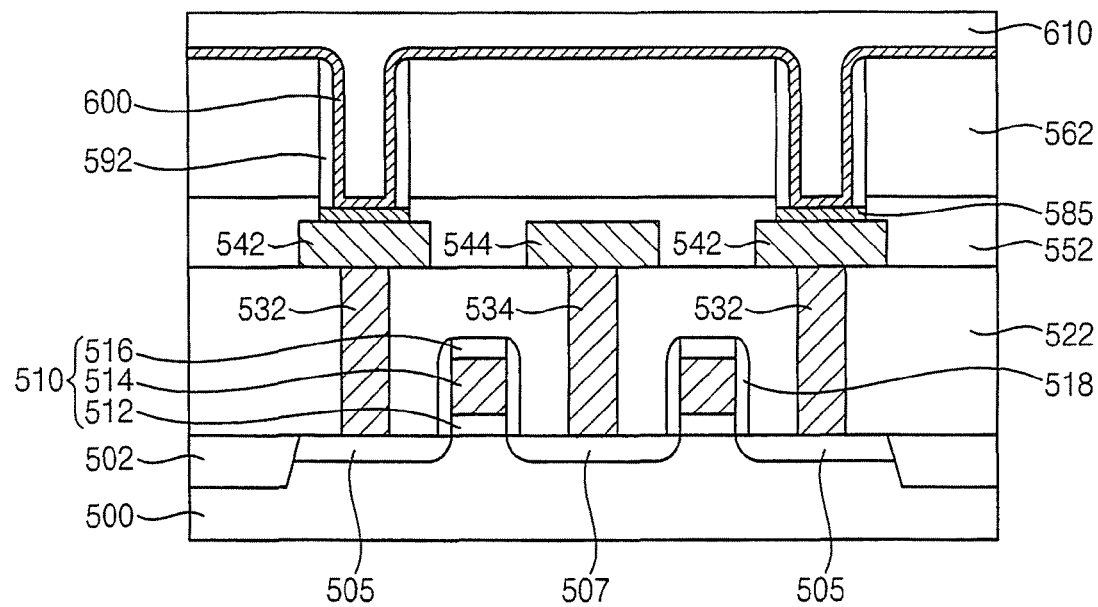
Figure 13M:
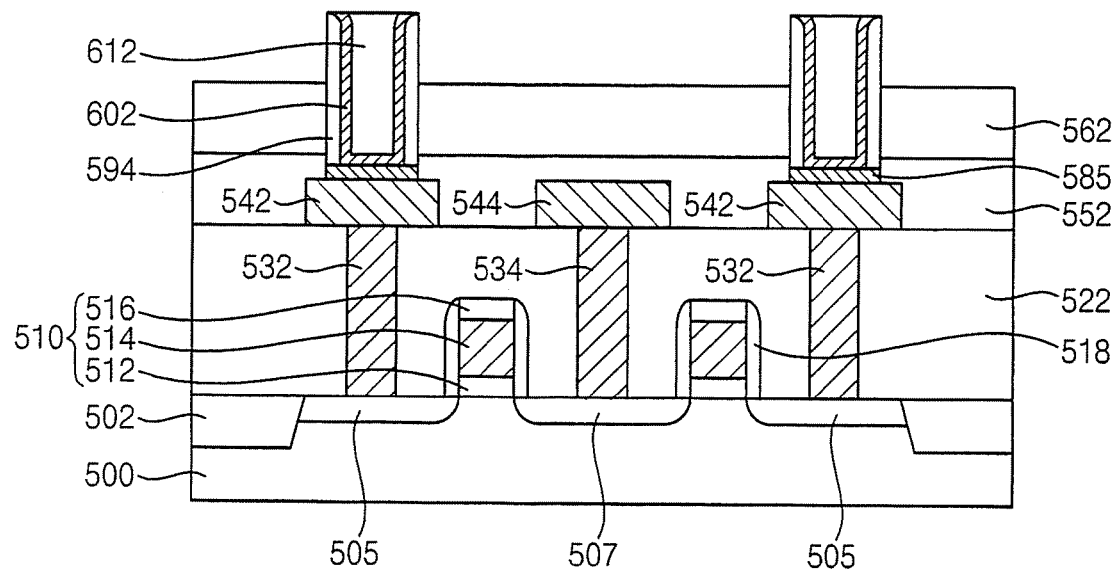
Figure 13N:
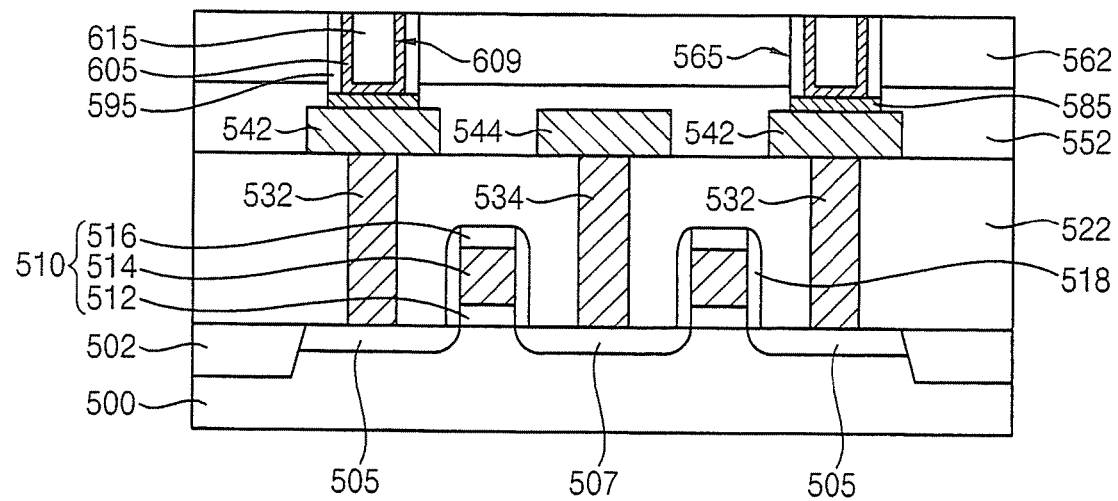
Figure 13O:
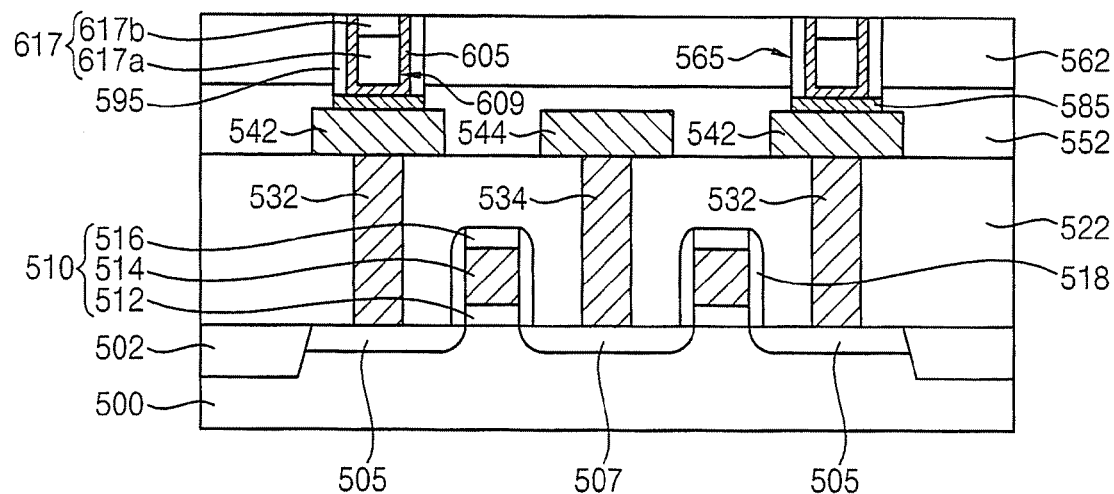
Figure 13P:
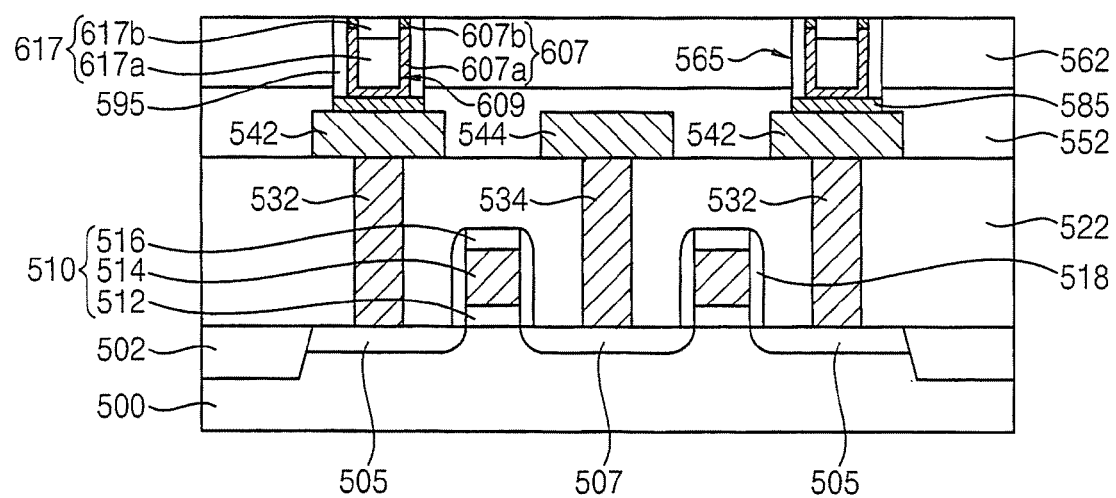
Figure 13Q:
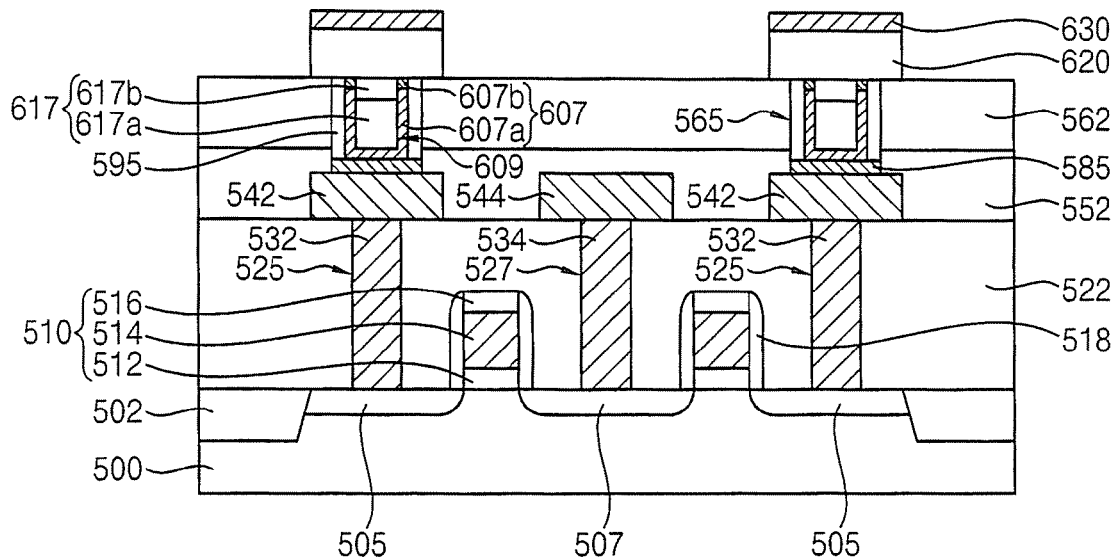
Figure 13R:
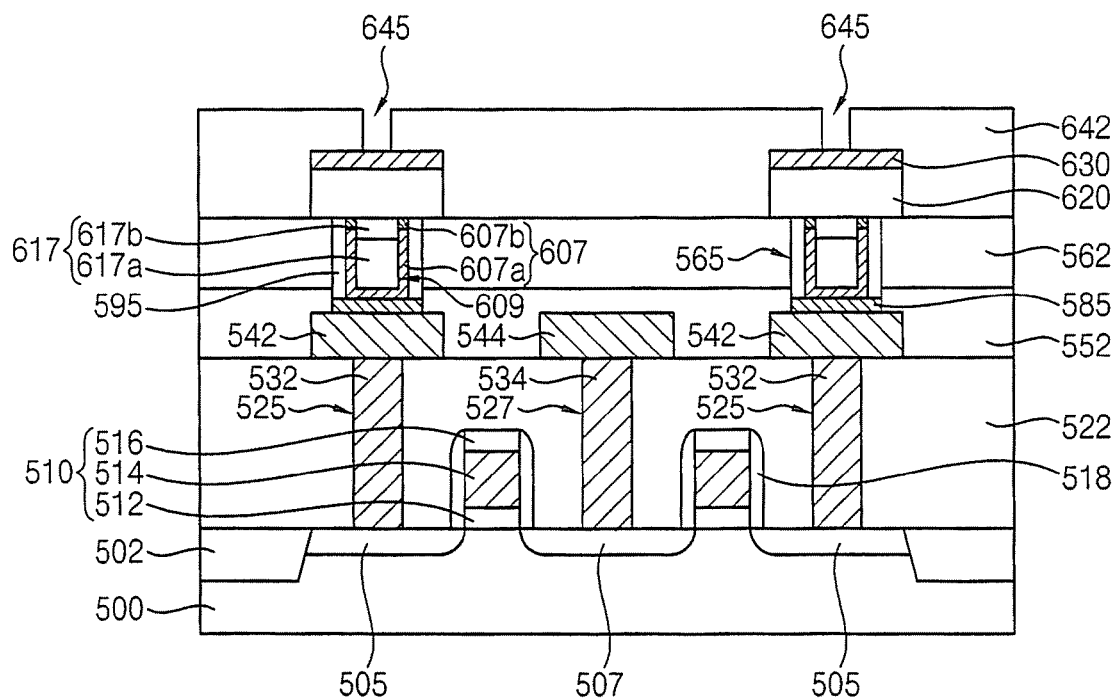
Figure 13S:
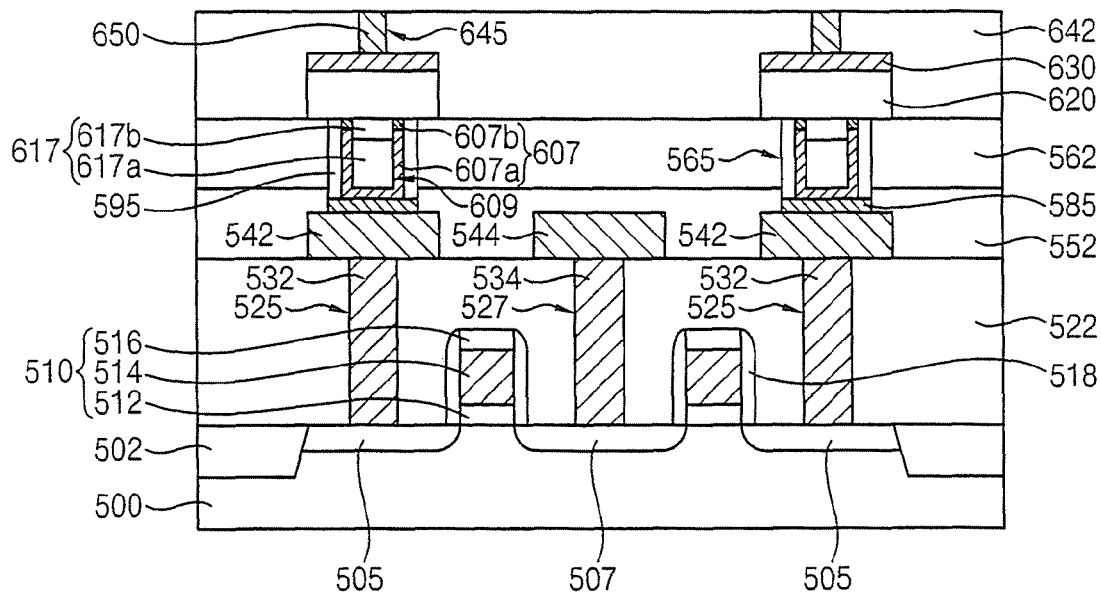
Figure 13T:
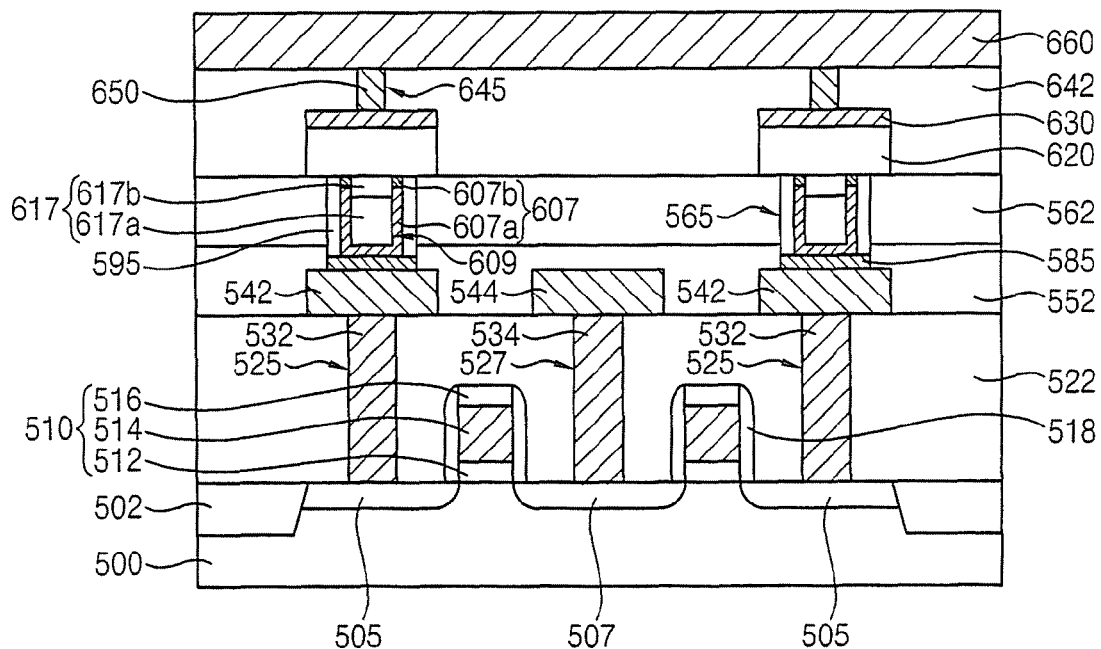

FIGS. 13A-T are cross-sectional views illustrating methods of fabricating transistor type PRAM devices, such as the device that is shown in FIGS. 9 and 10, in accordance with some embodiments of the present invention.

Referring to FIGS. 13A-B, isolation regions 502 are formed in a semiconductor substrate 500. Source and drain regions 505 and 507 are formed by implanting impurity ions in the substrate 500. Floating gates 510 are formed on channel regions, between the source and drain regions 505 and 507. The floating gates 510 are formed by depositing and patterning a tunnel insulation layer 512, a gate layer 514, and a capping layer 516. Sidewall spacers 518 are formed on sidewalls of the floating gates 510.

Referring to FIGS. 13C-D, a first insulation layer 520 is formed on the structure of FIG. 13B. Openings 525 and 527 are formed through the first insulation layer 522 to expose the source and drain regions 505 and 507 of the substrate 500.

Referring to FIG. 13E, conductive contacts 532 extend through the openings 525 to contact one type of the source and drain regions 505 and 507. Contact pads 542 are formed on the conductive contacts 532 and on the first insulation layer 522. A conductive contact 534 extends through the opening 527 to contact another type of the source and drain regions 505 and 507. A conductive line 544 is formed on the conductive contact 534 and on the first insulation layer 522.

Referring to FIG. 13F, a second insulation layer 550 is formed on the structure of FIG. 13E. A third insulation layer 560 is formed on the second insulation layer 550.

Referring to FIGS. 13G-H, openings 565 are formed that extend through the third insulation layer 562 and a portion of the second insulation layer 552 to expose at least a portion of the contact pads 542. Ohmic layers 585 are formed through the openings 555 on an upper surface of the contact pads 542.

Referring to FIGS. 13I-J, a spacer layer 590 is formed on the third insulation layer 562, on sidewalls of the opening 555, and on the exposed portion of the ohmic layers 585. The spacer layer 590 is planarized to expose upper surfaces of the third insulation layer 562 and is partially removed to expose at least a portion of the ohmic layers 585, thereby leaving spacers 592 extending from peripheral regions of the ohmic layers 585 along sidewalls of the opening 555.

Referring to FIGS. 13K-L, a lower electrode layer 600 is formed on upper surfaces of the third insulation layer 562 and through the opening 555 on the spacers 592 and on the exposed portion of the ohmic layers 585. A filling member layer 610, which may include doped or undoped silicon, is formed on the lower electrode layer 600 to at least partially fill, and may completely fill, the openings 555. The filling member layer 610 is formed within a range of temperatures that is sufficiently low to not substantially change resistance of the ohmic layer 585. The filling member layer 610 may be formed within a range of temperatures that is sufficiently low so that resistance of the ohmic layers 585 does not change more than 40% relative to before and after the filling member layer 610 is formed. In some embodiments, the filling member layer 610 is formed at temperatures less than a temperature at which the ohmic layer 585 becomes oxidized. In some further embodiments, the filling member layer 610 is formed at temperatures that are less than 630° C., and may be formed within a range of temperatures between about 460° C. and 560° C.

Referring to FIGS. 13M-N, the filling member layer 610, the lower electrode layer 600, and the third insulation layer 562 are partially removed, such as by etching, to cause an upper portion of the structure formed in the openings 555 (including spacers 594, lower electrode 602, and filling member 612) to project above an upper surface of the recessed third insulation layer 562. The structure projecting from the openings 555 is then planarized so that an upper surface of the spacers 595, the lower electrode 605, and the filling member 615 are substantially aligned with an upper surface of the third insulation layer 562.

Referring to FIG. 13O, in some embodiments, nitrogen is introduced into an upper portion 617b of the filling member 615 through, for example, a plasma nitridation process, to form a silicon nitride insulator in the upper portion 617b. During the plasma nitridation process, nitrogen may also be introduced into an upper portion of the lower electrode 605.

Accordingly, when the lower electrode 605 includes a metal, such as titanium (Ti), the plasma nitridation process may form a metal nitride, such as titanium nitride (TiN), in an upper portion of the lower electrode 605. At least some of the nitrogen introduced into the lower electrode 605 by the plasma nitridation process may be removed through, for example, an argon (Ar) sputtering process.

In some other embodiments, the upper portion 617b of the filling member 617 is oxidized to form a silicon oxide insulator in the upper portion 617b. During the oxidation process, an upper portion of the lower electrode 605 may also be oxidized. Accordingly, when the lower electrode 605 includes a metal, such as titanium (Ti), the oxidation process may form a metal oxide, such as titanium oxide (TiOx), in an upper portion of the lower electrode 605. At least some of the oxide may be removed from the lower electrode 605 through, for example, an argon (Ar) sputtering process.

Referring to FIG. 13P, further processes may be carried out on the lower electrode 605 to form a lower electrode 607 having an upper portion 607b with a greater resistivity than a lower portion 607a thereof. In some embodiments, nitrogen is introduced into the upper portion 607b of the lower electrode 607 to increase resistivity of the upper portion 607b relative to the lower portion 607a. Accordingly, when the lower electrode 607 includes a metal, the upper portion 607b may be formed as a metal nitride. The nitrification process may be the same as that carried out to introduce nitrogen into the upper portion 617b of the filling member 617, or may be an additional nitrification process.

In some other embodiments, an upper portion of the lower electrode 607 of FIG. 13P may be removed, such as by etching, while leaving the lower portion 607a of FIG. 13P. The upper portion 607b may then be formed by depositing a material on the lower portion 607a that has a greater resistivity than the material of the lower portion 607a.

Referring to FIG. 13Q, a variable resistivity material layer and an upper electrode layer are formed on the third insulation layer 562, and are patterned to form a variable resistivity material 620 and upper electrodes 630 that are stacked on an upper surface of the third insulation layer 562, the spacers 595, the upper portion 617b of the filling member 617, and the upper portion 607b of the lower electrode 607. The variable resistivity material layer may include a phase changeable material such as a chalcogenide material that includes, for example, germanium (Ge), antimony (Sb), and/or tellurium (Te).

Because the upper portion 607b has a greater resistivity than the lower portion 607a of the lower electrode 607, the resistance at the interface between the lower electrode 607 and the ohmic layer 585 can be much less than the resistance at the interface between the lower electrode 607 and the variable resistivity material layer 620, which may provide improved operational characteristics for the integrated circuit memory cell.

Referring to FIG. 13R, a fourth insulation layer 642 is formed on the structure of FIG. 13Q. Openings 645 are formed in the fourth insulation layer 642 to expose at least a portion of the upper electrodes 630.

Referring to FIGS. 13S-T, conductive contacts 650 are formed to extend through the openings 645 and contact the upper electrodes 630. A conductive line 660 is formed on the conductive contacts 650.

The foregoing is illustrative of the present invention and is not to be construed as limiting thereof. Although a few embodiments of this invention have been described, those skilled in the art will readily appreciate that many modifications are possible in the embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. The invention is defined by the following claims, with equivalents of the claims to be included therein.

What is claimed is:

1. A method of fabricating an integrated circuit memory cell, comprising:

forming a cup-shaped electrode on sidewalls of an opening in an insulation layer and through the opening onto an ohmic layer stacked on a conductive structure, wherein an upper portion of the electrode is formed from a different material having a greater resistivity than a lower portion of the electrode, the upper portion of the electrode having a ring shape;

forming an insulation filling member that at least partially fills an interior of the lower electrode; and forming a variable resistivity material on the insulation filling member and electrically connected to the ring shaped upper of the electrode, wherein the ring shaped upper portion is between the lower portion and the variable resistivity material, wherein forming an insulation filling member comprises:

forming a silicon layer that at least partially fills an interior of the electrode; and introducing nitrogen into an upper portion of the silicon layer in the interior of the electrode to form a silicon nitride layer that serves as the insulation filling member.

2. The method of claim 1, wherein the variable resistivity material comprises a chalcogenide material.

3. The method of claim 1, wherein forming a cup-shaped electrode comprises:

forming the electrode from a conductive material; and introducing nitrogen into the upper portion of the electrode to increase the resistivity of the upper portion of the electrode.

4. A method of fabricating an integrated circuit memory cell, comprising:

forming a cup-shaped electrode on sidewalls of an opening in an insulation layer and through the opening onto an ohmic layer stacked on a conductive structure, wherein an upper portion of the electrode is formed from a different material having a greater resistivity than a lower portion of the electrode, the upper portion of the electrode having a ring shape;

forming an insulation filling member that at least partially fills an interior of the lower electrode; and forming a variable resistivity material on the insulation filling member and electrically connected to the ring shaped upper portion of the electrode, wherein the ring shaped upper portion is between the lower portion and the variable resistivity material, wherein forming an insulation filling member comprises:

forming a silicon layer that at least partially fills an interior of the electrode; and oxidizing an upper portion of the silicon layer in the interior of the electrode to form a silicon oxide layer that serves as the insulation filling member.

5. The method of claim 4, wherein forming a cup-shaped electrode comprises:

forming a first conductive layer on sidewalls of the opening and on the ohmic layer;

removing an upper portion of the first conductive layer from the sidewalls of the opening; and forming a second conductive layer, which has a greater resistivity than the first conductive layer, on the sidewalls of the opening exposed when the upper portion of the first conductive layer is removed.

6. A method of fabricating an integrated circuit memory cell, comprising:

forming a cup-shaped electrode on sidewalls of an opening in an insulation layer and through the opening onto an ohmic layer stacked on a conductive structure, wherein an upper portion of the electrode is formed from a different material having a greater resistivity than a lower portion of the electrode, the upper portion of the electrode having a ring shape;

forming an insulation filling member that at least partially fills an interior of the lower electrode; and forming a variable resistivity material on the insulation filling member and electrically connected to the ring shaped upper portion of the electrode, wherein the ring shaped upper portion is between the lower portion and the variable resistivity material, wherein before forming the insulation filling member, further comprises forming a conductive filling member that partially fills an interior of the electrode, wherein the insulation filling member is formed on the conductive filling member to further fill the interior of the electrode.

7. The method of claim 6, wherein:

the conductive filling member is formed as a doped silicon layer on an interior of the electrode; and the insulation filling member is formed on the doped silicon layer to further fill the interior of the electrode.

8. The method of claim 6, further comprising forming an insulating spacer on sidewalls of the opening and on a peripheral portion of the ohmic layer while leaving exposed a central portion of the ohmic layer, wherein the electrode is formed on the spacer and on the central portion of the ohmic layer.

9. The method of claim 6, wherein forming a cup-shaped electrode comprises:

depositing the lower portion of the electrode from a first conductive material; and depositing the upper portion of the electrode from a second conductive material having a greater resistivity than the first conductive material.

10. The method of claim 9, wherein:

the lower portion of the electrode is formed from a metal; and the upper portion of the electrode is formed from a metal nitride.

* * * * *